US006768246B2

(12) United States Patent
Pelrine et al.

(10) Patent No.: US 6,768,246 B2
(45) Date of Patent: Jul. 27, 2004

(54) BIOLOGICALLY POWERED ELECTROACTIVE POLYMER GENERATORS

(75) Inventors: Ronald E. Pelrine, Boulder, CO (US); Roy D. Kornbluh, Palo Alto, CA (US); Joseph Stephen Eckerle, Redwood City, CA (US); Scott E. Stanford, Palo Alto, CA (US); Seajin Oh, Palo Alto, CA (US); Pablo E. Garcia, Redwood City, CA (US)

(73) Assignee: SRI International, Menlo Park, CA (US)

( * ) Notice: Subject to any disclaimer, the term of this patent is extended or adjusted under 35 U.S.C. 154(b) by 141 days.

(21) Appl. No.: 09/792,877

(22) Filed: Feb. 23, 2001

(65) Prior Publication Data

US 2001/0035723 A1 Nov. 1, 2001

Related U.S. Application Data

(60) Provisional application No. 60/184,217, filed on Feb. 23, 2000, provisional application No. 60/190,713, filed on Mar. 17, 2000, and provisional application No. 60/196,420, filed on Apr. 12, 2000.

(51) Int. Cl.[7] .............................................. H01L 41/08
(52) U.S. Cl. ...................... 310/339; 310/317; 310/319; 310/330; 310/800
(58) Field of Search ....................... 310/311, 330–332, 310/338, 339, 316.01, 317, 319, 321, 324, 328, 800

(56) References Cited

U.S. PATENT DOCUMENTS

| | | | |
|---|---|---|---|
| 3,403,234 A | | 9/1968 | Barnes, Jr. |
| 3,509,714 A | * | 5/1970 | Walton ........................ 310/328 |
| 3,832,580 A | | 8/1974 | Yamamuro et al. |
| 4,089,927 A | * | 5/1978 | Taylor ........................ 310/331 |

(List continued on next page.)

FOREIGN PATENT DOCUMENTS

| | | | |
|---|---|---|---|
| DE | 199 52 062 A1 | 10/1999 | ............ H02N/2/18 |
| EP | 59-126689 | 7/1984 | ............ H01L/41/08 |
| EP | 0522882 | 7/1992 | |
| EP | 7-111785 | 4/1995 | ............ H02N/2/00 |
| FR | 2745476 | 3/1996 | |
| RU | WO 99/23749 | 5/1999 | ............ H02N/2/18 |
| WO | WO 94/18433 | 8/1994 | ............ F01B/29/15 |
| WO | WO 95/08905 | 3/1995 | |
| WO | WO 96/26364 | 8/1996 | |
| WO | WO 97/15876 | 5/1997 | ............ G05F/5/00 |
| WO | WO98/19208 | 5/1998 | |
| WO | WO 98/35529 | 8/1998 | |
| WO | WO 01/06575 | 1/2001 | |

OTHER PUBLICATIONS

Roy Kornbluh, "Elastomeric Polymer Actuator and Transducers: The Principles, Performance and Applications of a New High–Strain Smart Material Technology", SRI International Medtronic Forum, Brooklyn Center, Minnesota, Jan. 2000.

Kymissis et al., "Parasitic Power Harvesting in Shoes," XP–010312825 —Abstract, Physics and Media Group, MIT, 8 Pages, 1998.

(List continued on next page.)

Primary Examiner—Mark Budd
(74) Attorney, Agent, or Firm—Beyer, Weaver & Thomas

(57) ABSTRACT

Disclosed generators includes one or more transducers that use electroactive polymer films to convert mechanical energy to electrical energy. The generators may include one or more transmission mechanisms that transfer a portion of an unused biological energy source, an unused environmental energy source or combinations of both to the one or more transducers located in the generators. The energy received by the transducers may be converted to electrical energy by the transducers in conjunction with conditioning electronics located within the generator. A heel-strike generator is disclosed that is integrated into the heel of footwear and is used to convert mechanical energy generated during human bipedal motion to electrical energy.

120 Claims, 17 Drawing Sheets

U.S. PATENT DOCUMENTS

| | | | | |
|---|---|---|---|---|
| 4,363,991 A | * | 12/1982 | Edelman | 310/316.01 |
| 4,384,394 A | | 5/1983 | Lemonon et al. | |
| 4,387,318 A | * | 6/1983 | Kolm et al. | 310/330 |
| 4,400,634 A | | 8/1983 | Micheron | |
| 4,401,911 A | | 8/1983 | Ravinet et al. | |
| 4,404,490 A | * | 9/1983 | Taylor et al. | 310/339 |
| 4,442,372 A | | 4/1984 | Roberts | 310/339 |
| 4,518,555 A | | 5/1985 | Ravinet et al. | |
| 4,733,121 A | | 3/1988 | Hebert | 310/311 |
| 4,803,671 A | * | 2/1989 | Rochling et al. | 367/166 |
| 4,814,661 A | * | 3/1989 | Ratzlaff et al. | 310/328 |
| 4,824,107 A | * | 4/1989 | French | 273/166 |
| 4,833,659 A | * | 5/1989 | Geil et al. | 310/332 X |
| 4,843,275 A | | 6/1989 | Radice | |
| 4,877,988 A | | 10/1989 | McGinniss et al. | 310/306 |
| 4,885,783 A | | 12/1989 | Whitehead et al. | |
| 4,969,197 A | | 11/1990 | Takaya | |
| 5,024,872 A | | 6/1991 | Wilson et al. | |
| 5,065,067 A | * | 11/1991 | Todd et al. | 310/339 |
| 5,188,447 A | * | 2/1993 | Chiang et al. | 362/103 |
| 5,229,979 A | * | 7/1993 | Scheinbeim et al. | 310/800 X |
| 5,250,784 A | | 10/1993 | Muller et al. | |
| 5,254,296 A | | 10/1993 | Perlman | |
| 5,356,500 A | | 10/1994 | Scheinbeim et al. | |
| 5,430,565 A | | 7/1995 | Yamanouchi et al. | |
| 5,440,194 A | | 8/1995 | Beurrier | |
| 5,493,372 A | * | 2/1996 | Mashtare et al. | 310/800 X |
| 5,500,635 A | * | 3/1996 | Mott | 340/323 R |
| 5,548,177 A | * | 8/1996 | Carroll | 310/339 |
| 5,578,889 A | * | 11/1996 | Epstein | 310/339 |
| 5,642,015 A | | 6/1997 | Whitehead et al. | |
| 5,703,295 A | * | 12/1997 | Ishida et al. | 73/593 |
| 5,801,475 A | * | 9/1998 | Kimura | 310/319 |
| 5,814,921 A | * | 9/1998 | Carroll | 310/339 |
| 5,835,453 A | | 11/1998 | Wynne et al. | |
| 5,902,836 A | | 5/1999 | Bennett et al. | |
| 5,915,377 A | | 6/1999 | Coffee | |
| 5,918,502 A | | 7/1999 | Bishop | |
| 5,977,685 A | | 11/1999 | Kurita et al. | |
| 6,048,622 A | | 4/2000 | Hagood et al. | |
| 6,060,811 A | | 5/2000 | Fox et al. | |
| 6,084,321 A | | 7/2000 | Hunter et al. | |
| 6,184,608 B1 | | 2/2001 | Cabuz et al. | |
| 6,184,609 B1 | | 2/2001 | Johansson et al. | |
| 6,194,815 B1 | * | 2/2001 | Carroll | 310/339 |
| 6,249,076 B1 | | 6/2001 | Madden et al. | |
| 6,252,336 B1 | * | 6/2001 | Hall | 310/339 |
| 6,400,065 B1 | * | 6/2002 | Toda et al. | 310/800 X |

OTHER PUBLICATIONS

Tanaka Mashahiro, "Organism Energy Storing Device," Patent Abstract of Japn, Publication No. 09275688, 1997.

Ajluni, Cheryl, "Pressure Sensors Strive to Stay on Top, New Silicon Micromachining Techniques and Designs Promise Higher Performance", *Electronic Design—Advanced Technology Series,*, Oct. 3, 1994, pp. 67–74.

Anderson, R. A., "Mechanical Stress in a Dielectric Solid From a uniform Electric Field", *The American Physical Society*, 1986, pp. 1302–1307.

Aramaki, S., S. Kaneko, K. Arai, Y. Takahashi, H. Adachi, and K. Yanagisawa. 1995. "Tube Type Micro Manipulator Using Shape Memory Alloy (SMA)," *Proceedings of the IEEE Sixth International Symposium on Micro Machine and Human Science*, Nagoya, Japan, pp. 115–120.

Ashley, S., "Smart Skis and Other Adaptive Structures", *Mechanical Engineering*, Nov. 1995, pp. 77–81.

Bar–Cohen, Yoseph, JPL, *WorldWide ElectroActive Polymers, EAP (Artificial Muscles) Newsletter*, vol. 1, No. 1, Jun. 1999.

Bar–Cohen, Yoseph, JPL, *WorldWide ElectroActive Polymers, EAP (Artificial Muscles) Newsletter*, vol. 1, No. 2, Dec. 1999.

Bar–Cohen, Yoseph, JPL, *WorldWide ElectroActive Polymers, EAP (Artificial Muscles) Newsletter*, vol. 2, No. 1, Jul. 2000.

Bar–Cohen, Yoseph, JPL, *WorldWide ElectroActive Polymers, EAP (Artificial Muscles) Newsletter*, vol. 2, No. 2, Dec. 2000.

Bar–Cohen, Yoseph, JPL, *WorldWide ElectroActive Polymers, EAP (Artificial Muscles) Newsletter*, vol. 3, No. 1, Jun. 2001.

Bar–Cohen, Yoseph, JPL, *WorldWide Electroactive Polymer Actuators Webhub* webpages 1–7, http://ndeaa.jpl.nasa.gov/nasa–nde/lommas/eap/EAP–web.htm, downloaded Jul. 23, 2001.

Baughman, R., L. Shacklette, R. Elsenbaumer, E. Plichta, and C. Becht "Conducting Polymer Electromechanical Actuators," *Conjugated Polymeric Materials: Opportunities in Electronics, Optoelectronics and Molecular Electronics*, eds. J.L. Bredas and R.R. Chance, Kluwer Academic Publishers, The Netherlands, pp. 559–582, 1990.

Baughman, R.H., L.W. Shacklette, and R.L. Elsenbaumer, E.J. Plichta, and C. Becht, "Micro electromechanical actuators based on conducting polymers", in *Molecular Electronics, Materials and Methods*, P.I. Lazarev (ed.), Kluwer Academic Publishers, pp. 267–289 (1991).

Bharti, V., Y. Ye, T.–B. Xu and Q. M. Zhang, "Correlation Between Large Electrostrictive Strain and Relaxor Behavior with Structural Changes Induced in P(VDF–TrFE) Copolymer by electron Irradiation," Mat. Res. Soc. Symp. Proc. vol. 541, pp. 653–659 (1999).

Bharti, V., Z.–Y. Cheng, S. Gross, T.–B. Xu, and Q. M. Zhang, "High electrostrictive strain under high mechanical stress in electron–irradiated poly(vinylidene fluoride–trifluoroethylene) copolymer," *Appl. Phys. Lett.* vol. 75, 2653–2655 (Oct. 25, 1999).

Bharti, V., H. S. Xu, G. Shanthi, and Q. M. Zhang, "Polarization and Structural Properties of High Energy Electron Irradiated Poly(vinylidene fluoride–trifluoroethylene) Copolymer Films," to be published in J. Appl. Phys. (2000).

Bharti, V., X.–Z. Zhao, Q. M. Zhang, T. Romotowski, F. Tito, and R. Ting, "Ultrahigh Field Induced Strain And Polarization Response In Electron Irradiated Poly(Vinylidene Fluoride–Trifluoroethylene) Copolymer," *Mat. Res. Innovat.* vol. 2, 57–63 (1998).

Bobbio, S., M Kellam, B. Dudley, S. Goodwin Johansson, S. Jones, J. Jacobson, F. Tranjan, and T. DuBois, "Integrated Force Arrays," in Proc. IEEE Micro ElectroMechanical Systems Workshop, Fort Lauderdale, Florida Feb. 1993.

Bohon, K., and S. Krause, "An Electrorheological Fluid and Siloxane Gel Based Electromechanical Actuator: Working Towards an Artifical Muscle," to be published in *J. Polymer Sci., Part B Polymer Phys.* (2000).

Brock, D. L. "Review of Artificial Muscle based on Contractile Polymers," MIT Artificial Intelligence Laboratory, A.I. Memo No. 1330, Nov. 1991.

Caldwell, D., G. Medrano–Cerda, and M. Goodwin, "Characteristics and Adaptive Control of Pneumatic Muscle Actuators for a Robotic Elbow," Proc. IEEE Int. Conference on Robotics and Automation, San Diego, California (May 8–13, 1994).

Calvert, P. and Z. Liu, "Electrically stimulated bilayer hydrogels as muscles," Proceedings of the SPIE International Symposium on Smart Structures and Materials: Electro–Active Polymer Actuators and Devices, Mar. 1–2, 1999, Newport Beach, California, USA, pp. 236–241.

Cheng, Z.-Y., H. S. Xu, J. Su, Q. M. Zhjang, P.-C. Wang, and A. G. MacDiarmid, "High performance of all–polymer electrostrictive systems," Proceedings of the SPIE International Symposium on Smart Structures and Materials: Electro–Active Polymer Actuators and Devices, Mar. 1–2, 1999, Newport Beach, California, USA., pp. 140–148.

Cheng, Z.-Y., T.–B. Xu, V. Bharti, S. Wang, and Q. M. Zhang, "Transverse Strain Responses In The Electrostrictive Poly(Vinylidene Fluoride–Trifluorethylene) Copolymer," *Appl. Phys. Lett.* vol. 74, No. 13, pp. 1901–1903, Mar. 29, 1999.

Chiarelli, P., A. Della Santa, D. DeRossi, and A. Mazzoldi. 1995. "Actuation Properties of Electrochemically Driven Polypyrrole Free–standing Films," *Journal of Intelligent Material Systems and Structures*, vol. 6, pp. 32–37, Jan. 1995.

De Rossi, D., and P. Chiarelli. 1994. "Biomimetic Macromolecular Actuators," *Macro–Ion Characterization, American Chemical Society Symposium Series*, vol. 548, Ch. 40, pp. 517–530.

Dowling, K., *Beyond Faraday—Non Traditional Actuation*, available on the World Wide Web at http://www.frc.ri.cmu.edu/~nivek/OTH/beyond–faraday/beyondfaraday.html, 9 pages, 1994.

Egawa, S. and T. Higuchi, "Multi–Layered Electrostatic Film Actuator," Proc. IEEE Micro Electra Mechanical Systems, Napa Valley, California, pp. 166–171 (Feb. 11–14, 1990).

Elhami, K., and B. Gauthier–Manuel, "Electrostriction Of The Copolymer Of Vinylidene–Fluoride And Trifluoroethylene," *J. Appl. Phys.* vol. 77 (8), 3987–3990, Apr. 15, 1995.

Flynn, Anita M., L.S. Tavrow, S.F. Bart, R.A. Brooks, D.J. Ehrlich, K.R. Udayakumar, and L.E. Cross. 1992. "Piezoelectric Micromotors for Microrobots," *IEEE Journal of Microelectromechanical Systems*, vol. 1, No. 1, pp. 44–51 (Mar. 1992); also published as *MIT Al Laboratory Memo 1269*, Massachusetts Institute of Technology (Feb. 1991).

Full, R. J. and K. Meijer, "Artificial Muscles Versus Natural Actuators From Frogs To Files," Proceedings of the 7th SPIE Symposium on Smart Structures and Materials–Electroactive Polymers and Devices (EARAD) Conference, Mar. 6–8, 2000, Newport Beach, California, USA, pp. 2–9.

Furuhata, T.; T. Hirano, and H. Fujita, "Array–Driven Ultrasonic Microactuators," Solid Stae Sensors and Actuators, 1991, Digest of Tech. Papers, Transducers, pp. 1056–1059.

Furukawa, T., and N. Seo., "Electrostrostriction as the Origin of Piezoelectricity in Ferroelectric Polymers," *Japanese J. Applied Physics*, vol. 29, No. 4, pp. 675–680 (Apr. 1990).

Gilbertson, R.G., and J.D. Busch. 1994. "Survey of Micro- –Actuator Technologies for Future Spacecraft Missions," presented at the conference entitled "Practical Robotic Interstellar Flight: Are We Ready?" New York University and The United Nations, New York. (Aug. 29 and Sep. 1, 1994); also published on the World Wide Web at http://nonothinc-.com/nanosci/microtech/mems/ten–actuators/gilbertson.html.

Goldberg, Lee, Adaptive–Filtering Developments Extend Noise–Cancellation Applications, *Electronic Design*, Feb. 6, 1995, pp. 34 and 36.

M. Greene and J. A. Willett, and Kornbluh, R., "Robotic systems," in ONR Report 32198–2, Ocean Engineering and Marine Systems 1997 Program (Dec. 1997).

Greenland, P., Allegro Microsystems Inc., and Carsten, Bruce Carsten Associates, "Stacked Flyback Converters Allow Lower Voltage MOSFETs for High AC Line Voltage Operation", *Feature PCIM Article, PCIM*, Mar. 2000.

Heydt, R., R. Pelrine, J. Joseph, J. Eckerle, and R. Kornbluh. "Acoustical Performance of an Electrostrictive Polymer Film Loadspeaker", *Journal of the Acoustical Society of America* vol. 107, pp. 833–839 (Feb. 2000).

Heydt, R., R. Kornbluh, R. Pelrine, and B. Mason, "Design and Performance of an Electrostrictive Polymer Film Acoustic Actuator", *Journal of Sound and Vibration* (1998)215(2), 297–311.

Hirano, M., K. Yanagisawa, H. Kuwano, and S. Nakano, "Micovalve with Ultra–low Leakage," Tenth Annual International Workshop on Micro Electromechanical Systems, Nagoya, Japan, IEEE Proceedings (Jan. 26–30, 1997), pp. 323–326.

Hirose, S., Biologically Inspired Robots: Snake–like Locomotors and Manipulators, *"Development of the ACM as a Manipulator"*, Oxford University Press, New York, 1993, pp. 170–172.

Hunter, I., S. Lafontaine, J. Hollerbach, and P. Hunter, "Fast Reversible NiTi Fibers for Use in MicroRobotics,"*Proc. 1991 IEEE Micro Electro Mechanical Systems–MEMS '91*, Nara, Japan, pp. 166–170.

Hunter, I.W., and S. Lafontaine, "A Comparison of Muscle with Artificial Actuators", *Technical Digest of the IEEE Solid–state Sensor and Actuator Workshop*, Hilton Head, South Carolina, Jun. 22–25, 1992, pp. 178–185.

Jacobsen, S., Price, R., Wood, J. Rytting, T., and Rafaelof, M., "A Design Overview of an Eccentric–Motion Electrostatic Microatuator (the Wobble Motor)", *Sensors and Actuators*, 20 (1989) pp. 1–16.

Kaneto, K., M. Kaneko, Y. Min, and A.G. MacDiarmid. 1995 "'Artificial Muscle': Electromechanical Actuators Using Polyaniline Films," *Synthetic Metals 71*, pp. 2211–2212, 1995.

Kawamura, S., K. Minani, and M. Esashi, "Fundamental Research of Distributed Electrostatic Micro Actuator," Technical Digest of the 11th Sensor Symposium, pp. 27–30(1992).

Kondoh Y., and T. Ono. 1991 "Bimorph Type Actuators using Lead Zinc Niobate–based Ceramics," *Japanese Journal of Applied Physics*, vol. 30, No. 9B, pp. 2260–2263, Sep. 1991.

Kornbluh, R., R. Pelrine, R. Heydt, and Q. Pei, "Acoustic Actuators Based on the Field–Activated Deformation of Dielectric Elastomers," (2000).

Kornbluh, R., G. Andeen, and Eckerle, "Artificial Muscle: The Next Generation of Robotic Actuators," presented at the Fourth World Conference on Robotics Research, SME Paper M591–331, Pittsburgh, PA, Sep. 17–19, 1991.

Kornbluh, R., R. Pelrine, J. Joseph, "Elasrtomeric Dielectric Artifical Muscle Actuators for Small Robots," *Proceedings of the Third IASTED International Conference on Roboicts and Manufacturing*, Jun. 14–16, 1995, Cancun, Mexico.

Kornbluh, R., Pelrine, R., Eckerie, J., Joseph, J., "Electrostrictive PolymerArtificial Muscle Actuators", IEEE International Conference on Robotics and Automation, Leuven, Belgium, 1998.

Kornbluh, R., R. Pelrine, Jose Joseph, Richard Heydt, Qibing Pei, Seiki Chiba, 1999. "High–Field Electrostriction Of Elastomeric Polymer Dielectrics For Actuation", Proceedings of the SPIE International Symposium on Smart Structures and Materials: Electro–Active Polymer Actuators and devices, Mar. 1–2, 1999, Newport Beach, California, USA. pp. 149–161.

Kornbluh, R. D and R. E. Pelrine, "Dexterous Multiarticulated Manipulator with Electrostrictive Polymer Artificial Muscle," ITAD–7247–QR–96–175, SRI Project No. 7247, Prepared for: Office of Naval Research, Nov. 1996.

Kornbluh, R., R. Pelrine, Q. Pei, S. Oh, and J. Joseph, 2000. "Ultrahigh Strain Response of Field—Actuated Elastomeric Polymers," Proceedings of the 7th SPIE Symposium on Smart Structures and Materials—Electroactive Polymers and Devices (EAPAD) Conference, Mar. 6–8, 2000, Newport Beach, California, USA, pp. 51–64.

Kornbluh, R., Pelrine, R. Joseph, J., Pei, Q. and Chiba, S., "Ultra–High Strain Response of Elastomeric Polymer Dielectrics", Proc. Materials Res. Soc., Fall meeting, Boston, MA, pp. 1–12, Dec. 1999.

Ktech's PVDF Sensors, http://www.ktech.com//pvdf.htm, Jun. 6, 2001, pp. 1–5.

Lang, J, M. Schlect, and R. Howe, "Electric Micromotors: Electromechanical Characteristics," Proc. IEEE Micro Robots and Teleoperators Workshop, Hyannis, Massachusetts (Nov. 9–11, 1987).

Liu, Y., T. Zeng, Y.X. Wang, H. Yu, and R. Claus, "Self-–Assembled Flexible Electrodes on Electroactive Polymer Actuators," Proceedings of the SPIE International Symposium on Smart Structures and Materials: Electro–Active Polymer Actuators and Devices, Mar. 1–2, 1999, Newport Beach, California, USA., pp. 284–288.

Liu, C., Y. Bar–Cohen, and S. Leary, "Electro–statically stricted polymers (ESSP)," Proceedings of the SPIE International Symposium on Smart Structures and Materials: Electro–Active Polymer Actuators and Devices, Mar. 1–2, 1999, Newport Beach, California, USA., pp. 186–190.

Lawless, W. and R. Arenz, "Miniature Solid–state Gas Compressor," Rev. Sci Instrum., 58(8), pp. 1487–1493, Aug. 1987.

Martin, J. and R. Anderson, 1999. "Elextrostriction In Field-–Structured Composites: Basis For A Fast Artificial Muscle?", Journal of Chemical Physics, vol. 111, No. 9, pp. 4273–4280, Sep. 1, 1999.

Measurements Specialties, Inc.—Piezo Home, http://www.msiusa.com/piezo/index.htm, Jun. 6, 2001.

T. B. Nguyen, C. K. DeBolt, Shastri, S. V., and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Ohara, K., M. Hennecke, and J. Fuhrmann, "Electrostriction of polymethylmethacrylates," Colloid & Polymer Sci. vol. 280, 164–168 (1982).

Olsson, A., O. Larsson, J. Holm, L. Lundbladh, O. Ohinan, and G. Stemme. 1997. "Valve–less Diffuser Micropumps Fabricated using Thermoplastic Replication," Proc. IEEE Micro Electro Mechanical Systems, Nagoya, Japan, pp. 305–310 (Jan. 26–30, 1997).

Olsson, A., G. Stemme, and E. Stemme, "The First Valve-–less Diffuser Gas Pump," Tenth Annual International Workshop on Micro Electromechanical Systems, Nagoya, Japan, IEEE Proceedings (Jan. 26–30, 1997), pp. 108–113.

Otero, T.F., J. Rodriguez, E. Angulo and C. Santamaria, "Artificial Muscles from Bilayer Structures," Synthetic Metals, vol. 55–57, pp. 3713–3717 (1993).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333–338, 1994.

Park, S.E., and T. Shrout., "Ultrahigh Strain and Piezoelectric Behavior in Relaxor Based Ferroelectric Single Crystals," J. Applied Physics, vol. 82, pp. 1804–1811, Aug. 15, 1997.

Pei, Q., O. Inganäs, and I. Lundström, "Bending Bilayer Strips Built From Polyaniline For Artificial Electrochemical Muscles," Smart Materials and Structures, vol. 2, pp. 16., Jan. 22, 1993.

Pei et al., "Improved Electroactive Polymers", U.S. patent application No. 09/619,847, filed 20, 2000, 70 pages.

R. Pelrine and Kornbluh, R., and. 1995. "Dexterous Multi-articulated Manipulator with Electrostrictive Polymer Artificial Muscle Actuator," EMU 95–023, SRI International, Menlo Park, California, Apr. 28, 1995.

Pelrine, R., R. Kornbluh, and Q. Pei. "Electroactive Polymer Transducers And Actuators", U.S. patent application No. 09/620,025, filed Jul. 20, 2001, 58 pages.

Pelrine, R. and Kornbluh, "Electroactive Polymer Devices", U.S. patent application No. 09/619,846, filed Jul. 20, 2000, 67 pages.

Pelrine et al., "Electroactive Polymer Electrodes", U.S. patent application No. 09/619,843, filed Jul. 20, 2000, 54 pages.

Pelrine et al., "Electroactive Polymer Fabrication", U.S. patent application No. 09/619,845, filed Jul. 20, 2000, 55 pages.

Pelrine et al., "Electroactive Polymer Generators", U.S. patent application No. 09/619,848, filed Jul. 20, 2000, 69 pages.

Pelrine, R., R. Kornbluh, and J. Joseph, "Electrostriction of Polymer Dielectrics with Compliant Electrodes as a Means of Actuation," Sensors and Actuators A: Physical, vol. 64, 1998, pp. 77–85.

Pelrine, R, R. Kornbluh, J. Joseph, and S. Chiba, "Electrostriction of Polymer Films for Microactuators," Proc. IEEE Tenth Annual International Workshop on Micro Electro Mechanical Systems, Nagoya, Jan. 26–30, 1997, pp. 238–243.

Pelrine, R., R. Kornbluh, and J. Eckerle. "Monolithic Electroactive Polymers", U.S. patent application No. 09/779,203, filed Feb. 7, 2001.

Pelrine, R., and J. Joseph, FY 1992 Final Reports on Artificial Muscle for Small Robots, ITAD–3393–FR–93–063, SRI International, Menlo Park, California, Mar. 1993.

Pelrine, R., and J. Joseph. 1994 FY 1993 Final Report on Artificial Muscle for Small Robots, ITAD–4570–FR–94–076, SRI International, Menlo Park, California.

Pelrine, R., R. Kornbluh, and J. Joseph, FY 1994 Final Report on Artificial Muscle for Small Robots, ITAD–5782–FR–95–050, SRI International, Menlo Park, California, 1995.

Pelrine, R., R. Kornbluh, and J. Joseph, FY 1995 Final Report on Artificial Muscle for Small Robots, ITAD–7071–FR–96–047, SRI International, Menlo Park, California, 1996.

Pelrine, R., R. Kornbluh, and J. Joseph, FY 1996 Final Report on Artificial Muscle for Small Robots, ITAD–7228–FR–97–058, SRI International, Menlo Park, California, 1997.

Pelrine, R., R. Kornbluh, and J. Joseph, FY 1997 Final Report on Artificial Muscle for Small Robots, ITAD–1612–Fr–98–041, SRI International, Menlo Park, California, 1998.

Pelrine, R., R. Kornbluh, and J. Joseph, FY 1998 *Final Report on Artificial Muscle for Small Robots*, ITAD–3482–FR–99–36, SRI International, Menlo Park, California, 1999.

Pelrine, R., R. Kornbluh, and J. Joseph, FY 1999 *Final Report on Artificial Muscle for Small Robots*, ITAD–10162–Fr–00–27, SRI International, Menlo Park, California, 2000.

Pelrine, R., R. Kornbluh, Q. Pei, and J. Joseph. "High–Speed Electrically Actuated Elastomers with Strain Greater Than 100%", *Science*, Reprint Series, Feb. 4 2000, vol. 287, pp. 836–839.

Pelrine, R., R. Kornbluh, Q. Pei, and J. Joseph, "High Speed Electrically Actuated Elastomers with Over 100% Strain," *Science*, vol. 287, No. 5454, pp. 1–21, 2000.

Pelrine, R., R. Kornbluh, and G. Kofod, "High Strain Actuator Materials Based on Dielectric Elastomers," submitted to *Advanced Materials* (May 2000).

Pelrine, R., Roy Kornbluh, Jose Joseph, Qibing Pei, Seiki Chiba "Recent Progress in Artificial Muscle Micro Actuators,", SRI International, Tokyo, 1999 MITI/NEEDOIMNIC, 1999.

Pelrine, R., J. Eckerle, and S. Chiba, "Review of Artificial Muscle Approaches," invited paper, in *Proc. Third International Symposium on Micro Machine and Human Science*, Nagoya, Japan, Oct. 14–16, 1992.

Pelrine, R., R. Kornbluh, and J. Eckerle. "Energy Efficient Electroactive Polymers and Electroactive Polymer devices", U.S. patent application No. 09/779,373, filed Feb. 7, 2001.

Pelrine, R., R. Kornbluh, J. Eckerle and Q. Pei. "Electroactive Polymer Thermal Electric Generators", U.S. patent application No. 09/792,431, filed Feb. 23, 2001, 98 pages.

Piezoflex™ PVDF Polymer Sensors, http://www.airmar.com/piezo/pvdf.htm, Jun. 6, 2001.

Scheinbeim, J., B. Newman, Z. Ma, and J, Lee, "Elactrostrictive Response of Elestomeric Polymers," *ACS Polymer Preprints*, 33(2), pp. 385–386, 1992.

Schlaberg, H. I., and J. S. Duffy, "Piezoelectric Polymer Composite Arrays For Ultrasonic Medical Imaging Applications," *Sensors and Actuators*, A 44, pp. 111–117, Feb. 22, 1994.

Shahinpoor, M., "Micro–electro–mechanics of Ionic Polymer Gels as Electrically Controllable Artificial Muscles," *J. Intelligent Material Systems and Structures*, vol. 6, pp. 307–314, May 1995.

Shkel, Y., and D. Klingenberg, "Material Parameters for Electrostriction," *J. Applied Physics*, vol. 80(8), pp. 4566–4572, Oct. 15, 1996.

Smela, E., O. Inganaäs, and I. Lundström, "Controlled Folding of Micrometer–size Structures," *Science*, vol. 268, pp. 1735–1738 (Jun. 23, 1995).

Smela, E., O. Inganäs, Q. Pei, and I. Lundström, "Electrochemical Muscles: Micromachining Fingers and Corkscrews," *Advanced Materials*, vol. 5, No. 9, pp. 630–632, Sep. 1993.

Su, J., Q. M. Zhang, C. H. Kim, R. Y. Ting, and R. Capps, "Effects of Transitional Phenomena on the Electric Field induced Strain—electrostrictive Response of a Segmented Polyurethane Elastomer," pp. 1363–1370, Jan. 20, 1997.

Su, J., Z. Ounaies, J. S. Harrison, Y. Bara–Cohen and S. Leary, "Electromechanically Active Polymer Blends for Actuation," Proceedings of the 7th SPIE Symposium on Smart Structures and Materials–Electroactive Polymers and Devices (EAPAD) Conference, Mar. 6–8, 2000, Newport Beach, California, USA, pp. 65–72.

Technology, http://www.micromuscle.com/html/technology.html, Jun. 6, 2001.

Tobushi, H., S. Hayashi, and S. Kojima, "Mechanical Properties of Shape Memory Polymer of Polyurethane Series," in *JSME international Journal*, Series I, vol. 35, No. 3, 1992.

Treloar, L.R.G, "Mechanics of Rubber Elasticity,"*J. Polymer Science, Polymer Symposium*, No. 48, pp. 107–123, 1974.

Uchino, K. 1986 "Electrostrictive Actuators: Materials and Applications," *Ceramic Bulletin*, 65(4), pp. 647–652, 1986.

Wade, W. l., Jr., R. J. Mammone and M. Binder, "Increased Dielectric Breakdown Strengths Of Melt–Extruded Polyporpylene Films" *Polymer*, vol. 34, No. 5, pp. 1093–1094 (1993).

Wax, S. G. and R. R. Sands, "Electroactive Polymer Actuators and Devices," Proceedings of the SPIE International Symposium on Smart Structures and Materials: electro–Active Polymer Actuators and Devices, Mar. 1–2, 1999, Newport Beach, California, USA., pp. 2–10.

Winters, J., "Muscle as an Actuator for Intelligent Robots", Robotics Research: Trans. Robotics International of SME, Scottsdale, AZ (Aug. 18–21, 1986).

Yam, P., "Plastics Get Wired", *Scientific American*, vol. 273, pp. 82–87, Jul. 1995.

Zhang, Q. M., V. Bharti, Z.–Y. Cheng, T.–B. Xu, S. Wang, T. S. Ramotowski, F. Tito, and R. Ting, "Electromechanical Behavior of Electroactive P(VDF–TrFE) Copolymers," Proceedings of the SPIE International Symposium on Smart Structures and Materials: Electro–Active Polymer Actuators and Devices, Mar. 1–2, 1999, Newport Beach, California, USA., pp. 134–139.

Zhang, Q., V. Bharti, and X. Zhao, "Giant Electrostriction and Relaxor Ferroelectric Behavior in Electron–irradiated Poly(vinylidene fluoride–trifluoroethylene) Copolymer," *Science*, vol. 280, pp. 2101–2104 (Jun. 26, 1998).

Zhang, Q. M., Z.–Y. Cheng, V. Bharti, T.–B. Xu, T, Mai, and S. J. Gross, "Piezoelectric And Electrostrictive Polymeric Actuator Materials," Proceedings of the 7th SPIE Symposium on Smart Structures and Materials–Electroactive Polymers and Devices (EAPAD) Conference, Mar. 6–8, 2000, Newport Beach, California, USA, pp. 34–50.

Zhenyi, M., J.I. Scheinbeim, J.W. Lee, and B.A. Newman. 1994. "High Field Electrostrictive Response of Polymers," *Journal of Polymer Sciences, Part B—Polymer Physics*, vol. 32, pp. 2721–2731, 1994.

\* cited by examiner

BIOLOGICALLY POWERED ELECTROACTIVE POLYMER GENERATORS

CROSS-REFERENCE TO RELATED APPLICATION

This application claims priority under 35 U.S.C. §119 (e) from co-pending U.S. Provisional Patent Application No. 60/184,217 filed Feb. 23, 2000, naming Qibing Pei et al. as inventors, and titled "ELECTROELASTOMERS AND THEIR USE FOR POWER GENERATION", which is incorporated by reference herein for all purposes; it also claims priority under 35 U.S.C. §119(e) from co-pending U.S. Provisional Patent Application No. 60/190,713 filed Mar. 17, 2000, naming Joseph Eckerle et al. as inventors, and titled "ARTIFICIAL MUSCLE GENERATOR", which is incorporated by reference herein for all purposes; it also claims priority under 35 U.S.C. §119(e) from co-pending U.S. Provisional Patent Application No. 60/196,420 filed Apr. 12, 2000, naming Ronald Pelrine et al. as inventors, and titled "HEEL STRIKE GENERATORS USING ELECTRO-ACTIVE POLYMERS", which is incorporated by reference herein for all purposes. This application cross references co-pending U.S. Patent Application entitled "ELECTRO-ACTIVE POLYMER GENERATORS" naming R. E. Pelrine et al. as inventors, filed on Jul. 20, 2000 (U.S. Application Ser. No. 09/619,848), which is incorporated by reference herein for all purposes.

U.S. GOVERNMENT RIGHTS

This application was made in part with government support under contract number DAAG55-98-K-001 awarded by the United States Army Research Office and Defense Advanced Research Project Agency. The government has certain rights in the invention.

BACKGROUND OF THE INVENTION

The present invention relates generally to ElectroActive Polymers (EAP) that convert between electrical energy and mechanical energy. More particularly, the present invention relates to polymers and their use as generators for harvesting electrical energy from unused biologically generated energy sources such as the forces generated when a person's foot contacts a surface during bipedal motion.

In many applications, it is desirable to convert between electrical energy and mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines). Exemplary applications requiring translation from mechanical to electrical energy include mechanical property sensors and heel strike generators. These applications include one or more transducers that convert mechanical energy into electrical energy. Common electric generator technologies, such as electromagnetic generators, are also not suitable for many of these applications, e.g., when the required device size is small (e.g., in a person's shoe). These technologies are also not ideal when a large number of devices must be integrated into a single structure or under various performance conditions such as when high power density output is required at relatively low frequencies.

Several 'smart materials' have been used to convert between electrical and mechanical energy with limited success. These smart materials include piezoelectric ceramics, shape memory alloys and magnetostrictive materials. However, each smart material has a number of limitations that prevent its broad usage. Certain piezoelectric ceramics, such as lead zirconium titanate (PZT), have been used to convert electrical to mechanical energy. While having suitable efficiency for a few applications, these piezoelectric ceramics are typically limited to a strain below about 1.6 percent and are often not suitable for applications requiring greater strains than this. In addition, the high density of these materials often eliminates them from applications requiring low weight. Irradiated polyvinylidene difluoride (PVDF) when combined with various copolymers is an electroactive polymer reported to have a strain of up to 4 percent when converting from electrical to mechanical energy. Similar to the piezoelectric ceramics, the PVDF-based material is often not suitable for applications requiring strains greater than 4 percent. Shape memory alloys, such as nitinol, are capable of large strains and force outputs. These shape memory alloys have been limited from broad use by unacceptable energy efficiency, poor response time and prohibitive cost.

In addition to the performance limitations of piezoelectric ceramics and irradiated PVDF-based materials, their fabrication often presents a barrier to acceptability. Single crystal piezoelectric ceramics must be grown at high temperatures coupled with a very slow cooling down process. Irradiated PVDF-based materials must be exposed to an electron beam for processing. Both these processes are expensive and complex and may limit acceptability of these materials.

As advances in microchip fabrication continue to reduce the cost and the size of logic devices while increasing their computing capabilities, new portable electronic devices using these logic devices are continually being developed. Also, these logic devices are being incorporated into existing electronic devices to increase their functionality and in some case to enable portability. Cellular phones, pagers, personal digital assistants, MP-3 players, navigational devices and locator devices are a few examples of newer portable electronic devices. These portable electronic devices along with other older portable electronic devices such as flashlights, electric tools, credit card readers and radios are utilized in many activities. All of these devices require a source of electrical energy to operate. Typically, the devices employ disposable or rechargeable batteries as an electrical power source. Performance parameters of the batteries such as cost, weight and life-time are critical element in the design and operation of these devices.

With the portable electronics devices describe above, it would be desirable to reduce or eliminate the need to constantly recharge or replace the batteries that power the devices. One approach to meet this need is to harvest energy from unused biological and environment energy sources. For instance, solar energy may be converted to electrical energy to provide a power source. However, a disadvantage of solar energy is the low energy density of solar power limits the portability solar collectors. Further, solar power does not provide power at night or on cloudy days. Another approach for providing power for portable electronic devices may be to convert unused mechanical energy generated from a biological or an environmental energy source. For instance, a significant portion of the mechanical energy generated while a person is walking is typically unused. In view of the foregoing, alternative devices that efficiently convert unused biological energy sources or unused environmental energy sources to electrical energy would be desirable.

SUMMARY OF THE INVENTION

This invention addresses the needs indicated above by providing generators with one or more transducers that use electroactive polymer films to convert mechanical energy to electrical energy. The generators may include one or more transmission mechanisms that transfer a portion of an unused biological energy source, an unused environmental energy source or combinations of both to the one or more transducers located in the generator. The energy received by the transducers may be converted to electrical energy by the transducers in conjunction with conditioning electronics located within the generator. One embodiment of the present invention provides a heel-strike generator integrated into to the heel of footwear to convert mechanical energy generated during human bipedal motion to electrical energy.

One aspect of the present invention provides a generator for converting biologically-generated mechanical energy to electrical energy. The generator may be generally characterized as including: 1) one or more transducers where each transducer comprises at least two electrodes and a polymer arranged in a manner which causes a change in electric field in response to a deflection applied to a portion of the polymer; 2) conditioning electronics connected to the at least two electrodes and designed or configured to remove electrical energy from the one or more transducers where the conditioning electronics are designed or configured to perform one or more of the following functions: voltage step-up, voltage step-down and charge control; and 3) one or more transmission mechanisms that are designed or configured to receive biologically-generated mechanical energy and to transfer a portion of the biologically-generated mechanical energy to the polymer where the transferred portion of the biologically generated mechanical energy results in a deflection in the portion of the polymer. The biologically-generated mechanical energy may be generated from a biological system selected from the group consisting of a human, animals or both. The polymer may comprise a material selected from the group consisting of silicone elastomers, acrylic elastomers, polyureathanes, copolymers comprising PVDF and combinations thereof. The polymer may be configed in a manner which consists of stacked multilayers to increase active area and thus to increase electrical energy per motion.

The biologically-generated mechanical energy may produce an inertial force or a direct force where a portion of the inertial force or a portion of the direct force is received by the transmission mechanism. In one embodiment, the direct force may be selected from the group consisting of a foot strike, a hand contraction, a hand strike, a finger strike, a chest expansion, a chest contraction and combinations thereof. The inertial force may be from a biologically-generated motion where the one or more transmission mechanisms comprises an inertial mass that is designed or configured to move in response to an inertial force and where the mechanical energy generated by the movement of the inertial mass is used to generate electrical energy. The inertial mass may be part of the device, or it may be an existing mass carried or moved for a different purpose such as a backpack.

In particular embodiments, the generator may include a housing enclosing the one or more transducers and the one or more transmission mechanisms. In some embodiments, the housing may be integrated into footwear. The generator may also include 1) an electrical interface designed or configured to output the electrical energy where the electrical energy is used to power a portable electronic device and 2) one or more batteries for storing electrical energy removed from the one or more transducers where at least one the batteries is used to increase the charge of the polymer.

In particular embodiments, the one or more transmission mechanisms may include a fluid, one or more support members or combinations thereof, designed or configured to transfer the portion of the biologically-generated mechanical energy. The transmission mechanism may includes a fluid- or gel-filled container where the fluid- or gel-filled container is designed or configured to transfer the portion of the biologically-generated mechanical energy. The fluid- or gel-filled container may be a bellows or a bladder.

In yet other embodiments, the generator may include one or more support structures designed or configured to attach to the one or more transducers. The support structures may include a fluid- or gel-filled container where the fluid or gel filled container is designed or configured to deflect one or more portions of a polymer. In addition, the polymer may include a first portion and a second portion arranged in a manner which causes a change in electric field in response to a deflection applied at least one of the first portion and the second portion. In a particular embodiment, one or more sensors may be connected to the generator.

Another aspect of the present invention provides a generator that converts mechanical energy to electrical energy. The generator may be generally characterized as including: 1) one or more transducers where each transducer comprises at least two electrodes connected to the electrical interface and a polymer arranged in a manner which causes a change in electric field in response to a deflection applied to a portion of the polymer and 2) charge control circuitry connected to the at least two electrodes and designed or configured to remove electrical energy from the one or more transducers. The generator may include circuitry to add charge to the polymers at certain times of the cycle. The generator may also include step-down circuitry designed or configured to receive an input signal with an input voltage level and output an output signal with an output voltage level where the output voltage level is lower than the input voltage level. The input signal to the step-down circuitry may be received from the charge control circuitry.

In particular embodiments, the generator may include an electrical output interface designed or configured to output the output signal from the step-down circuitry. The electrical output interface may be connected to a battery or to a portable electronic device. The output voltage level of the output signal may be between about 1.5 Volts and about 48 Volts. The generator may also include one or more power conversion circuitry units designed or configured to reduce the voltage level of a signal within the step-down circuitry. Further, one or more capacitors may reduce a voltage level of a signal received by the one or more power conversion circuitry units In another embodiment, the generator may include step-up circuitry designed or configured to receive an input signal with an input voltage level and output an output signal with an output voltage level where the input voltage level is lower than the output voltage level. The output signal may be received by the charge control circuitry. Further, an electrical input interface may receive the input signal where the electrical input interface is connected to a battery. A voltage of the battery may be between about 1.5 and about 12 Volts. The step-up circuitry may include a transformer, a transformer primary driver circuit for controlling the transformer.

Another aspect of the present invention provides a generator for converting mechanical energy generated during human bipedal motion to electrical energy. The generator may be generally characterized as including: 1) one or more transducers mounted in footwear where each transducer comprises at least two electrodes and a polymer arranged in a manner which causes a change in electric field in response to a deflection applied to a portion of the polymer; 2) one or more transmission mechanisms that are designed or configured to receive mechanical energy generated during human bipedal motion and to transfer a portion of the mechanical energy to the polymer where the transferred portion of the mechanical energy results in a deflection in the portion of the polymer and 3) conditioning electronics connected to the at least two electrodes and designed or configured to remove electrical energy from the one or more transducers. Further the conditioning electronics may be designed or configured to perform one or more of the following functions: voltage step-up, voltage step-down and charge control (add and remove charge from the polymer electrodes). The polymer in the transducers may include a first portion and a second portion arranged in a manner which causes a change in electric field in response to a deflection applied to at least one of the first portion and the second portion where the polymer comprises a material selected from the group consisting of silicone elastomers, acrylic elastomers, polyureathanes, copolymers comprising PVDF and combinations thereof.

In particular embodiments, the one or more transmission mechanism may receive mechanical energy when a portion of the footwear contacts a surface during the human bipedal motion. The generator may also include a housing enclosing at least one of the one or more transducers, at least one of the one or more transmission mechanisms and the conditioning electronics. The housing may be water-proof. The generator may also include one or more support structures designed or configured to attach to the one or more transducers.

In a particular embodiment, the footwear includes at least one heel where the one or more transducers, at least one of the one or more transmission mechanisms and the conditioning electronics housing is integrated into the heel of the footwear. The heel may be designed or configured to be detachable from the boot. One or more support members may be mounted in the transmission mechanism where the one or more support members transfer the portion of mechanical energy. Further, one or more support structures may be attached to at least one of the transducers. In a particular embodiment, the one or more support structures are attached to the polymer to form one or more diaphragms.

The transmission mechanism may receive mechanical energy when a portion of the heel contacts a surface during the human bipedal motion. The transmission mechanism may include a fluid- or gel-filled container and where the fluid- or gel-filled container is designed or configured to transfer the portion of the mechanical energy. In particular embodiments, the fluid- or gel-filled container may be a bellows or a bladder. The fluid- or gel-filled container may be designed or configured to contract when the mechanical energy is applied and to uncontract when the mechanical energy is removed where the stroke distance between when the mechanical energy is applied and when the mechanical energy is removed is between about 1 mm and about 10 mm.

Another aspect of the present invention provides a generator for converting environmentally-generated mechanical energy to electrical energy. The generator may be generally characterized as including one or more transducers where each transducer comprises at least two electrodes and a polymer arranged in a manner which causes a change in electric field in response to a deflection applied to a portion of the polymer; 2) conditioning electronics connected to the at least two electrodes and designed or configured to remove electrical energy from the one or more transducers; and one or more transmission mechanisms that are designed or configured to receive environmentally-generated mechanical energy and to transfer a portion of the environmentally-generated mechanical energy to the polymer wherein the transferred portion of the environmentally generated mechanical energy results in a deflection in the portion of the polymer. The environmentally-generated mechanical energy may be generated from an environmental energy source selected from the group consisting of wind, waves and water flow.

In one aspect, the present invention relates to a device for converting between electrical energy and mechanical energy. The device comprises at least one transducer. Each transducer comprises at least two electrodes and a polymer in electrical communication with the at least two electrodes in a manner that supports one of electrical generation and mechanical actuation. The device also comprises a first member having a proximate end coupled to a first region of the transducer and a distal end. The device additionally comprises a second member having a proximate end coupled to a second region of the transducer and a distal end coupled to the distal end of the first member. Deflection of the polymer along a plane causes the proximate ends of the first and second members to translate along the plane and causes said distal ends of the first and second members to translate together in a direction that is not coplanar with the plane.

These and other features and advantages of the present invention will be described in the following description of the invention and associated figures.

DETAILED DESCRIPTION OF THE PREFERRED EMBODIMENTS

Figure 1:
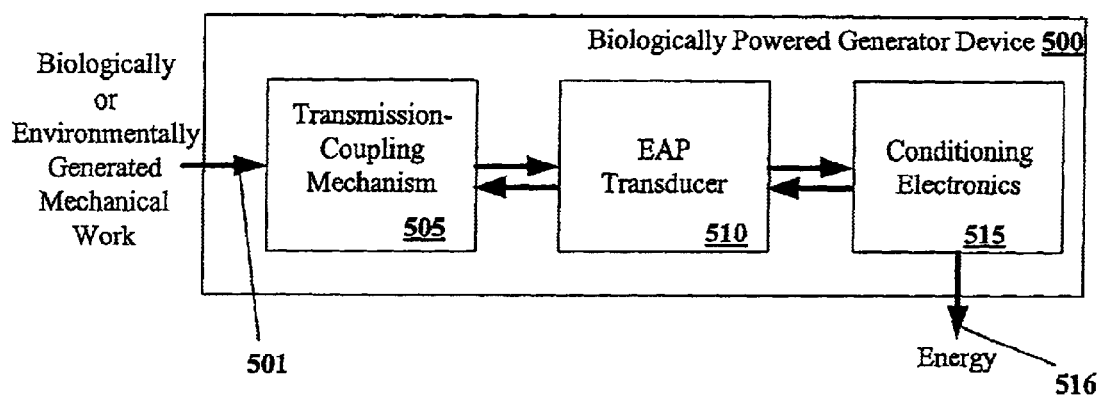
FIG. 1 is a block diagram of a generator device for harvesting biologically generated energy.

The present invention is described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. Overview

Electroactive polymers may convert between electrical energy and mechanical energy in a bi-directional manner. One aspect of the present invents relates to harvesting unused mechanical energy generated from a biological system and converting it to electrical energy using generators employing electroactive polymers. For instance, a force resulting from foot striking a surface during human bipedal motion may be converted into electrical energy using a generator of the present invention. As another example, an inertial force resulting from the swing of a human arm may be converted to electrical energy by a generator of the present invention worn on the wrist of the human arm. Further, since biologically systems typically interact with their environment, unused environmental energy sources in combination or separate from unused biological sources may be converted to electrical energy. For instance, when a human is riding in an automobile and wearing a generator device on their wrist, the generator device may convert energy derived from the vibration of the automobile to electrical energy. As long as the generator device is receiving vibrational energy from the automobile, the conversion of the vibrational energy from the automobile to electricity may occur whether the generator device is worn or not. The electrical energy harvested in the manners described above may be used to power a number of electronic devices such as cell phones, radios, MP-3 players, personal digital assistants, locator beacons, etc. Details of generator devices, such as a heel-strike generator and generator device components using electroactive polymers for performing energy harvesting, are described below.

In one aspect, the present invention relates to electroactive polymer transducers that comprise multiple active areas. The multiple active areas may be arranged on a single polymer. The ability to arrange multiple active areas on a single polymer allows for numerous transducer configurations. The multiple active areas may be used in a variety of ways. The ability to use these multiple active areas independently increases electroactive polymer flexibility in converting between electrical and mechanical energy and allows the polymers to be used in many new applications such as the biologically powered devices of the present invention.

For ease of understanding, the present invention is mainly described and shown by focusing on a single direction of energy conversion. More specifically, the present invention focuses on converting mechanical energy into electrical energy, i.e., when a transducer is operating in a generator. The mechanical energy may be harvested from a biological source such as bipedal motion of a human being. However, in all the figures and discussions for the present invention, it is important to note that the polymers and devices may convert between electrical energy and mechanical energy bi-directionally and some transducers may be described as operating in an actuator. Thus, any of the polymer materials, polymer configurations, transducers, and devices described herein are also a transducer for converting electrical energy to mechanical energy (an actuator). Similarly, any of the exemplary electrodes described herein may be used with a generator of the present invention. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

Thus, polymers and transducers of the present invention may be used as an actuator to convert from electrical to mechanical energy or a generator to convert from mechanical to electrical energy. For a transducer having a substantially constant thickness, one mechanism for differentiating the performance of the transducer, or a portion of the transducer associated with a single active area, as being an actuator or a generator is in the change in net area orthogonal to the thickness associated with the polymer deflection. For these transducers or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes, the transducer/active area is converting electrical to mechanical energy and acting as an actuator. The change in area in both cases corresponds to a reverse change in film thickness, i.e. the thickness contracts when the planar area expands, and the thickness expands when the planar area contracts. Both the change in area and change in thickness determine the amount of energy that is converted between electrical and mechanical. Since the effects due to a change in area and corresponding change in thickness are complementary, only the change in area will be discussed herein for sake of brevity. In addition, although deflection of an electroactive polymer will primarily be discussed as a net increase in area of the polymer when the polymer is being used in an actuator to produce mechanical energy, it is understood that in some cases (i.e. depending on the loading), the net area may decrease to produce mechanical work. Thus, devices of the present invention may include both actuator and generator modes, depending on how the polymer is arranged and applied.

2. General Structure of Biologically Powered Generators Employing Electroactive Polymers FIG. 1 is a block diagram of a biologically powered generator device 500 for harvesting biologically generated mechanical energy 501. The biologically generated mechanical energy 501 is input into the generator 500 in some manner via one or more transmission coupling mechanisms 505 (See FIG. 3). The mechanical work 501 is converted to electrical energy by one or more transducers employing an electroactive polymer (See FIGS. 4A–5O) in conjunction with conditioning electronics 515 (See FIGS. 6A–6E). The conditioning electronics 505 may transfer harvested electrical energy 516 to an electrical energy output.

Typically, the biologically generated mechanical work 501 comprises unused mechanical energy that is generated from a living biological system. For instance, a generator of the present invention may be located in a heel of footwear to convert a portion of mechanical energy generated during human bipedal motion resulting from the heel striking the ground to electrical energy (see FIGS. 7A–7B). As another example, a generator of the present invention may be located in a collar of an animal such as a cat or a dog. Inertial forces generated from the motion of the animal, such as an up and down vertical motion while a dog or a cat is walking, may be harvested by a generator of the present invention located in a collar worn by the animal to produce electrical energy 516 (See FIG. 8). In a particular embodiment, the electrical energy may be used to power a locator device also located in the animal's collar. In general, the biologically generated mechanical energy 501 may be harvested from any type of animal coupled to a generator of the present invention in some manner.

In many cases, a biological system interacts in an environment where environmentally generated energy may contribute to the biologically generated mechanical energy 501. The environmentally generated energy may be harvested in combination with the biologically generated mechanical energy as well as separately from the biologically mechanical energy. For instance, a person may carry a cell phone that is powered by a generator 500 of the present invention. The generator 500 may be designed to harvest energy from inertial forces generated while person is walking and from other inertial forces the person may encounter in their environment (See FIG. 2A). For example, the generator 500 in the cell phone may be designed to harvest energy from inertial forces generated from vibrations of an automobile in which the person is traveling, or from inertial forces from motion of a backpack carried by the person. The energy harvested from the automobile vibrations may be harvested when the person is carrying the generator 500 or when the generator 500 is being transported with the person in the automobile but separately from the person. As another example, the generator 500 may be designed to harvest energy from inertial forces generated from waves while a person is travelling in a boat. If the person was walking around the boat, combined inertial forces from waves and walking motions of the person might be harvested by the generator. In yet another example, the generator 500 may be designed to harvest energy from wind impacting the person as the person carries the generator 500.

A single generator 500 may contain a plurality of transmission mechanisms 505 and a plurality of transducers 510 designed to harvest multiple biological and environment energy sources. For example, a portable generator 500 carried by a person may contain two transducers each transducer coupled to a particular transmission mechanism and each transducer designed to harvest a particular range of inertial forces that the person may encounter while carrying the generator such as inertial forces generated during walking and inertial forces generated during travel in an automobile.

In one embodiment of the present invention, operational characteristics of the transducers 510 or other components in the generator may be adjusted according to different parameters detected by sensors located in the generator. For instance, for a heel-strike generator, the input frequency of energy to the generator may vary according to the speed at which a person wearing footwear with the heel strike generator is moving. The heel-strike generator 500 may detect the frequency at which the person is moving and adjust the operational characteristics of one or more of the transducers 510 such as an operation cycle to more efficiently harvest energy at the given input frequency. An operation cycle of a transducer of the present invention is described with respect to FIG. 2B. To perform these operations, a generator 500 may contain a logic device such as a microcontroller or a microprocessor which is designed or configured to control the operation of the generator 500.

Figure 2A:
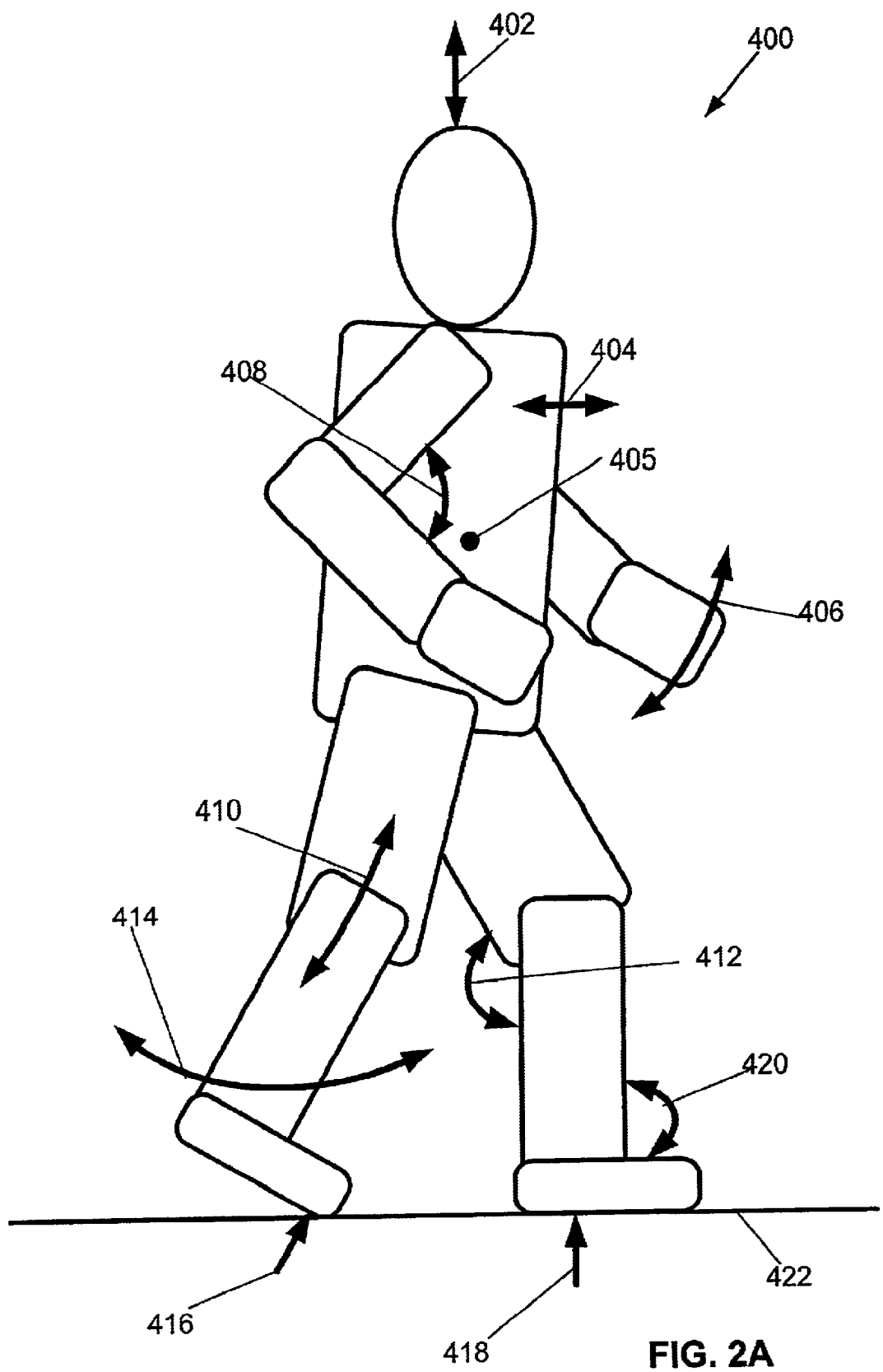
FIG. 2A is a block diagram of a number of direct and inertial forces generated during human bipedal motion.

FIG. 2A is a block diagram of a number of direct and inertial forces generated by a person 400 during human bipedal motion. A similar force diagram may be generated for other types of animals such as cats or dogs. Further, although not shown, additional forces from environment sources such as wind and water may be used with generators of the present invention. The direct and inertial forces may be harvested by a biologically powered generator of the present invention to generate electrical energy. The magnitude of the forces may be measured according to a center of mass 405 of the person or any other appropriate reference system. Forces, 416 and 418, generated when a person's feet or footwear contacts a surface 422 or forces, 404, generated when a person's chest expands or contracts are examples of direct forces that may be harvested by generators of the present invention. Other examples of direct forces may include a hand contraction, a hand strike and a finger strike. For instance, a finger strike may result from a person tapping one or more keys on a key board. Other direct forces may be generated by coupling mechanisms anchored to parts of the body moving relative to one other. For instance, webbing attached between an upper arm and a lower arm, 408, an upper leg and a lower leg, 412, or between a lower leg and a foot, 420, may be stretched and contracted to generate direct forces that may be input into a biologically powered generator. Portions of all of the forces, described above, may be transferred by a transmission mechanism of some type (see FIG. 3) to a transducer located in the generator.

An arm swing 406, a vertical head motion 402, a leg swing 414 and an up and down leg motion 410 are a few examples of inertial forces that may be harvested by the generators of the present invention. The inertial forces may be used to move an inertial mass located within the generator (See FIG. 3). The movement of the inertial mass in the generator may be converted to electrical energy using one or more of the transducers of the present invention.

Movements of objects carried by the person 400 may also be used to generate electrical energy harvested by generators of the present invention. For instance, the person 400 may carry a back pack that moves up and down as the person walks. A generator may be designed that converts a portion of the up and down motion of the back pack into electrical energy. Energy from an environmental source may also be harvested. For instance, the person 400 may carry a wind device that is moved by wind. A generator of the present invention may be designed that converts a portion of the energy generated from the movement of the wind device and convert into electrical energy.

The types of motions described above tend to be large motions with low cycling frequencies. An advantage of the polymer transducer devices of the present invention is that the transducers may be tuned to efficiently harvest energy generated by large motions with low cycling frequencies which are typical of human motions. Further, the human motions may vary over a significant range of frequencies. The polymer transducers may be designed to efficiently harvest energy from human motion over a wide range of frequencies. Other types of material used to convert mechanical energy such as piezoelectric ceramics tend to work best with short, high frequency motions and are not easily adjusted to work efficiently over a wide range input energy frequencies.

Figure 2B:
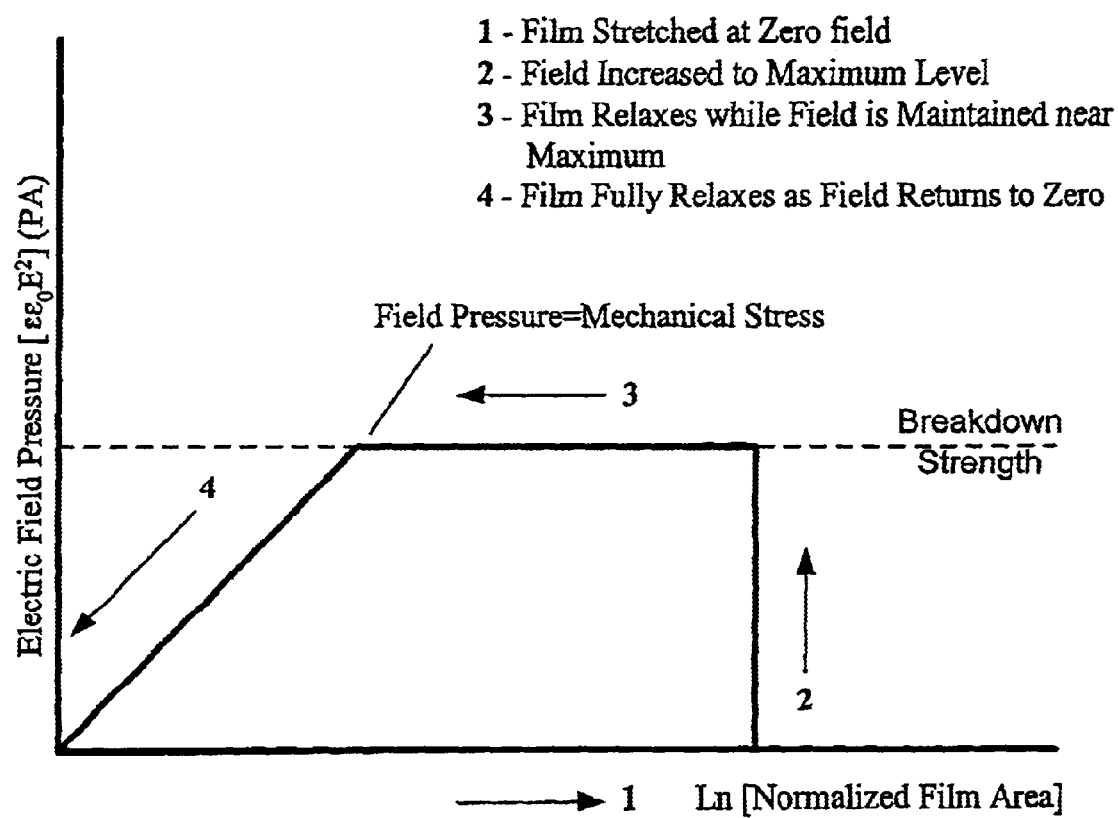
FIG. 2B illustrates a cycle for harvesting energy from a generator employing an electroactive polymer transducer.

FIG. 2B illustrates a cycle for harvesting energy from a generator employing an electroactive polymer device for one embodiment of the present invention. In the present invention, an energy source, e.g. biological, environmental or combination thereof, is harvested to produce electricity using a generator including an electroactive polymer film of some type. In general, the energy source is used to deflect or stretch the EAP polymer film in some manner (See FIGS. 4A–5Q). To generate electrical energy over an extended time period, the polymer film may be stretched and relaxed over many cycles. Typically, the cycle varies with time because most biological energy sources harvested by generators of the present invention, such as energy harvested from a person walking, vary with time.

In FIG. 2B, one cycle of a polymer film stretching and relaxing to convert mechanical energy to electrical energy is shown. The cycle is for illustrative purposes only. Many different types of cycles may be employed by generators of the present invention and the generators are not limited to the cycle shown in FIG. 2B. In 1, the EAP polymer film is stretched with zero electric field pressure on the polymer. The stretching may result from a mechanical force applied to the film generated from an external energy source input into the generator. For example, the heel of a person's foot striking the ground may provide the external energy source. In 2, the electric field pressure on the polymer film is increased to some maximum value. Conditioning electronics necessary to perform this function are described with reference to FIGS. 6A–6E. In this example, the maximum value of the electric field pressure is just below the breakdown strength of the polymer, allowing for changes in the environment, lifetime, and the polymer which may change the breakdown strength of the polymer. In 3, the polymer relaxes while the electric field pressure is maintained near its maximum value. The relaxation process may correspond to a person lifting their foot after it has struck the ground. As the polymer relaxes, the voltage of the charge on the polymer film is increased. The increase in charge's electrical energy, as indicated by its higher voltage, on the polymer film is harvested to generated electrical energy. In 4, the polymer film fully relaxes as the electric field pressure is reduced to zero and the cycle may be repeated. For instance, the cycle may be initiated again as a person takes a second step in a series of step during bipedal motion.

Transducers using an EAP film that are cycled in a manner such as described with reference to FIG. 2B, may have electrical energy added to EAP film at certain times in the cycle and may have electrical energy removed from the EAP film in other portions of the cycle. In general, generators of the present invention that employ EAP film transducers are designed such that the total electrical energy added to the EAP film is less than the total electrical energy removed from the EAP film during a cycle of some type. Also, generator components such as the conditioning electronics are designed to minimize electrical losses such that a net amount of electrical energy output from the generator is positive.

Figure 3A:
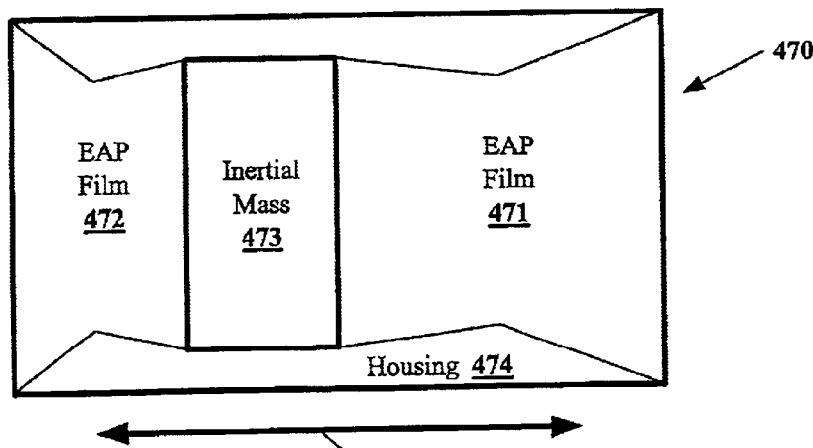
FIGS. 3A–3C are side views of a number of transmission coupling mechanisms for embodiments of the present invention.
Figure 3B:
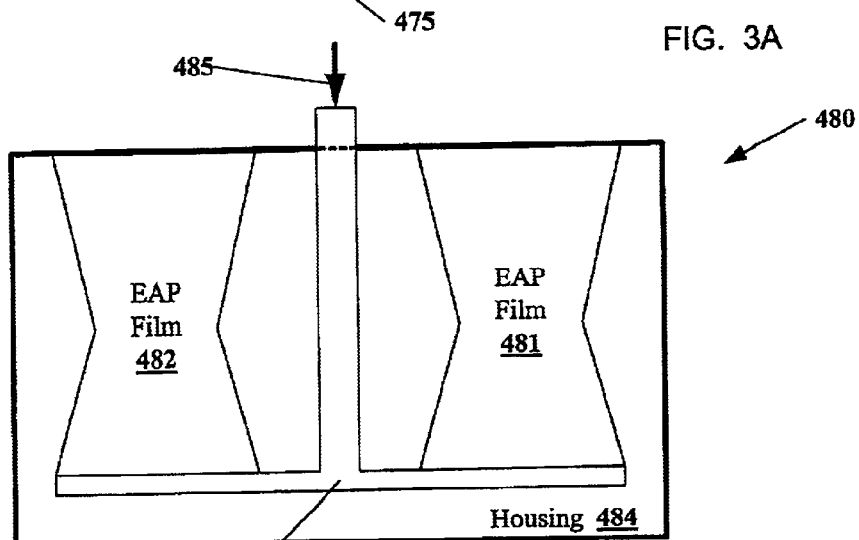
Figure 3C:
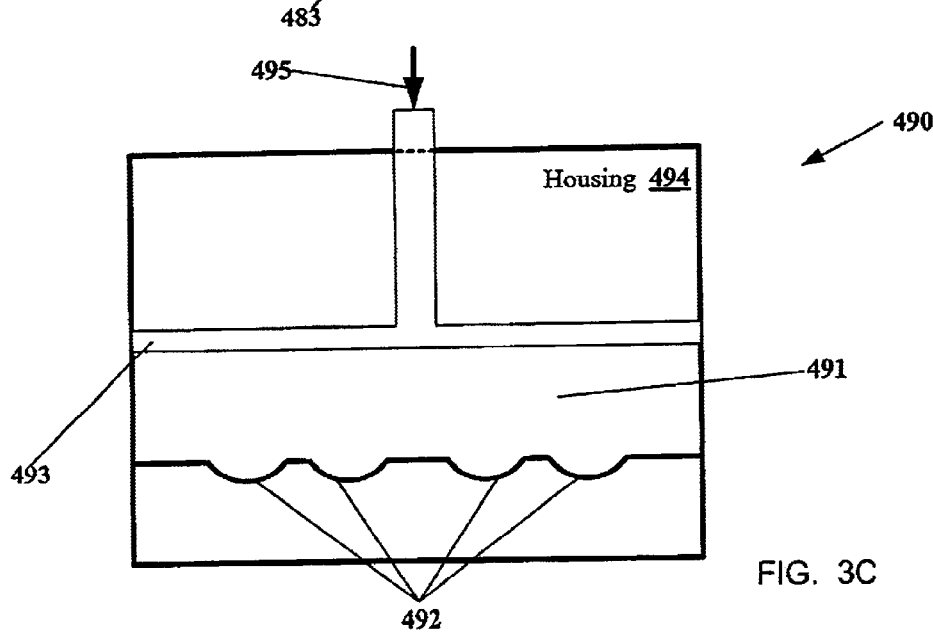

FIGS. 3A–3C are side views of embodiments of transmission coupling mechanisms used in the present invention. Generators of the present invention may contain one or more transmission mechanisms that transfer a portion of an external energy source to a transducer employing an electroactive polymer film. As described above, an external energy source may be a combination of biological and environmental energy sources. FIG. 3A shows an example of a transmission mechanism 470 that may transfer a portion of an inertial force to two electroactive polymer films. For instance, when the transmission mechanism 470 is located on the wrist of a person's arm, a swinging motion of the person's arm 475 may cause the inertial mass 473 to move linearly back and forth along line 475. The back and forth motion of the inertial mass 473 may cause electroactive polymers 471 and 472 attached to housing 474 to stretch and relax as the inertial mass moves. Electrical energy may be harvested from the stretching and the relaxing of the electroactive polymer films as described with reference to FIG. 2B.

Inertial force coupling is not limited to linear motions. For instance, an inertial mass may be suspended in a center a spherical housing by a number of strands of electroactive polymer films. In response to a three dimensional inertial force vector, the inertial mass may move about the center of the spherical housing stretching and relaxing various strands of electroactive polymer films. As the different strands are stretched and relaxed, electrical energy may be harvested from each strand.

FIG. 3B shows an example of a transmission mechanism 480 that may transfer a portion of a direct force 485 to two electroactive polymer films, 481 and 482. The portion of the direct force 485 is transferred to the electroactive polymer films attached to the housing 484 by the support member 483. The direct force 485 may increase and decrease such that the electroactive polymer films 481 and 482 are stretched and relaxed. In this embodiment, the motion of the polymer films 481 and 482 has a 1:1 correspondence to the motion of the support member 483 where the direct force is applied. That is, the polymers 481 and 482 displace one millimeter for each millimeter of displacement at the point on support member 483 where the direct force 485 is applied. The use of a direct force is in contrast to many other types of devices using alternative technologies such as electromagnetics and piezoelectrics. These technologies may require the use of complicated transmissions to obtain good generator performance. As described with reference to FIG. 2B, the stretching and relaxing of the electroactive polymer films may be used to harvest electrical energy.

The direct force 485 may result from a number of external sources. For instance, a direct force 485 may be input into the transmission mechanism 480 from a foot striking a surface which pushes the support member 483 towards the bottom of the housing 484. As another example, the electroactive polymer films, 481 and 482, may be secured in a manner such that the electroactive polymer films are stretched when the direct force 485 is in the opposite direction as shown in FIG. 3B. For example, a flexible strap attached to the support member 483 and a person's arm may pull on the support member 483 as the person's arm swings causing the polymer films, 481 and 482, to stretch and relax.

The present invention is not limited direct forces producing linear motions. Multidimensional direct forces may be converted to multidimensional or linear deflections of an electroactive polymer film. Further, the present invention is not limited to the mechanical linkages such as the support member 483 and the electroactive polymer film arrangement in transmission mechanism 480. Transmission mechanisms using different mechanical linkages may be connected to electroactive polymer film arrangements with a plurality of transducers with different orientations and using various attachment schemes.

Figure 8:
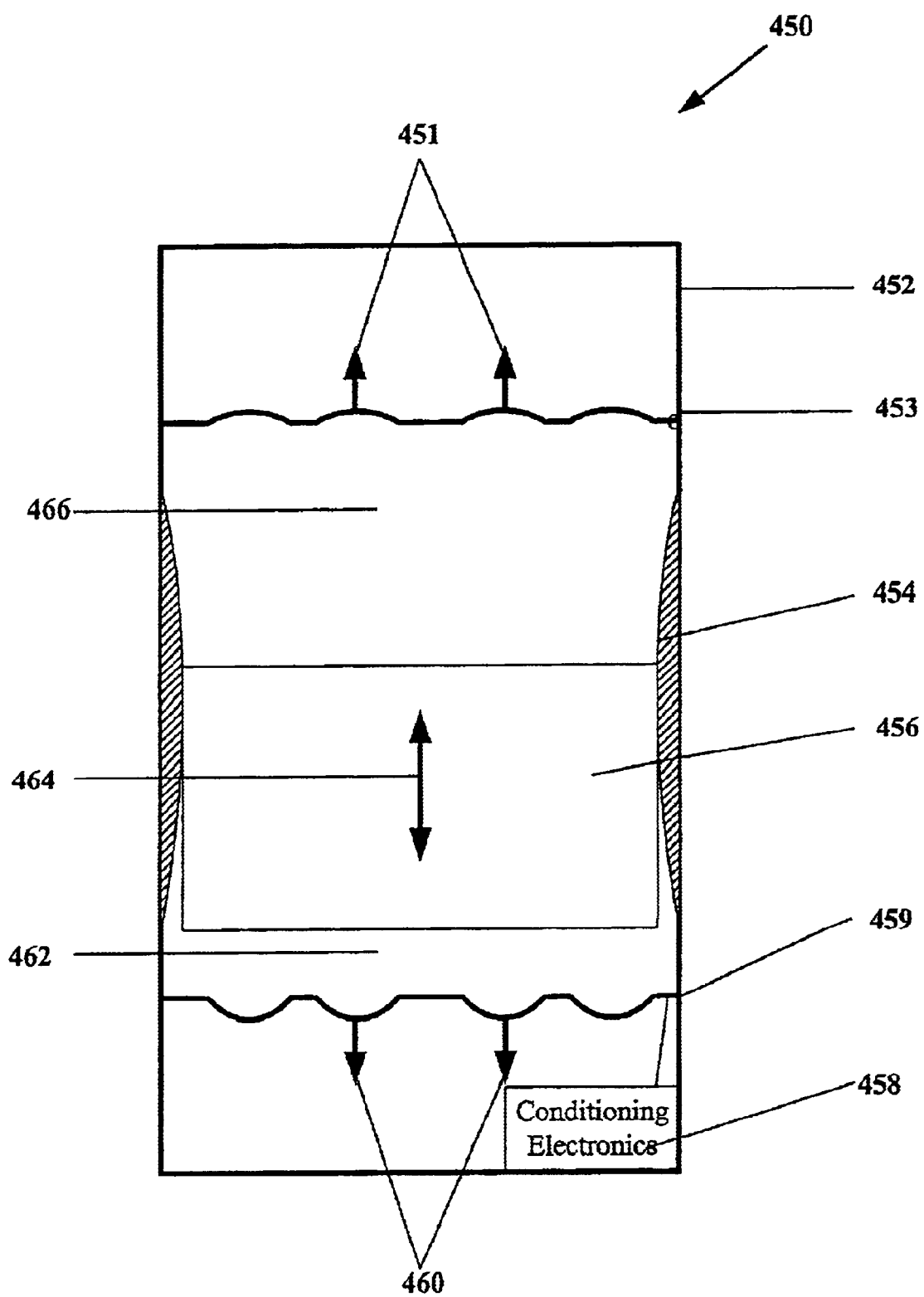
FIG. 8 is a side view of a self-charging battery for one embodiment of the present invention.

FIG. 3C is a side view of a transmission mechanism 480 in housing 494 that may transfer a portion of a direct force 495 to a monolithic polymer film 492 (See FIGS. 4C and 4D) using a mechanical fluid coupling mechanism. When the support member 493 receives the direct force 495, the support member moves in the direction of the force 495 and exerts a force on the fluid 491. The fluid 491 may be a substantially incompressible fluid such as water but is not limited to incompressible fluids and can even be a soft gel. The force is transferred to the monotholithic electroactive polymer film causing a plurality of portions of the film 492 to deflect. When the force 495 is decreased or removed, the portions of the film 492 may relax. A repeated application of the force 495 may cause the plurality of portions of film 492 to stretch and relax in a cyclic manner and a portion of the mechanical energy in the cycle generated from the repeated deflections of the film 492 may be converted to electrical energy. Mechanical-fluid coupling mechanisms may be applied to transfer direct forces, inertial forces or combinations thereof to electroactive polymer transducers of the present invention. In FIG. 8, a generator device employing a mechanical-fluid coupling mechanism to transfer an inertial force to EAP transducers of the present invention are described.

The transmission mechanisms are not limited to the examples described with reference to FIGS. 3A–3C. Any device that transfers a portion of a direct force or a portion of an inertial force to an EAP transducer for electrical energy harvesting may be used in the present invention. The transmission mechanisms may include simple as well as well as complex mechanical linkages utilizing a variety of rigid, flexible or combinations of rigid and flexible materials. In addition, a plurality of different fluid linkages may be used in combination with various mechanical linkages. For example, a fluid filled bladder may be combined with a variety of mechanical linkages to transfer mechanical energy.

3. General Structure of Electroactive Polymers

Figure 4A:
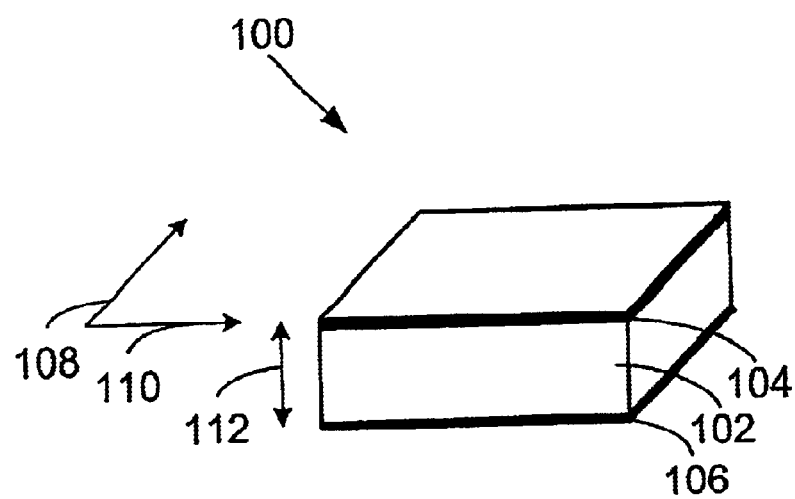
FIGS. 4A and 4B illustrate a top perspective view of a transducer before and after application of a voltage in accordance with one embodiment of the present invention.

The transformation between electrical and mechanical energy in devices of the present invention is based on energy conversion of one or more active areas of an electroactive polymer (EAP). Electroactive polymers deflect when actuated by electrical energy. To help illustrate the performance of an electroactive polymer in converting electrical energy to mechanical energy, FIG. 4A illustrates a top perspective view of a transducer portion 100 in accordance with one embodiment of the present invention. The transducer portion 100 comprises an electroactive polymer 102 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 104 and 106 are attached to the electroactive polymer 102 on its top and bottom surfaces, respectively, to provide a voltage difference across a portion of the polymer 102. Polymer 102 deflects with a change in electric field provided by the top and bottom electrodes 104 and 106. Deflection of the transducer portion 100 in response to a change in electric field provided by the electrodes 104 and 106 is referred to as actuation. As polymer 102 changes in size, the deflection may be used to produce mechanical work.

Figure 4B:
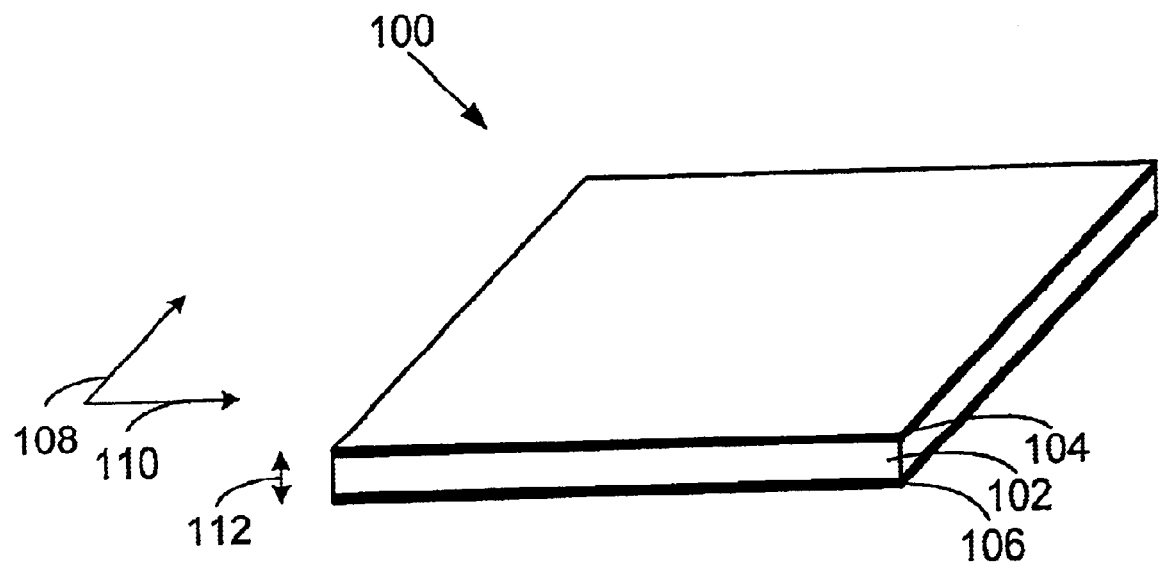

FIG. 4B illustrates a top perspective view of the transducer portion 100 including deflection in response to a change in electric field. In general, deflection refers to any displacement, expansion, contraction, torsion, linear or area strain, or any other deformation of a portion of the polymer 102. The change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 and an expansion force on polymer 102 in planar directions 108 and 110, causing polymer 102 to compress between electrodes 104 and 106 and stretch in the planar directions 108 and 110.

In some cases, electrodes 104 and 106 cover a limited portion of polymer 102 relative to the total area of the polymer. This may be done to prevent electrical breakdown around the edge of polymer 102 or to achieve customized deflections for one or more portions of the polymer. As the term is used herein, an active area is defined as a portion of a transducer comprising polymer material 102 and at least two electrodes. When the active area is used to convert electrical energy to mechanical energy, the active area includes a portion of polymer 102 having sufficient electrostatic force to enable deflection of the portion. When the active area is used to convert mechanical energy to electrical energy, the active area includes a portion of polymer 102 having sufficient deflection to enable a change in electrostatic energy. As will be described below, a polymer of the present invention may have multiple active areas. In some cases, polymer 102 material outside an active area may act as an external spring force on the active area during deflection. More specifically, polymer material outside the active area may resist active area deflection by its contraction or expansion. Removal of the voltage difference and the induced charge causes the reverse effects.

Electrodes 104 and 106 are compliant and change shape with polymer 102. The configuration of polymer 102 and electrodes 104 and 106 provides for increasing polymer 102 response with deflection. More specifically, as the transducer portion 100 deflects, compression of polymer 102 brings the opposite charges of electrodes 104 and 106 closer and the stretching of polymer 102 separates similar charges in each electrode. In one embodiment, one of the electrodes 104 and 106 is ground.

In general, the transducer portion 100 continues to deflect until mechanical forces balance the electrostatic forces driving the deflection. The mechanical forces include elastic restoring forces of the polymer 102 material, the compliance of electrodes 104 and 106, and any external resistance provided by a device and/or load coupled to the transducer portion 100, etc. The deflection of the transducer portion 100 as a result of the applied voltage may also depend on a number of other factors such as the polymer 102 dielectric constant and the size of polymer 102.

Electroactive polymers in accordance with the present invention are capable of deflection in any direction. After application of the voltage between electrodes 104 and 106, polymer 102 expands (stretches) in both planar directions 108 and 110. In some cases, polymer 102 is incompressible, e.g. has a substantially constant volume under stress. For an incompressible polymer 102, polymer 102 decreases in thickness as a result of the expansion in the planar directions 108 and 110. It should be noted that the present invention is not limited to incompressible polymers and deflection of the polymer 102 may not conform to such a simple relationship.

Application of a relatively large voltage difference between electrodes 104 and 106 on the transducer portion 100 shown in FIG. 4A will cause transducer portion 100 to change to a thinner, larger area shape as shown in FIG. 4B. In this manner, the transducer portion 100 converts electrical energy to mechanical energy. The transducer portion 100 may also be used to convert mechanical energy to electrical energy.

FIGS. 4A and 4B may be used to show one manner in which the transducer portion 100 converts mechanical energy to electrical energy. For example, if the transducer portion 100 is mechanically stretched by external forces to a thinner, larger area shape such as that shown in FIG. 4B, and a relatively small voltage difference (less than that necessary to actuate the film to the configuration in FIG. 4B) is applied between electrodes 104 and 106, the transducer portion 100 will contract in area between the electrodes to a shape such as in FIG. 4A when the external forces are removed. Stretching the transducer refers to deflecting the transducer from its original resting position—typically to result in a larger net area between the electrodes, e.g. in the plane defined by directions 108 and 110 between the electrodes. The resting position refers to the position of the transducer portion 100 having no external electrical or mechanical input and may comprise any pre-strain in the polymer. Once the transducer portion 100 is stretched, the relatively small voltage difference is provided such that the resulting electrostatic forces are insufficient to balance the elastic restoring forces of the stretch. The transducer portion 100 therefore contracts, and it becomes thicker and has a smaller planar area in the plane defined by directions 108 and 110 (orthogonal to the thickness between electrodes). When polymer 102 becomes thicker, it separates electrodes 104 and 106 and their corresponding unlike charges, thus raising the electrical energy and voltage of the charge. Further, when electrodes 104 and 106 contract to a smaller area, like charges within each electrode compress, also raising the electrical energy and voltage of the charge. Thus, with different charges on electrodes 104 and 106, contraction from a shape such as that shown in FIG. 4B to one such as that shown in FIG. 4A raises the electrical energy of the charge. That is, mechanical deflection is being turned into electrical energy and the transducer portion 100 is acting as a generator.

In some cases, the transducer portion 100 may be described electrically as a variable capacitor. The capacitance decreases for the shape change going from that shown in FIG. 4B to that shown in FIG. 4A. Typically, the voltage difference between electrodes 104 and 106 will be raised by contraction. This is normally the case, for example, if additional charge is not added or subtracted from electrodes 104 and 106 during the contraction process. The increase in electrical energy, U, may be illustrated by the formula $U=0.5$ $Q^2/C$, where Q is the amount of positive charge on the positive electrode and C is the variable capacitance which relates to the intrinsic dielectric properties of polymer 102 and its geometry. If Q is fixed and C decreases, then the electrical energy U increases. The increase in electrical energy and voltage can be recovered or used in a suitable device or electronic circuit in electrical communication with electrodes 104 and 106. In addition, the transducer portion 100 may be mechanically coupled to a mechanical input that deflects the polymer and provides mechanical energy.

The transducer portion 100 will convert mechanical energy to electrical energy when it contracts. Some or all of the charge and energy can be removed when the transducer portion 100 is fully contracted in the plane defined by directions 108 and 110. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 100 when operating as a generator depends on any electrical and mechanical loading as well as the intrinsic properties of polymer 102 and electrodes 104 and 106.

In one embodiment, electroactive polymer 102 is pre-strained. Pre-strain of a polymer may be described, in one or more directions, as the change in dimension in a direction after pre-straining relative to the dimension in that direction before pre-straining. The pre-strain may comprise elastic deformation of polymer 102 and be formed, for example, by stretching the polymer in tension and fixing one or more of the edges while stretched. For many polymers, pre-strain improves conversion between electrical and mechanical energy. The improved mechanical response enables greater mechanical work for an electroactive polymer, e.g., larger deflections and actuation pressures. In one embodiment, pre-strain improves the dielectric strength of the polymer. In another embodiment, the pre-strain is elastic. After actuation, an elastically pre-strained polymer could, in principle, be unfixed and return to its original state. The pre-strain may be imposed at the boundaries using a rigid frame or may also be implemented locally for a portion of the polymer.

In one embodiment, pre-strain is applied uniformly over a portion of polymer 102 to produce an isotropic pre-strained polymer. By way of example, an acrylic elastomeric polymer may be stretched by 200 to 400 percent in both planar directions. In another embodiment, pre-strain is applied unequally in different directions for a portion of polymer 102 to produce an anisotropic pre-strained polymer. In this case, polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 108 of transducer portion 100 can be enhanced by exploiting large pre-strain in the perpendicular direction 110. For example, an acrylic elastomeric polymer used as the transducer portion 100 may be stretched by 100 percent in direction 108 and by 500 percent in the perpendicular direction 110. The quantity of pre-strain for a polymer may be based on the polymer material and the desired performance of the polymer in an application. Pre-strain suitable for use with the present invention is further described in commonly owned, copending U.S. patent application Ser. No. 09/619,848, which is incorporated by reference for all purposes.

Anisotropic prestrain may also improve the performance of a transducer to convert mechanical to electrical energy in a generator mode. In addition to increasing the dielectric breakdown strength of the polymer and allowing more charge to be placed on the polymer, high pre-strain may improve mechanical to electrical coupling in the low pre-strain direction. That is, more of the mechanical input into the low pre-strain direction can be converted to electrical output, thus raising the efficiency of the generator.

The quantity of pre-strain for a polymer may be based on the electroactive polymer and the desired performance of the polymer in an actuator or application. For some polymers of the present invention, pre-strain in one or more directions may range from −100 percent to 600 percent. By way of example, for a VHB acrylic elastomer having isotropic pre-strain, pre-strains of at least about 100 percent, and preferably between about 200–400 percent, may be used in each direction. In one embodiment, the polymer is pre-strained by a factor in the range of about 1.5 times to 50 times the original area. For an anisotropic acrylic pre-strained to enhance actuation in a compliant direction, pre-strains between about 400–500 percent may be used in the stiffened direction and pre-strains between about 20–200 percent may be used in the compliant direction. In some cases, pre-strain may be added in one direction such that a negative pre-strain occurs in another direction, e.g. 600 percent in one direction coupled with −100 percent in an orthogonal direction. In these cases, the net change in area due to the pre-strain is typically positive.

Pre-strain may affect other properties of the polymer 102. Large pre-strains may change the elastic properties of the polymer and bring it into a stiffer regime with lower viscoelastic losses. For some polymers, pre-strain increases the electrical breakdown strength of the polymer 102, which allows for higher electric fields to be used within the polymer—permitting higher actuation pressures and higher deflections.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. In one embodiment, the maximum area strain is at least about 5%. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least about 100 percent are possible for pre-strained polymers of the present invention. For some pre-strained polymers, maximum area strains in the range of 70 to 330 percent are common. In one embodiment, the maximum elastic area strain is at least about 10%.

Generally, after the polymer is pre-strained, it may be fixed to one or more objects. Each object may be suitably stiff to maintain the level of pre-strain desired in the polymer. The polymer may be fixed to the one or more objects according to any conventional method known in the art such as a chemical adhesive, an adhesive layer or material, mechanical attachment, etc.

Transducers and pre-strained polymers of the present invention are not limited to any particular geometry or linear deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated. In another embodiment, a transducer that deflects out of the plane is referred to as a diaphragm.

Generally, after the polymer is pre-strained, it may be fixed to one or more objects. Each object is preferably suitably stiff to maintain the level of pre-strain desired in the polymer. The polymer may be fixed to the one or more objects according to any conventional method known in the art such as a chemical adhesive, an adhesive layer or material, mechanical attachment, etc. Transducers and pre-strained polymers of the present invention are not limited to any particular geometry or type of deflection. For example, the polymer and electrodes may be formed into any geometry or shape including tubes and rolls, stretched polymers attached between multiple rigid structures, stretched polymers attached across a frame of any geometry—including curved or complex geometry's, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated.

Generally, polymers that are suitable for use with transducers of this invention include any substantially insulating polymer or rubber (or combination thereof) that deforms in response to an electrostatic force or whose deformation results in a change in electric field. Preferably, the polymer's deformation is reversible over a wide range of strains. Many elastomeric polymers may serve this purpose. In designing or choosing an appropriate polymer, one should consider the optimal material, physical, and chemical properties. Such properties can be tailored by judicious selection of monomer (including any side chains), additives, degree of cross-linking, crystallinity, molecular weight, etc.

The transducer polymers of this invention may assume many different physical and chemical states. For example, they may be used with or without additives such as plasticizers. And they may be monolithic polymeric sheets or combinations of polymers such as laminates or patchworks. Further, the polymers may exist in a single phase or multiple phases. One example of a multiphase material is a polymeric matrix having inorganic filler particles admixed therewith.

Regardless of the ultimate chemical and physical state of the transducer polymer, it will include a polymer matrix. That matrix be a homopolymer or copolymer, cross-linked or uncross-linked, linear or branched, etc. Exemplary classes of polymer suitable for use with transducers of this invention include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Obviously, combinations of some of these materials may be used as the polymer matrix in transducers of this invention. Copolymers and blends fall within the class of suitable polymers. One example is a blend of a silicone elastomer and an acrylic elastomer.

Obviously, the properties of the polymer are dictated in large measure by the monomers used to produce the polymer. Each polymer type (e.g., acrylic, stryene, silicone, urethane, etc.) has its own class of well-known monomers. In some embodiments, polymers suitable for use with the present invention may be made from monoethylenically unsaturated monomers (or combination of monomers) homopolymerizable to form a polymer. Preferred monoethylenically unsaturated monomers include isooctyl acrylate, acrylonitrile, 2-ethylhexyl acrylate, decyl acrylate, dodecyl acrylate, hexyl acrylate, isononyl acrylate, isooctyl methacrylate, and 2-ethylhexyl methacrylate. Any of these monomers may be halogenated with one or more halogens such as fluorine.)

Various classes of catalysts that may be employed for polymer fabrication depending upon the desired state of the resulting polymer. Examples include selective early transition metal single site catalysts and late transition metal catalysts that are non-selective with respect to polymer structure.

The range of possible polymers greatly increases when copolymers are considered. One widely used copolymer that is suitable for some embodiments of this invention is the thermoplastic elastomer styrene butadiene styrene (SBS) block copolymer. Another suitable copolymer includes both silicone and acrylic elastomer moieties. Yet another may include acrylic moieties, silicone moieties, and styrene/butadiene moieties. One specific preferred copolymer block contains acrylic acid and isooctyl acrylate. Another specific copolymer comprises acrylonitrile, acrylic acid, and isooctyl acrylate. Still another comprises these three acrylic components in one chain cross-linked to a separate silicone chain. Many other possibilities exist.

The molar ratio of the copolymer component moieties can be adjusted to obtain desirable results. In a preferred copolymer of isooctyl acrylate and acrylic acid, a predominance of the isooctyl acrylate is generally preferred. In one specific embodiment, the molar ratio is roughly 85/15 isooctyl acrylate to acrylic acid.

Crosslinking can sometimes be used to great advantage. Specifically, by controlling the nature of the cross-links (physical versus chemical) and their density, one can obtain desired elastic and thermal properties. Chemical cross-links are manifest by as covalent bonds. These may be produced by hydrogen abstraction or use of polyfunctional monomers, for example. Physical cross-links are obtained by aggregations of rigid groups such phenyl moieties in styrene.

The appropriate choice of a polymer side chain can provide tailored physical and material properties. In specific examples, side groups of a polymer backbone are modified to enable greater charge accumulation in bulk. This can be accomplished by modifying the side groups with lithium ions and/or transition metal organic ligand complexes, for example. Alternatively or in addition, side groups can be added to increase the polymer's dielectric constant. In one example, cyano groups serve this purpose. Such groups may be provided in the form of various phenyl nitrile groups for example. In another embodiment, conjugated oligomers in side chains or chain segments are added to increase polarizability and dielectric strength.

In many cases, materials used in accordance with the present invention are commercially available polymers. Such polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may also simplify fabrication. In a specific embodiment, the commercially available polymer is a commercially available acrylic elastomer comprising a mixture of aliphatic acrylates that are photocured during fabrication.

One suitable commercially available polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Electroactive polymers of the present invention may also include one or more additives to improve their various physical and chemical properties. Examples of suitable classes of materials include plasticizers, antioxidants, and high dielectric constant particulates. Examples of properties that can be controlled/modified by additives include adhesion and the ability of the polymer to convert between mechanical energy and electrical energy. Polymer material properties and parameters related to the ability of the polymer to convert between mechanical energy and electrical energy include, for example, the dielectric breakdown strength, maximum strain, dielectric constant, elastic modulus, properties associated with the visco-elastic performance, properties associated with creep, response time and actuation voltage.

Improving the dielectric breakdown strength allows the use of larger electrically actuated strains for the polymer. By way of example, a plasticizing additive may be added to a polymer to increase the dielectric breakdown strength of the polymer. Alternatively, certain synthetic resins may be added for this purpose. For example, a styrene-butadiene-styrene block copolymer may be added to improve the dielectric breakdown strength of certain polymers. In one example, pentalyn-H as produced by Hercules, Inc. of Wilmington, Del. was added to Kraton D2104 as produced by Shell Chemical of Houston, Tex. to improve the dielectric breakdown strength of the Kraton D2104. In this specific example, the ratio of pentalyn-H added may range from about 0 to 2:1 by weight. In another approach, dielectric breakdown strength may be increased by adding electron trapping groups such as $SF_6$ to increase breakdown electric field.

Additives that increase the dielectric constant of a polymer include, for example, high dielectric constant particulates such as fine ceramic powders (e.g., barium titanate, strontium titanate, and titanium dioxide). Alternatively, polymers such as polyurethane may be partially fluorinated to increase the dielectric constant. Still further, layers of highly polarizable or high modulus materials such as conjugated polymers, graphite, carbon fibers, and carbon nanotubes may be added for this purpose.

An additive may be included in a polymer for the purpose of reducing elastic modulus. Reducing the elastic modulus enables larger strains for the polymer. In a specific embodiment, mineral oil is added to a solution of Kraton D to reduce the elastic modulus of the polymer. In this case, the ratio of mineral oil added may range from about 0 to 2:1 by weight, for example. Specific materials included to reduce the elastic modulus of an acrylic polymer of the present invention include any acrylic acids, acrylic adhesives, acrylics including flexible side groups such as isooctyl groups and 2-ethylhexyl groups, or any copolymer of acrylic acid and isooctyl acrylate.

As mentioned, plasticizers are often added to polymers. In the context of this invention, the addition of a plasticizer may, for example, improve the functioning of a transducer of this invention by reducing the elastic modulus of the polymer and/or increasing the dielectric breakdown strength of the polymer. Examples of suitable plasticizers include high molecular-weight hydrocarbon oils, high molecular-weight hydrocarbon greases, Pentalyne H, Piccovar® AP Hydrocarbon Resins, Admex 760, Plastolein 9720, silicone oils, silicone greases, Floral 105, silicone elastomers, nonionic surfactants, and the like. Of course, combinations of these materials may be used.

Finally, multiple additives may be included in a polymer to improve one or more materials properties. In one embodiment, it was found that addition of both mineral oil and pentalyn-H to a solution of Kraton D2104 to increase the dielectric breakdown strength and to reduce the elastic modulus of the polymer. Note that pentalyn-H may also improve the adhesion of Kraton D2104.

A second additive can also be added to overcome a problem introduced by a first additive. For example, for a commercially available silicone rubber whose stiffness has been increased by fine carbon particles added to increase the dielectric constant, the stiffness may be reduced by the addition of a carbon or silver filled silicone grease. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to 200 percent.

An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

Suitable actuation voltages for electroactive polymers, or portions thereof, may vary based on the material properties of the electroactive polymer, such as the dielectric constant, as well as the dimensions of the polymer, such as the thickness of the polymer film For example, actuation electric fields used to actuate polymer 102 in FIG. 4A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example. In some embodiments, the modulus of elasticity for the polymer may be less than about 100 Mpa.

Transducers for converting between mechanical and electrical energy of the present invention also encompass multilayer laminates. In one embodiment, a multilayer laminate refers to a structure including one or more layers in addition to a single electroactive polymer and its corresponding electrodes. In one embodiment, a multilayer laminate refers to a structure having a transducer including an electroactive polymer and its corresponding electrodes, a layer laminated to at least one of the electrode and the polymer, and the layer mechanically coupled to a portion of the transducer. Multilayer laminates may be referred to as either external or internal. For external multilayer laminates, the one or more additional layers are not between the electrodes. For internal multilayer laminates, the one or more additional layers are between the electrodes. For either external or internal layers, the layers may be adhered using an adhesive or glue layer, for example.

Internal multilayer laminates may be used for a wide variety of purposes. A layer may also be included in an internal multilayer laminate to improve any mechanical or electrical property of the transducer, e.g., stiffness, electrical resistance, tear resistance, etc. Internal multilayer laminates may include a layer having a greater dielectric breakdown strength. Internal multilayer laminates may include multiple layers of compatible materials separated by conducting or semiconducting layers (e.g. metallic or polymer layers) to increase breakdown strength of the laminate transducer. Compatible materials refer to materials that comprise the same or substantially similar material or have the same or substantially similar properties (e.g. mechanical and/or electrical). Internal laminates of compatible materials relative to the polymer may be used to compensate for manufacturing defects in the polymer and provide greater transducer uniformity. By way of example, a 100 micrometer thick, single layer polymer may have a defect that may effect the entire 100 micrometer thickness. In this case, a laminate of ten layers each having a thickness of 10 micrometers may be used such that any manufacturing defects are localized to a 10 micrometer polymer—thus providing a comparable 100 micrometer thick laminate structure, but with greater uniformity and fault tolerance compared to the single layer polymer. Internal laminates of compatible materials relative to the polymer may also be used to prevent any runaway pull-in effect. Runaway pull-in effect refers to when the electrostatic forces between electrodes getting closer increases faster than the elastic resistive forces of the polymer. In such cases, the transducer may become electromechanically unstable, leading to rapid local thinning and electrical breakdown. An internal layer may also be used to afford a layer of protection (electrical or mechanical) to another layer in the composite. In one embodiment, an electrical barrier layer is mechanically coupled between an electrode and the polymer to minimize the effect of any localized breakdown in the polymer. Breakdown may be defined as the point at which the polymer cannot sustain the applied voltage. The barrier layer is typically thinner than the polymer and has a higher dielectric constant than the polymer such that the voltage drop mainly occurs across the polymer. It is often preferable that the barrier layer have a high dielectric breakdown strength.

External multilayer laminates may be used for a wide variety of purposes. In one embodiment, an external multilayer composite includes a layer to control stiffness, creep, to distribute load more uniformly during deflection, to increase tear resistance, or to prevent runaway pull effect. External laminates of compatible polymers including electrodes may be used to distribute load across each of the polymer layers or increase polymer uniformity during deflection. A layer may also be included in an external laminate having a higher stiffness than the polymer, e.g., a material having a higher stiffness or a different amount of pre-strain for a compatible material, to bias a diaphragm, pump or bending beam. In a generator mode, a stretched transducer may contract and generate electrical energy as long as the electrical field stresses are lower than the elastic restoring stresses. In this case, adding a stiffening layer may allow the transducer to contract against greater field stresses, thereby increasing its energy output per stroke. An external layer may also be used to afford a layer of protection (electrical or mechanical) to another layer in the composite. In another specific embodiment, an external composite includes a foam layer to bias a small pump or diaphragm. The foam layer may comprise an open pore foam that allows fluids to move in and out of the foam. An external layer having a low stiffness may also be used for electric shielding without introducing excessive mechanical energy loss.

In one embodiment, a composite is formed by rolling or folding a polymer to produce a transducer with high-density packaging. In order to avoid detrimental electric fields in the vicinity of folds for laminates including folded layers, electrodes may be patterned on the polymer such that any polymer in the vicinity of the folds does not have overlapping opposite electrodes. In addition, the polymer and electrodes may be rolled or folded such that the outer exposed electrode or electrodes have the same polarity. Fabrication may be performed such that electrodes of opposite polarity are separate by polymer. For example, a rolled actuator can be made by rolling up two layers of polymer with electrodes, or a single layer can be first folded, then rolled. Additionally, the outer exposed electrode may be grounded to increase safety of the transducer. An external laminate outer skin layer may also be added to further increase safety.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry. Several examples of electrodes that only cover a portion of an electroactive polymer will be described in further detail below.

Various types of electrodes suitable for use with the present invention are described in commonly owned, copending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. By way of example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Electronic drivers are typically connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

4. Multiple Active Areas

Figure 4C:
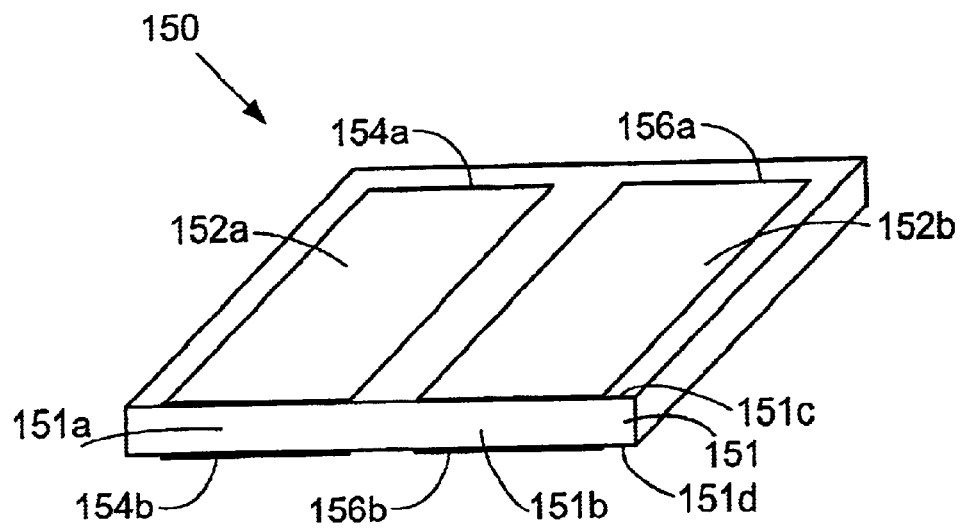
FIG. 4C illustrates a monolithic transducer comprising a plurality of active areas in accordance with one embodiment of the present invention.

In accordance with the present invention, the term "monolithic" is used herein to refer to electroactive polymers, transducers, and devices comprising a plurality of active areas. FIG. 4C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 having two active areas 152a and 152b. Polymer 151 may be held in place using, for example, a rigid frame (not shown) attached at the edges of the polymer.

The active area 152a has top and bottom electrodes 154a and 154b that are attached to polymer 151 on its top and bottom surfaces 151c and 151d, respectively. The electrodes 154a and 154b provide a voltage difference across a portion 151a of the polymer 151. The portion 151a deflects with a change in electric field provided by the electrodes 154a and 154b. The portion 151a comprises the polymer 151 between the electrodes 154a and 154b and any other portions of the polymer 151 having sufficient electrostatic force to enable deflection upon application of voltages using the electrodes 154a and 154b. When the device 150 is used as a generator to convert from electrical energy to mechanical energy, deflection of the portion 151a causes a change in electric field in the portion 151a that is received as a change in voltage difference by the electrodes 154a and 154b.

The active area 152b has top and bottom electrodes 156a and 156b that are attached to the polymer 151 on its top and bottom surfaces 151c and 151d, respectively. The electrodes 156a and 156b provide a voltage difference across a portion 151b of the polymer 151. The portion 151b deflects with a change in electric field provided by the electrodes 156a and 156b. The portion 151b comprises the polymer 151 between the electrodes 156a and 156b and any other portions of the polymer 151 having sufficient stress induced by the electrostatic force to enable deflection upon application of voltages using the electrodes 156a and 156b. When the device 150 is used as a generator to convert from electrical energy to mechanical energy, deflection of the portion 151b causes a change in electric field in the portion 151b that is received as a change in voltage difference by the electrodes 156a and 156b.

The active areas for monolithic polymers and transducers of the present invention may be flexibly arranged. In one embodiment, active areas in a polymer are arranged such that the elasticity of the active areas is balanced. In another embodiment, a transducer of the present invention comprises a plurality of symmetrically arranged active areas. While one embodiment of present invention will now be described as a device, those skilled in the art will recognize that the present invention encompasses methods having as steps the actions performed by various parts of the device described below.

Figure 4D:
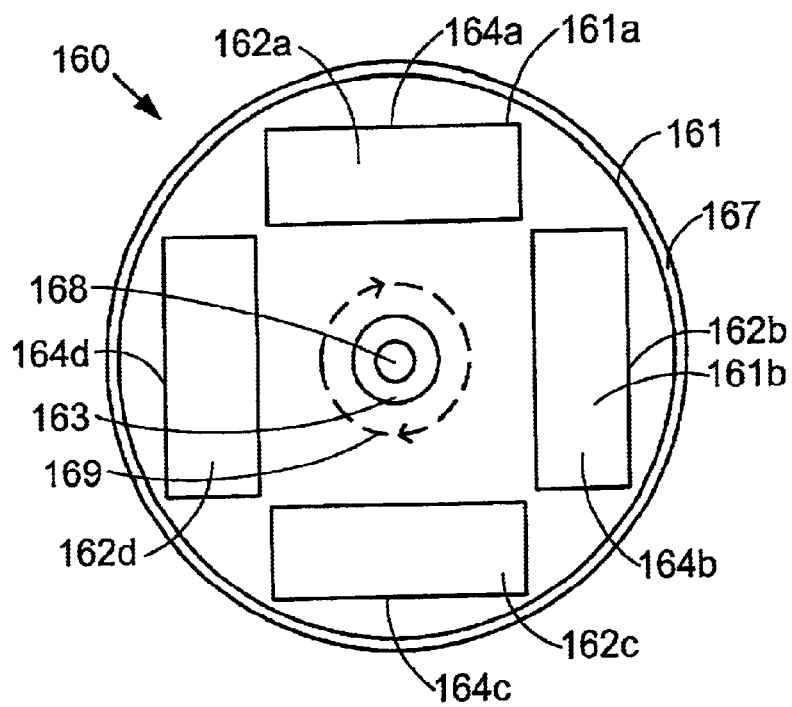
FIG. 4D illustrates a device comprising a plurality of symmetrically arranged electrodes in accordance with a specific embodiment of the present invention.

FIG. 4D illustrates a monolithic device 160 comprising a plurality of symmetrically arranged active areas in accordance with a specific embodiment of the present invention. The device 160 comprises a monolithic transducer comprising four active areas 162a–d. Each of the active areas 162a–d comprises top and bottom electrodes 164a–d attached to a polymer 161 on its top and bottom surfaces, respectively (only electrodes 164a–d on the facing surface of the polymer 161 are illustrated). The electrodes 164a–d each provide a voltage difference across a portion of the polymer 161. The electrodes 164a–d and their corresponding active areas 162a–d are symmetrically and radially arranged around a center point of the circular polymer 161. Correspondingly, the elasticity of the polymer material included in the active areas 162a–d is balanced.

A first active area 162a is formed with the two first active area electrodes 164a and a first portion of the electroactive polymer 161a. The portion 161a is arranged in a manner which causes the first portion 161a to deflect in response to a change in electric field provided by the first active area electrodes 164a. The portion 161a includes the polymer 161 between the electrodes 162a and any other portions of the polymer 161 having sufficient stresses induced by the electrostatic force to enable deflection upon application of voltages using the electrodes 162a. Similarly, a second active area 162c is formed with the two second active area electrodes 164c and a second portion of the electroactive polymer 161c. The portion 161c is arranged in a manner which causes the second portion 161c to deflect in response to a change in electric field provided by the at least two second active area electrodes 164c. A similar arrangement applies to the active areas 162b and 162d.

A substantially rigid frame 167 is fixed to the perimeter of the circular polymer 161 by using an adhesive. A substantially rigid member 168 is attached to a central portion 163 of polymer 161 and allows mechanical output for device 160. Rigid member 168 provides mechanical output for device 160 based on deflection of the central portion 163 relative to the rigid frame 167. The central portion 163 is located at least partially between active area 162a and active area 162c and at least partially between active area 162b and active area 162d. Although central portion 163 is illustrated as a centrally located circle, it should be understood that central portion 163 may be any portion of polymer 161 between the active areas 162a–d. Thus, rigid member 168 may be attached to polymer 161 in any part of polymer 161 between the active areas 162a–d and transfer deflection of that portion as mechanical output of device 160.

The present invention also includes methods for deflecting one or more electroactive polymers having a plurality of active areas. These methods comprise deflection as a result of electrical energy input (actuation) to the polymer and electrical energy output from the polymer (generation). Methods for using a monolithic transducer as an actuator generally comprise providing a change in electric field with two first active area electrodes to deflect a first portion of the monolithic transducer; and providing a change in electric field with two second active area electrodes to deflect a second portion of the monolithic transducer. Other active areas may be used in the monolithic transducer. In one embodiment, active areas on one or more electroactive polymers are sequentially actuated, either individually or cumulatively, to produce a desired deflection of a portion of the polymer. In a specific embodiment, the active areas on a monolithic polymer may be actuated sequentially to move a portion of the polymer along a path.

For example, the active areas 162a–d may be actuated sequentially to move the central portion 163 along a circular path 169. Actuation of the active area 162a moves the central portion 163 down. Actuation of the active area 162b moves the central portion 163 to the left. Actuation of the active area 162c moves the central portion 163 up. Actuation of the active area 162d moves the central portion 163 to the right. When electrical energy is removed from the electrodes 164a, the central portion 163 elastically returns up to its position before actuation of the active area 162a. A similar elastic return occurs for the other active areas 164b–d. To achieve the circular path 169, the active areas 162a–d are actuated sequentially in clockwise order and in a timely manner. More specifically, electrical energy is supplied to the electrodes 164b while the active area 162a contracts. Electrical energy is supplied to the electrodes 164c while the active area 162b contracts.

A similar timing is applied in actuating the other active areas to produce the circular path 169. This sequential clockwise actuation may be repeatedly performed to continuously move the central portion 163 in the circular path 169. Continuous circular output of the central portion 163 may be used to drive a motor. In a specific embodiment, rigid member 168 may be used as a crank in a rotary crank motor. In another specific embodiment, rigid member 168 may be a plate with bearings to allow the plate to move in both planar directions of the plate. The monolithic device 160 then functions as an x-y (two degree-of-freedom) translation table.

The monolithic transducers 150 and 160 illustrated and described herein comprise active areas with similar geometry's and symmetrical configurations. It is understood that monolithic polymers of the present invention may comprise one or more active areas each having a non-symmetrical and custom geometry. It is also understood that active areas on a monolithic polymer may be combined in any configuration. These custom geometry active areas and configurations may be used to produce any custom two-dimensional path or output for a portion of a polymer. In another embodiment, the two-dimensional path illustrated above may be achieved with only two active areas without the use of expanding and relaxing pairs as described above. In this case, actuation of one active area and its corresponding elastic return may be used to provide controlled deflection along one linear dimension. Actuation of the other active area and its corresponding elastic return may be used to provide controlled deflection in an orthogonal linear dimension.

Monolithic transducers and devices are not limited to planar deflections. In a specific embodiment, monolithic transducers may be used to deflect and control out-of-plane motion. For example, actuating all four active areas 162a–d at the same time typically will not change the planar position of the centrally attached rigid member 168, but it will reduce the forces from polymer 161 which tend to hold rigid member 168 in the plane of the film. Thus, if rigid member 168 is suitably loaded by an out-of-plane force, such as a spring or gravity, actuating all four active areas 162a–d at once will cause rigid member 168 to move further out of the plane in the direction of the out-of-plane force. By controlling the amount of energizing (e.g. controlling the voltage) on each of the active areas 162a–d, one can thus control the position of a suitably loaded rigid member 168 in three translational degrees-of-freedom.

5. Actuator and Generator Devices

The deflection of an electroactive polymer can be used in a variety of ways to produce or receive mechanical energy. Generally, monolithic electroactive polymers of the present invention may be implemented in a variety of actuators and generators—including conventional actuators and generators retrofitted with a monolithic polymer and custom actuators and generators specially designed for one or more monolithic polymers. Conventional actuators and generators include extenders, bending beams, stacks, diaphragms, etc. Several exemplary actuators and generators suitable for use with the present invention will now be discussed. Additional actuators suitable for use with various embodiments of the present invention are described in copending U.S. patent application Ser. No. 09/619,848, which was incorporated by reference above.

Figure 5A:
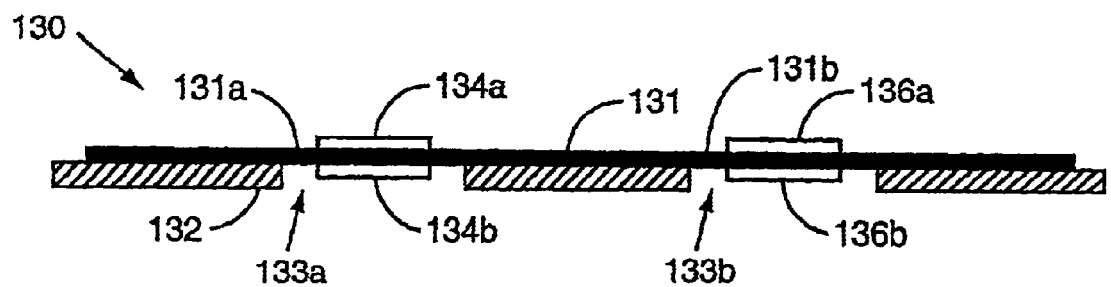
FIGS. 5A and 5B illustrate a device comprising a monolithic transducer for converting between electrical energy and mechanical energy in accordance with another embodiment of the present invention.

FIG. 5A illustrates a cross-sectional side view of a monolithic diaphragm device 130 comprising a monolithic polymer 131 before deflection in accordance with one embodiment of the present invention. The polymer 131 is attached to a frame 132. The frame 132 includes apertures 133a and 133b that allow deflection of polymer portions 131a and 131b perpendicular to the area of the apertures 133a and 133b, respectively. The diaphragm device 130 comprises electrodes 134a and 134b attached on either side Of the portion 131a to provide a voltage difference across the portion 131a. Electrodes 136a and 136b are deposited on either side of the portion 131b to provide a voltage difference across the portion 131b. Electrodes 134a–b and 136a–b can be routed to different portions of the polymer 131 for connection to external electronics. In some embodiments the external electronics can be connected directly to the electrodes 134a–b and 136a–b. In other embodiments, various other connection methods can be used. In one preferred embodiment, for example, the electrodes are routed to separate areas on frame 132 away from apertures 133a–b. A second frame, not shown in FIG. 5, is then screwed into frame 132 through screw holes, not shown in FIG. 5, in frame 132. The screws puncture the polymer 131 and one or more of the electrodes 134a–b and 136a–b (depending on the desired connection configuration), and in the puncturing process make electrical connections to the electrodes 134a–b and 136a–b. The screws can then be used for external electrical connections. In one preferred embodiment, a thin piece of brass (or a conductive polymer tape) is included in the connection area lying flat on the polymer 131 with a hole slightly smaller than the screws. In this case, the screw makes connection with the brass and the brass touches the appropriate electrode. The electrodes 134 and 136 are compliant and change shape with polymer 131 as it deflects. In the voltage-off configuration of FIG. 5A, polymer 131 is stretched and secured to frame 132 with tension to achieve pre-strain.

Figure 5B:
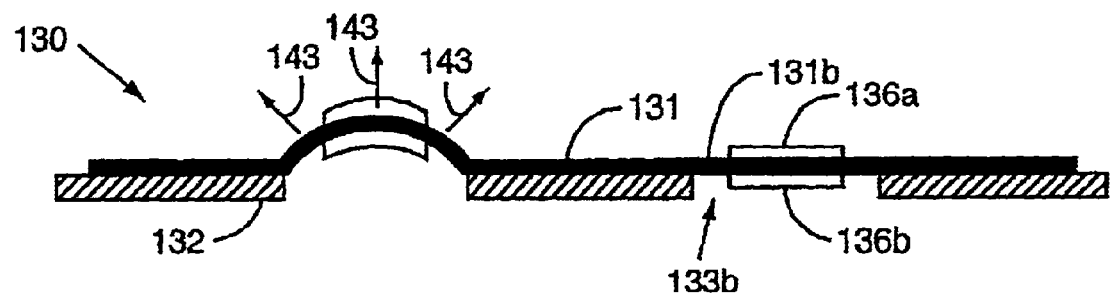

Using electrodes 134 and 136, portions 131a and 131b are capable of independent deflection. For example, upon application of a suitable voltage between electrodes 134a and 134b, portion 131a expands away from the plane of the frame 132, as illustrated in FIG. 5B. Each of the portions 131a and 131b is capable of expansion in both perpendicular directions away from the plane. In one embodiment, one side of polymer 131 comprises a bias pressure that influences the expansion of the polymer film 131 to continually actuate upward in the direction of arrows 143 (FIG. 5B). In another embodiment, a swelling agent such as a small amount of silicone oil is applied to the bottom side to influence the expansion of polymer 131 in the direction of arrows 143. The swelling agent allows the diaphragm to continually actuate in a desired direction without using a bias pressure. The swelling agent causes slight permanent deflection in one direction as determined during fabrication, e.g. by supplying a slight pressure to the bottom side when the swelling agent is applied.

The diaphragm device 130 may be used as a generator. In this case, a pressure, such as a fluid pressure, acts as mechanical input to the diaphragm device 130 on one side to stretch polymer 131 in the vicinity of apertures 133a and 133b. After the stretch, a voltage difference is applied between electrodes 134 while portions 131a is stretched. The resulting change in electric field provided to electrodes 134 is less than the electric field needed to further deflect polymer 131a. Similarly, a voltage difference is applied between electrodes 136 while portion 131b is stretched. Releasing the pressure allows portions 131a and 131b to contract and increase the stored electrical energy on electrodes 134 and 136.

Although the monolithic diaphragm device 130 is illustrated and described with only two apertures that allow deflection of polymer portions perpendicular to the area of the apertures, it is understood the monolithic diaphragm device 130 may include a large number of apertures in any two dimensional array. Generally, an array for a monolithic polymer refers to a plurality of active areas on a single polymer arranged in any manner, number of configuration. For example, the diaphragm device 130 may include an array of 36 active areas arranged in a 6×6 grid. Alternatively, the array on a monolithic polymer may include a combination of custom geometry active areas. For instance, the geometry of the active areas may circular or slot shaped. However, many such shapes are possible with diaphragms of the present invention and the shape is not limited to circular or slot shaped diaphragms. These separate active areas may or may not interact mechanically or electrically with each other. In one embodiment, at least two active areas in the array are capable of independent electrical communication and control.

Figure 5D:
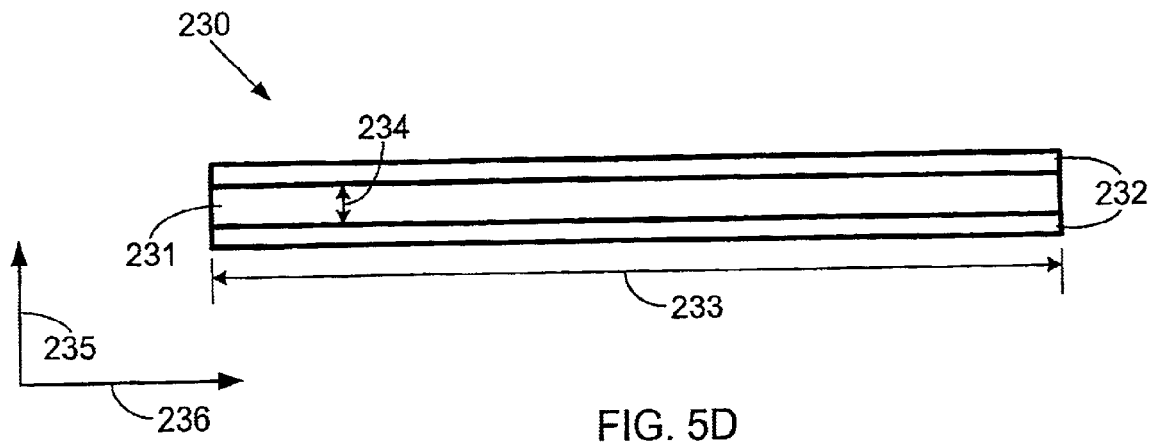
FIGS. 5D and 5E illustrate a device for converting between electrical energy and mechanical energy before and after actuation in accordance with a specific embodiment of the present invention.
Figure 5E:
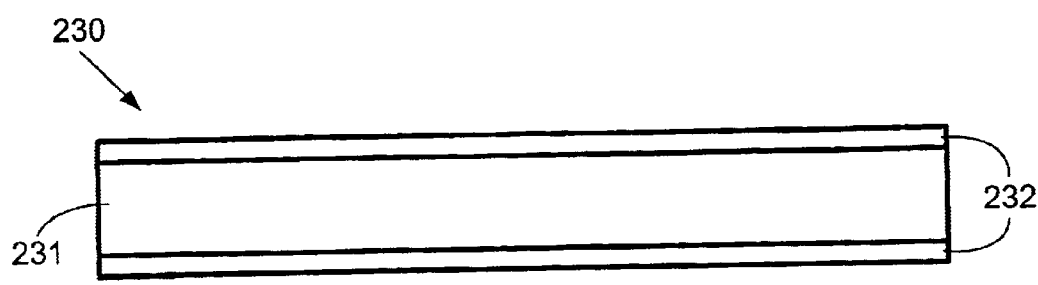

FIGS. 5D and 5E illustrate a linear motion device 230 for converting between electrical energy and mechanical energy before and after actuation in accordance with a specific embodiment of the present invention. The linear motion device 230 is a planar mechanism having mechanical translation in one direction. The linear motion device 230 comprises a polymer 231 having a length 233 substantially greater than its width 234 (e.g., an aspect ratio at least about 4:1). The polymer 231 is attached on opposite sides to stiff members 232 of a frame along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in a direction 235. When the linear motion device 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result. By way of example, such an arrangement may produce linear strains of at least about 200 percent for acrylics having an anisotropic pre-strain.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion devices 230 may be combined in series in the direction 235 to form an actuator having a cumulative deflection of all the linear motion devices in the series. When transducing electric energy into mechanical energy, electroactive polymers—either individually or mechanically linked in a collection—may be referred to as 'artificial muscle'. For purposes herein, artificial muscle is defined as one or more transducers and/or actuators having a single output force and/or displacement. Artificial muscle may be implemented on a micro or macro level and may comprise any one or more of the actuators described herein.

Figure 5F:
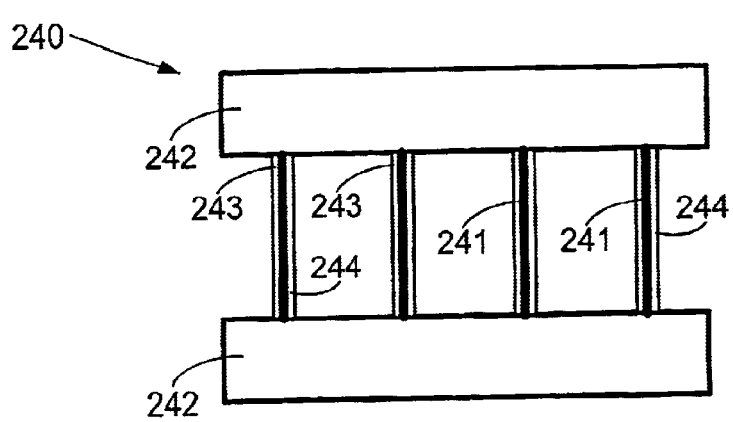
FIG. 5F illustrates a cross-sectional side view of a transducer including multiple polymer layers in accordance with one embodiment of the present invention.

FIG. 5F illustrates cross-sectional side view of a multilayer device 240 for converting between electrical energy and mechanical energy as an example of artificial muscle in accordance with a specific embodiment of the present invention. The multilayer device 240 includes four pre-strained polymers 241 arranged in parallel and each attached to a rigid frame 242 such that they have the same deflection. Electrodes 243 and 244 are deposited on opposite surfaces of each polymer 241 and provide simultaneous electrostatic actuation to the four pre-strained polymers 241. The multilayer device 240 provides cumulative force output of the individual polymer layers 241.

Combining individual polymer layers in parallel or in series has a similar effect on transducers operated in a generator mode. In general, coupling layers in parallel increases the stiffness and maximum input force of the device without changing its maximum stroke, while combining layers in series increases the maximum stroke without increasing the maximum input force. Thus, by combining layers in series and parallel, a generator can be designed to match a specific input mechanical load.

Figure 5G:
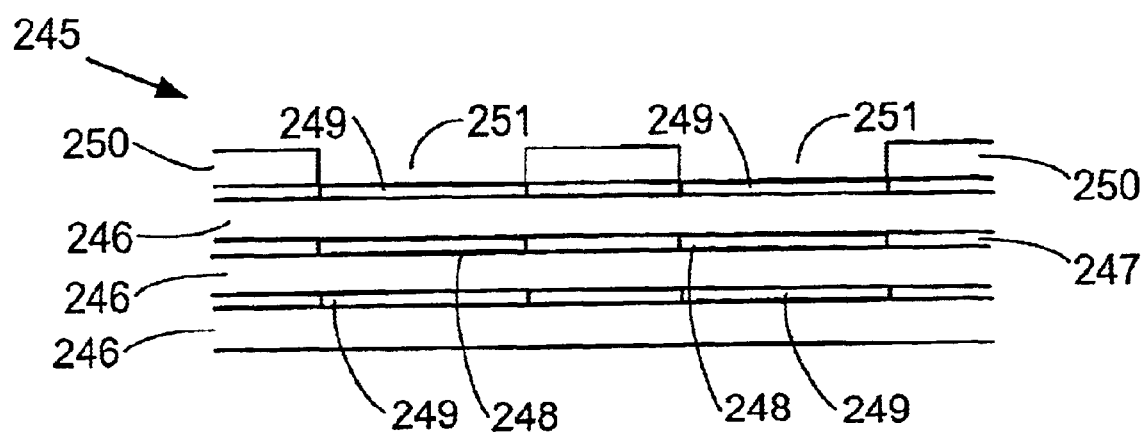
FIG. 5G illustrates a stacked multilayer device as an example of artificial muscle in accordance with one embodiment of the present invention.

In another embodiment, multiple electroactive polymer layers may be used in place of one polymer to increase the force or pressure output of an actuator, or to increase the electrical energy generated from a generator. For example, ten electroactive polymers may be layered to increase the pressure output of the diaphragm device of FIG. 5A. FIG. 5G illustrates such a stacked multilayer diaphragm device 245 for converting between electrical energy and mechanical energy as another example of artificial muscle in accordance with one embodiment of the present invention. The stacked multilayer device 245 includes three polymer layers 246 layered upon each other and may be attached by adhesive layers 247.

In one preferred embodiment, thin mylar or acetate pieces are inserted between the polymer layers in the attached area to prevent visco-elastic flow of the polymer stack. The thin mylar or acetate support pieces, typically 10 to 100 microns thick, act as interleaved support structures and are particularly useful when the film has a high prestrain to distribute the prestrain load. Otherwise the multilayers with high prestrain may cause bowing and pulling loose at the edge of the film. The interleaved support structures can be added for every layer of polymer 246, or they can be added every 2–5 layers depending on the amount of prestrain, film modulus, film thickness, and specific geometry. The interleaved support structures are typically bonded or stuck to the inactive outer edges of the polymer layers 246. Within the adhesive layers 247 are electrodes 248 and 249 that provide electromechanical coupling to polymer layers 246. A relatively rigid plate 250 is attached to the outermost polymer layer and patterned to include holes 251 that allow deflection for the stacked multilayer diaphragm device 245. By combining the polymer layers 246, the stacked multilayer device 245 provides cumulative force output of the individual polymer layers 246 in the case of an actuator, or the cumulative electrical output of the individual polymer layers 246 in the case of a generator.

Devices in accordance with another embodiment of the present invention may use multiple directions of deflection of an electroactive polymer to produce deflection in the output direction. FIGS. 5H–5K illustrate top and side perspective views of a three-dimensional device 370 for converting between electrical energy and mechanical energy in accordance with one embodiment of the present invention. The device 370 uses multiple planar directions of deflection of an electroactive polymer to produce deflection in a non-planar output direction.

Figure 5H:
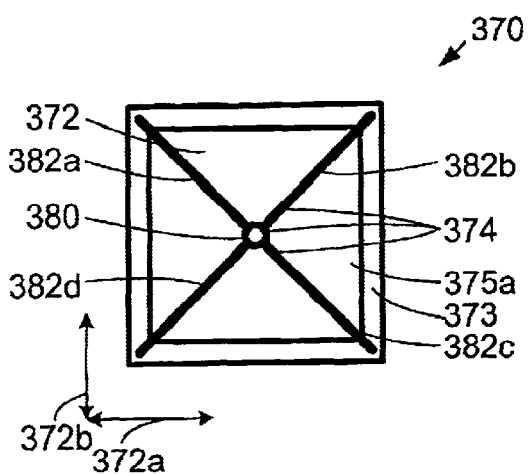
FIGS. 5H–5L illustrate top and side perspective views of a three-dimensional device for converting between electrical energy and mechanical energy in accordance with one embodiment of the present invention.
Figure 5I:
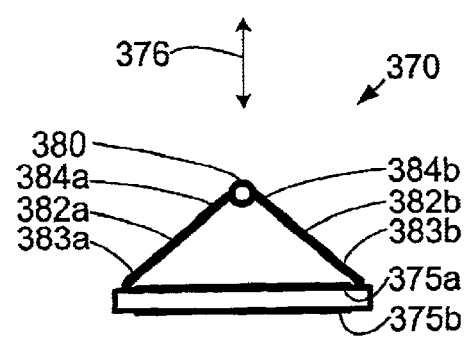

As illustrated in FIGS. 5H and 5I, the device 370 comprises a transducer and a frame 374. The transducer includes a polymer 373. The polymer 373 is in electrical communication with electrodes 375 in a manner that supports one of electrical generation and mechanical actuation. Electrodes 375a and 375b are attached to opposite surfaces of the polymer 373. The electrodes 375a and 375b provide or receive electrical electric energy to or from the polymer 373. Planar directions 372a and 372b are defined in a plane 372 corresponding to the largest polymer 373 surface. A direction 376 is not coplanar with plane 372 and is substantially orthogonal to the plane 372. The device 370 allows deflection of polymer 373 in planar directions 372a and 372b to produce displacement in the not coplanar direction 376.

The frame 374 comprises a base 380 and four rigid members 382a–d. More than four rigid members 382a–d can be used if desired. Larger numbers of symmetrically-configured rigid members 382a–d than the four shown provide a more uniform strain to polymer 373 but add additional complexity and mass. Preferred embodiments generally use 4–8 rigid members 382a–d. The members 382a–d translate between planar deflection of the polymer 373 and deflection in the not coplanar direction 376. Each of the four members 382a–d is hingeably or pivotally coupled at its proximate end 383a–d to a different corner portion of the polymer 373. Each rigid member 382a–d also includes a distal end 384 hingeably or pivotally coupled to the base 380. The base 380 limits motion for any one of the members 382a–d to rotation about the base 380. In addition, the polymer 373 restricts motion for any one of the members 382a–d according to the geometry and elasticity of the polymer 373. In a specific embodiment, coupling between each member 382 and the polymer 373 comprises a thin piece of flexible acetate (or other thin flexible material) attached to both the member 382 and the polymer 373. In another specific embodiment, coupling between each member 382 and base 380 comprises a thin piece of flexible acetate attached to both the member 382 and base 380. In yet another embodiment, the base 380 may not be used and the members 382a–d may be connected at their distal ends 384a–d by a common acetate joint. Collectively, interconnection between the polymer 373 and the members 382a–d provides a synchronous mechanical response for the device 370. As a result of this synchronous response, planar deflection of the polymer 373, or portion thereof, translates into non-planar deflection of the device 370 in the not coplanar direction 376.

Figure 5J:
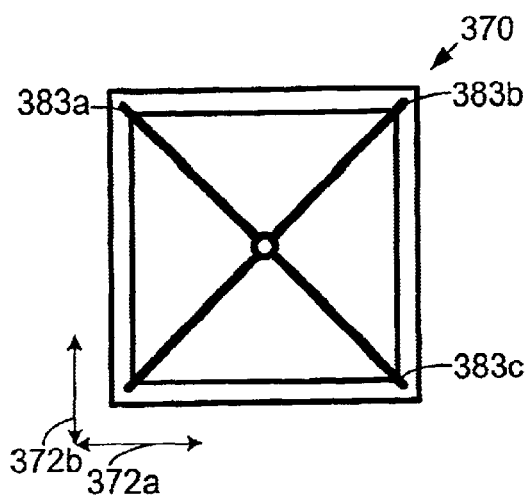
Figure 5K:
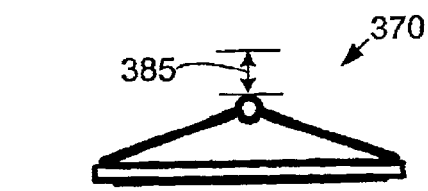

Upon actuation of the polymer 373, the polymer 373 expands and the proximate ends 383a–d of two adjacent members 382a–d separate in one of the planar directions 372a and 372b. For example, upon actuation of the polymer 373, planar expansion of the polymer 373 causes proximate ends 383a and 383b of the members 382a and 382b, respectively, to separate in planar direction 372a, as illustrated in FIG. 5J. Similarly, planar expansion of the polymer 373 causes proximate ends 383b and 383c of the members 382b and 382c, respectively, to separate in planar direction 372b. Due to deflection restrictions provided by the base 380, the polymer 373, and interconnectivity between the members 382a–d, separation of the proximate ends 383a–d of the members 382a–d translates into a reduced vertical height 385 as the distance between the base 380 and the polymer 373 decreases, as illustrated in FIG. 5K. Thus, deflection of the polymer 373 in the plane 372 causes the proximate ends 383a–d of the members 382a–d to translate along the plane 372 and causes the distal ends 384a–d of the members 382a–d to translate together in the not coplanar direction 376.

Each rigid member 382 may also act as a lever arm to increase mechanical advantage for the device 370. The lever arm provided by each member 382a–d improves translation of planar deflection of the polymer 373 into the not coplanar direction 376, and vice versa. More specifically, deflection in the not coplanar direction 376 forces the members 382a–d to expand outward and downward toward the polymer 373 (FIGS. 5J and 5K). In this manner, a small downward deflection in the not coplanar direction 376 becomes a large expansion in the plane of the polymer 373 when the rigid members 382a–d start from an orientation substantially, but not completely, in the not coplanar direction 376. This leverage is advantageous when the device 370 is used as a generator and external mechanical work is provided in the direction 376. As a result of the leverage provided by the members 382a–d, the device 370 is able to provide a relatively large electrical energy change for a small deflection in the not coplanar direction 376.

The members 382a–d are arranged frustroconically about the base 380. Symmetry of the members 382a–d provides a uniform stretch distribution for the polymer 373. Uniform stretch distribution for the polymer 373 may improve performance of the device 370 when used as a generator since electrical energy resulting from external mechanical input may be harvested from a relatively larger planar area of the polymer 373 and not just a small portion. Although the device 370 is illustrated with four members 382a–d, a different number of members 382a–d may be used. In a specific embodiment, the four members 382a–d are replaced by two substantially wide members that translate planar deflection of the polymer 373 into the not coplanar direction 376. Typically, as the number of members 382a–d increases, stretch uniformity for the polymer 373 increases, which may lead to a greater uniform stretch distribution for the polymer 373, and thus improved performance in most cases.

The base 380 may also be used for external mechanical attachment. For example, mechanical output may be attached to the base 380 that receives polymer 373 deflection when the device 370 is being used as an actuator. Similarly, mechanical input may be attached to the base 380 to provide input mechanical energy to the polymer 373 when the device 370 is being used as a generator.

In one embodiment, the frame 374 is configured at its resting position such that the members 382a–d pre-load the polymer 373. The pre-load can, for example, be incorporated by coupling the polymer 373 to each of the rigid members 382a–d using a spring-like flexible material initially attached so as to exert planar pre-load forces on polymer 373. The pre-load results in a pre-strain for the polymer 373. In other words, the frame 374 is configured such that the polymer 373 is elastically deformed in tension while the device 370 is at resting position. The polymer 373 tension tends to pull the members 382a–d to contract towards each other. As mentioned above, pre-strain of an electroactive polymer may be used to enhance performance of an electroactive polymer as a transducer. Pre-straining the polymer 373 may allow the device 370 to use lower actuation voltages for the pre-strained polymer 373 to provide a given deflection. As the device 370 has a lower effective modulus of elasticity in the plane, the mechanical constraint provided by the frame 374 allows the device 370 to be actuated in the plane to a larger deflection with a lower voltage. In addition, the high pre-strain in the plane increases the breakdown strength of the polymer 373, permitting higher voltages and higher deflections for the device 370.

The device 370 may be adapted or designed to a specific application. For example, multiple polymer layers, and accompanying electrodes, may be stacked in parallel to further increase force output or electrical recovery of the device 370.

In another embodiment, more than four members 382 is coupled to the perimeter of the polymer 373. A flexible material may also be attached between each of the members 382. When the flexible material is continuous over the base 380 and there are a large number of members 382, the resulting structure may appear similar to a cupcake liner. When the flexible material is attached to the polymer 373 in a sealing manner, this structure may also be used to enclose a fluid. The combination of the flexible material and the polymer may form a chamber which encloses the fluid. External mechanical input that changes the pressure within the enclosure then causes the polymer 373 to deflect. This deflection may be used to produce electrical energy according to generator techniques described above.

Figure 5L:
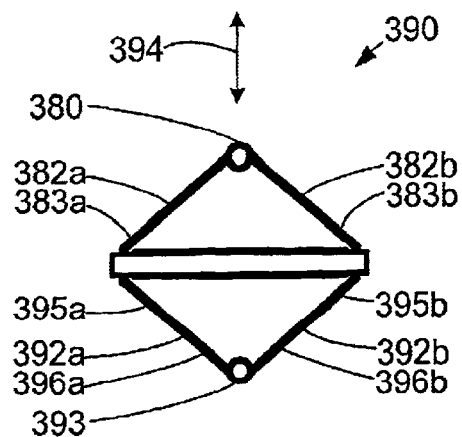

The device 370 is modular. FIG. 5L illustrates a side perspective view of a device 390 in accordance with one embodiment of the present invention. The device 290 comprises the device 370 of FIGS. 5H–5K as well as a frame 391 attached to the opposite side of the polymer 373. The frames 374 and 391 are combined in an opposing arrangement to form the device 390.

The frame 391 comprises a base 393 and four opposing rigid members 392a–d. The opposing members 392a–d translate between planar deflection of the polymer 373 and deflection in the not coplanar direction 394. Each of the four opposing members 392 is coupled at its proximate end 395 to a different corner portion of the polymer 373—on the opposite surface of the polymer 373 than the members 382a–d. Each opposing rigid member 392 also includes a distal end 396a–d coupled to the base 393. Interconnection between the polymer 373 and the opposing members 392 provides a synchronous mechanical response for the device 390 similar to that described above with respect to the members 382a–d. As a result of this synchronous response, planar deflection of the polymer 373, or portion thereof, causes the proximate ends 395a–d of the members 392a–d to translate along the plane 372 and causes the distal ends 396a–d of the members 392a–d to translate together in the not coplanar direction 394.

Deflection of any of portion of the polymer 373 causes the distance between bases 380 and 393 to change. More specifically, interconnection between polymer 373 and the members 382, coupled with interconnection between polymer 373 and the members 392, provides a synchronous mechanical response for the device 390. As a result, planar deflection of any portion of the polymer 373 translates into deflection of the device 390 that includes vertical deflection between the bases 380 and 393. For example, deflection of the polymer 373 in response to a change in electric field provided by the electrodes 375 decreases the distance between the bases 380 and 393.

The spider device 390 also works well as a generator to convert mechanical energy to electrical energy. In one embodiment, external mechanical energy is used to decrease the distance between bases 380 and 393. A decrease in distance between the bases 380 and 393 causes planar expansion for the polymer 373. The external mechanical energy, or a portion thereof, is then stored as elastic energy in the polymer 373. At some point before or during the external mechanical deflection, a relatively small voltage difference is applied between electrodes 375. The relatively small voltage difference is provided such that the resulting electrostatic forces are insufficient to balance the elastic restoring forces of the final stretch provided by the external mechanical energy. Upon removal of the external mechanical energy, the device 390 elastically contracts to, or near, its resting position—thus increasing the distance between bases 380 and 393 and increasing the electrical energy of the transducer as the polymer 373 contracts. A portion of the polymer 373 in electrical communication with electrodes 375 may be used to generate electrical energy from the polymer 373 contraction.

In another embodiment using a pre-load to pre-strain the polymer in the resting position, external mechanical energy is used to cause the distance between bases 380 and 393 to increase. In this case, electrical energy is harvested from the device 390 as the distance between bases 380 and 393 increases. Elastic return of the polymer due to the pre-load may then be used to return the device 390 to its resting position Some or all of the charge and energy can be removed from the electrodes 375 when the polymer 373 is fully contracted. Alternatively, some or all of the charge and energy can be removed during contraction. If the electric field pressure in the polymer 373 increases and reaches a balance with the elastic restoring forces during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. When electrical energy is removed from the polymers 397 and 398 as they contract, the device 390 continues to elastically return back to its resting position before the external mechanical energy was applied.

Mechanical coupling of the device 390 improves mechanical energy to electrical energy conversion. More specifically, lever arms provided by the members 382 and members 392 increase planar expansion of the polymer 373 for a given change in height between the bases 380 and 393 when the lever arms provided by the members 382 and 392 are relatively long (in the rest position the lever arms may be substantially, but not quite, in line with the not coplanar direction 394). Thus, even for a relatively short deflection between the bases 380 and 393, the device 390 bows outward substantially. In this manner, a small contraction between the bases 380 and 393 becomes a relatively large expansion for the polymer 373. The device 390 is then suitable for applications as a generator where a low stroke mechanical input is provided. Alternately, the lever arms provided by the members 382 and 392 may be made relatively shorter so that in the rest position they are substantially, but not quite, perpendicular to the not coplanar direction 394. In this case, a relatively large deflection between the bases 380 and 393 causes a small expansion for the polymer 373. The device 390 then becomes suitable for a generator where relatively larger deflections are provided compared to the desired polymer deflection. Thus, by designing the lever arms provided by members 382 and 392 the device 390 may be designed for various force-stroke inputs depending on the application and desired polymer.

Figure 5N:
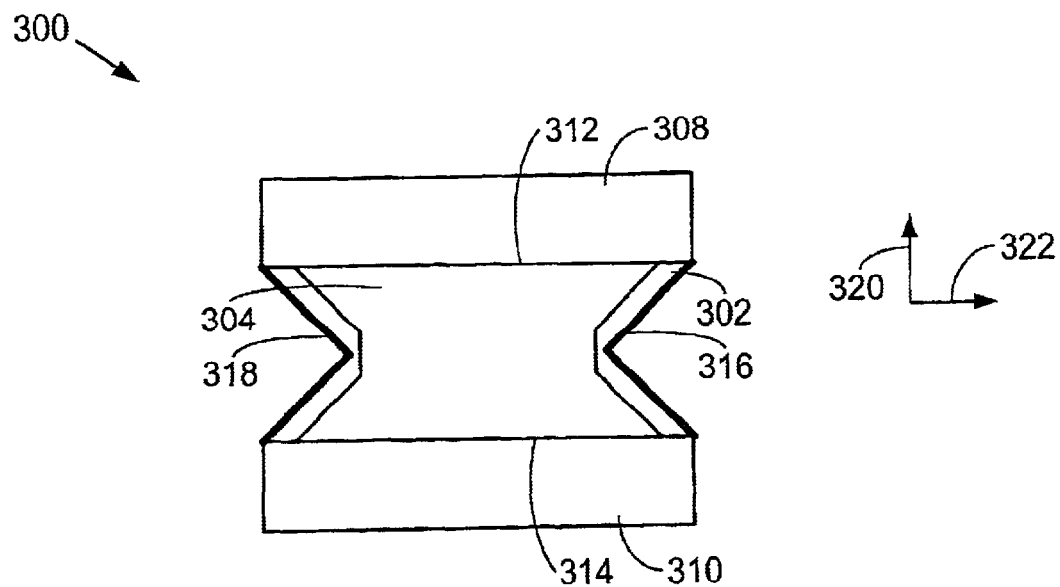
FIGS. 5N and 5O illustrate a device for converting between electrical energy and mechanical energy in accordance with another embodiment of the present invention.
Figure 5O:
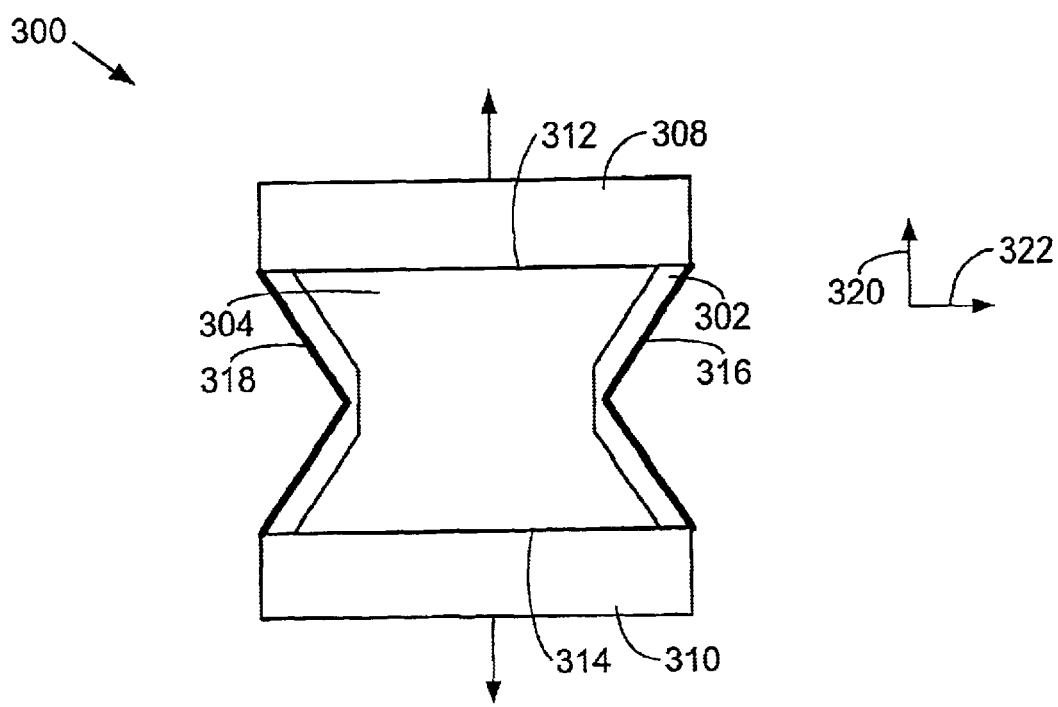

FIGS. 5N and 5O illustrate a device 300 for converting between electrical energy and mechanical energy in accordance with another embodiment of the present invention. The device 300 includes a polymer 302 arranged in a manner which causes a portion of the polymer to deflect in response to a change in electric field and/or arranged in a manner which causes a change in electric field in response to deflection of the polymer. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion between electrical energy and mechanical energy for the device 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 5O. In addition, expansion of the polymer 302 in the direction 322 causes the flexures 316 and 318 to straighten, and further separates the stiff members 308 and 310. In this manner, the device 300 couples expansion of the polymer 302 in both planar directions 320 and 322 into mechanical output in the direction 320.

In one embodiment, the polymer 302 is configured with different levels of pre-strain in orthogonal directions 320 and 322. More specifically, the polymer 302 includes a higher pre-strain in the direction 320, and little or no pre-strain in the perpendicular planar direction 322. This anisotropic pre-strain is arranged relative to the geometry of the flexures 316 and 318.

One advantage of the device 300 is that the entire structure is planar. In addition to simplifying fabrication, the planar structure of the device 300 allows for easy mechanical coupling to produce multilayer designs. By way of example, the stiff members 308 and 310 may be mechanically coupled (e.g. glued or similarly fixed) to their respective counterparts of a second device 300 to provide two devices 300 in parallel in order to increase the force output over single device 300. Similarly, the stiff member 308 from one device may be attached to the stiff member 310 from a second device in order to provide multiple devices in series that increase the deflection output over a single device 300.

In addition to good performance of the device 300 as in actuator which converts electrical energy into mechanical energy, the device 300 is also well-suited as a generator. For example, when a charge is placed on the polymer 302 while it is stretched, contraction of the device 300 converts mechanical energy to electrical energy. The electrical energy may then be harvested by a circuit in electrical communication with the electrodes 304.

6. Electronics

In the present invention, mechanical energy may be applied to a transducer in a manner that allows electrical energy to be removed from the transducer. As described with reference to FIG. 2B, many methods for applying mechanical energy and removing electrical energy from the transducer are possible. Generator devices may be designed that utilize one or more of these methods to generate electrical energy. The generation and utilization of electrical energy from the generator devices may require conditioning electronics of some type. For instance, at the very least, a minimum amount of circuitry is needed to remove electrical energy from the transducer. Further, as another example, circuitry of varying degrees of complexity may be used to increase the efficiency or quantity of electrical generation in a particular type of generator device or to convert an output voltage to a more useful value for the application generator device.

Figure 6A:
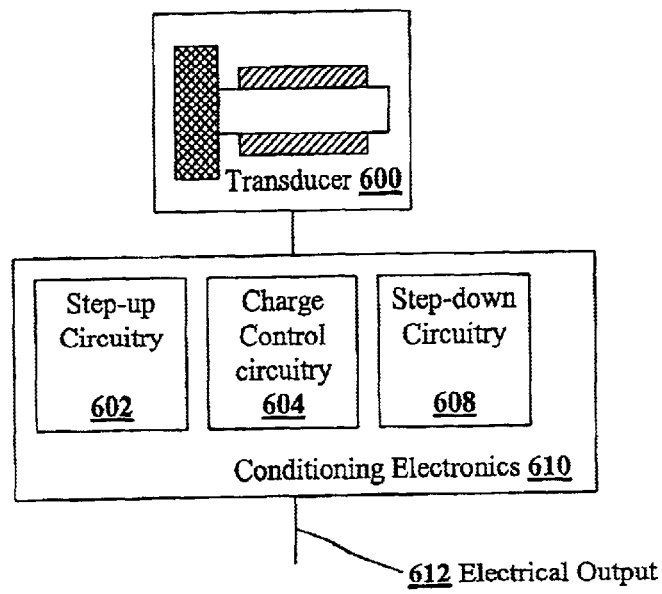
FIG. 6A is block diagram of a transducer connected to conditioning electronics.

FIG. 6A is block diagram of one or more transducers 600 connected to power conditioning electronics 610. Potential functions that may be performed circuits by the power conditioning electronics 610 include but are not limited to 1) voltage step-up performed by step-up circuitry 602, which may be used when applying a voltage to the transducer 600, 2) charge control performed by the charge control circuitry 604 which may be used to add or to remove charge from the transducer 600 at certain times of the cycle, 3) voltage step-down performed by the step-down circuitry 608 which may be used to adjust an electrical output voltage to an electrical output 612. These functions are described in more detail with reference to FIGS. 6B–6E. All of these functions may not be required in the conditioning electronics 610. For instance, some generator devices may not use step-up circuitry 602, other generator devices may not use step-down circuitry 608, or some generator devices may not use step-up circuitry and step-down circuitry. Also, some of the circuit functions may be integrated. For instance, one integrated circuit may perform the functions of both the step-up circuitry 602 and the charge control circuitry 608.

Figure 6B:
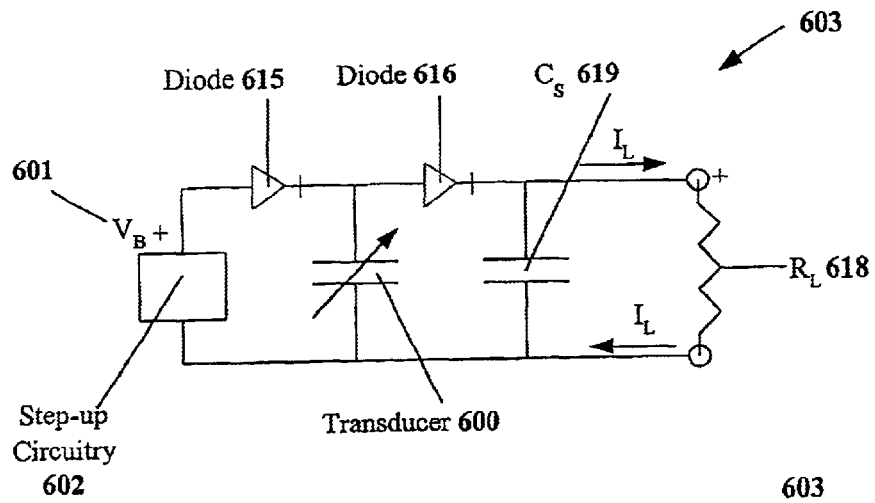
FIG. 6B is a circuit schematic of an electrical generator employing a transducer for embodiment of the present invention.

FIG. 6B is a circuit schematic of an electrical generator 603 employing a transducer 600 for one embodiment of the present invention. As described with reference to FIGS. 4A and 4B, transducers of the present invention may behave electrically as variable capacitors. To understand the operation of the generator 603, operational parameters of the generator 603 at two times, $t_1$ and $t_2$ may be compared. Without wishing to be constrained by any particular theory, a number of theoretical relationships regarding the electrical performance the generator 603 are developed. These relationships are not meant in any manner to limit the manner in which the described devices are operated and are provided for illustrative purposes only.

At a first time, $t_1$, the transducer 600 may possess a capacitance, $C_1$, and the voltage across the transducer 600 may be voltage 601, $V_B$. The voltage 601, $V_B$, may be provided by the step-up circuitry 602. At a second time $t_2$, later than time $t_1$, the transducer 600 may posses a capacitance $C_2$ which is lower than the capacitance $C_1$. Generally speaking, the higher capacitance C1 occurs when the polymer transducer 600 is stretched in area, and the lower capacitance C2 occurs when the polymer transducer 600 is contracted or relaxed in area. Without wishing to bound by a particular theory, the change in capacitance of a polymer film with electrodes may be estimated by well known formulas relating the capacitance to the film's area, thickness, and dielectric constant.

The decrease in capacitance of the transducer 600 between $t_1$ and $t_2$ will increase the voltage across the transducer 600. The increased voltage may be used to drive current through diode 616. The diode 615 may be used to prevent charge from flowing back into the step-up circuitry at such time. The two diodes, 615 and 616, function as charge control circuitry 604 for the transducer 600 which is part of the power conditioning electronics 610 (see FIG. 6A). More complex charge control circuits may be developed depending on the configuration of the generator 603 and the one or more transducers 600 and are not limited to the design in FIG. 6B.

The current passed through diode 616 may also be used to charge a storage capacitor 619 with capacitance Cs and to power a device of some type represented by a device load resistance 618, $R_L$. In particular embodiments, the device may be but is not limited to a portable electronic device of some type such as a cellular phone, a satellite phone, a navigational device using a GPS receiver, a heater, a radio or a battery. The battery may be used to power the portable electronic device.

Typically, a generator operates at a particular output voltage, $V_O$. When no charge is flowing through the diode 616 between $t_1$ and $t_2$, the voltage, $V_2$, that appears on the transducer at time, $t_2$, may be approximately related to the charge $Q_1$ on the transducer at $t_1$ as:

$$V_2 = Q_1/C_2 = C_1 V_B/C_2, \text{ where } Q_1 = Q_2$$

For this example, if it is assumed that $C_1$ is the maximum capacitance of the transducer and $C_2$ is the minimum capacitance of the transducer, then $V_2$ is about the maximum output voltage that could be produced by the generator 603. When charge flows through the diode 616 between $t_1$ and $t_2$, the voltage $V_2$ is lower than when no charge is flowing through the diode between $t_1$ and $t_2$ because $Q_2$ will in this case be less than $Q_1$. Thus, the maximum output voltage would be reduced.

A charge removed from the generator 603 may be simply calculated by assuming a constant operational voltage $V_O$ which is between $V_B$ and the maximum output voltage of the generator. The generators of this invention are not limited to a constant $V_O$ and the example is provided for illustrative purposes only. For instance, when the operational voltage of the generator is assumed to be constant at the average of maximum and $V_B$, $$V_O = \tfrac{1}{2}(V_2 + V_B) = \tfrac{1}{2}(V_B + C_1 V_B / C_2), \text{ where } Q_1 = Q_2,$$

the charge, $Q_O$, on the transducer 600 at $t_2$ is $C_2 V_O = \tfrac{1}{2} V_B (C_1 + C_2)$. In this example, the charge, $Q_{out}$, that passes through the diode 616 between $t_1$ and $t_2$ is the difference between the charge at $t_1$, $Q_1$ and the charge at time $t_2$, $Q_O$. Per expansion-contraction cycle of the transducer 600, $Q_{out}$ may be computed as follows, $$Q_{out} = Q_1 - Q_O = V_B (C_1 - C_2)/2$$

When the transducer 600 operates at a substantially constant frequency, f, the current, $I_L$, delivered to the a device load resistance $R_L$ 618 by the generator 603 is, $$I_L = f Q_{out} = f V_B (C_1 - C_2)/2$$

and the power, $P_L$, delivered to the load resistance 618 is, $$P_L V_O I_L = f V_O V_B (C_1 - C_2)/2$$

In the example above, the constant frequency, f, is only used for illustrative purpose transducers of the present invention may operate at a constant frequency or a frequency that varies with time. Thus, the current, $I_L$, may also vary with time. For instance, for a generator using a transducer powered by a human foot strike, the operational frequency of the transducer, f, may vary with time according to a gait and physical characteristics of a particular person employing the generator. Thus, the operational frequency of the transducer, f, and may vary according to whether the person is running or walking.

In FIG. 6B, due to conservation of charge, for the circuit to operate, a current equal to $I_L$ is required to flow from the step-up circuitry 602. The step-up circuitry 602 may be as simple as a battery. When a battery is used, the battery supplies the power to develop the current equal to $I_L$. When an output voltage of the battery is less than $V_B$, additional circuitry (e.g. step-up circuitry 602) may be used to raise the output voltage of the battery to $V_B$. Details of one embodiment of step-up circuitry are described with respect to FIG. 6D.

Figure 6C:
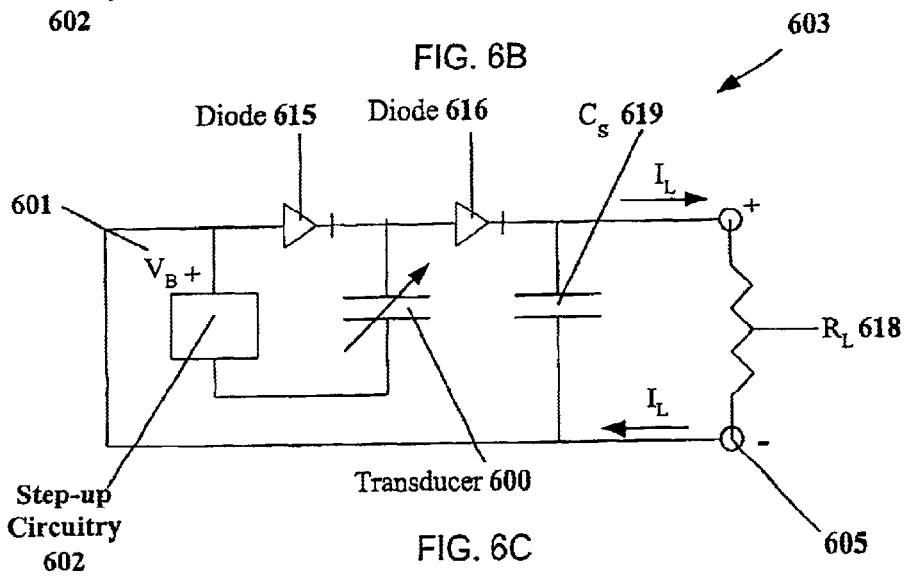
FIG. 6C is a circuit schematic of an electrical generator employing a transducer for another embodiment of the present invention.

FIG. 6C is a circuit schematic of an electrical generator employing a transducer 600 for another embodiment of the present invention. The circuit of FIG. 6C is intended to reduce the amount of current that is required to from the step-up circuitry 602. In FIG. 6C, a current $I_L$ is required to flow into the negative terminal 605. With the connection scheme in the FIG. 6C, the current, $I_L$, flowing through the negative terminal 605 reduces the amount of current that is required from the step-up circuitry 602 as compared to the circuit in FIG. 6B. The power, $P_L$, delivered to the device load resistance $R_L$ 618 may be calculated in the same manner as described with respect to FIG. 6B. However, since the connection scheme is different, the voltage, $V_L$, applied to the load 618 is equal to $V_L = V_O - V_B = V_B(C_1/C_2 - 1)/2$. Thus, the power, $P_L$, applied to the load is, $$P_L = I_L V_L 32\ f V_B^2 (C_1 - C_2)^2 / (4 C_2)$$

In FIG. 6C, an advantage of the circuit design may be a reduced power requirement for a battery used in the step-up circuitry 602 which increases the life of the battery during the operation of the generator 603.

More specifically, in the embodiment of FIG. 6B, the step-up circuitry 602 supplies a current equal to $I_L$ while in the FIG. 6C embodiment, the step-up circuitry supplies a current equal to the transducer leakage current, $I_D$. Typically, ID is much less than 1% of IL. Since the voltage, VB, may be the same in both embodiments, the power supplied by the step-up circuitry of FIG. 6C will typically be less than 1% of the power supplied by the step-up circuitry in FIG. 6B.

In FIGS. 6A and 6B, the voltage 601, $V_B$, applied to the transducer 600 may be high (e.g. thousand of volts although $V_B$ is not limited to this range). It may be undesirable to use a high-voltage battery to directly supply $V_B$. Instead, a low-voltage battery in combination with step-up circuitry 602 may be used to supply $V_B$. In some embodiments, the low-voltage battery may supply a voltage in the range of about 1–15 Volts.

Figure 6D:
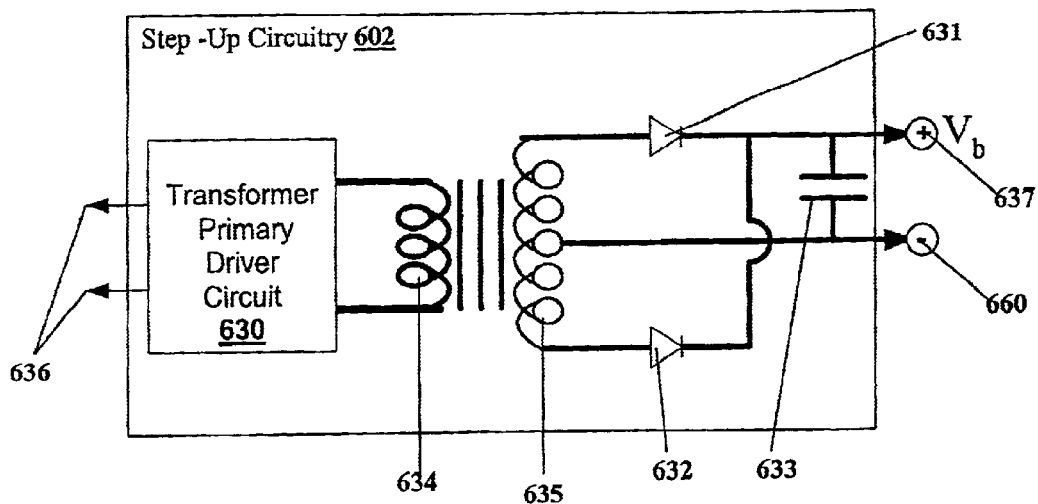
FIG. 6D is a circuit schematic of step-up circuitry for one embodiment of the present invention.

FIG. 6D is a circuit schematic of step-up circuitry 602 that may be connected to a low-voltage battery to supply $V_B$ to the transducer 603 for one embodiment of the present invention. The transformer primary driver circuit 630 may be designed to receive power from a low-voltage battery connected to an electrical input interface 636. The transformer primary driver circuit 630 operates a primary transformer winding 634 which is used to induce a voltage in a secondary winding 635 which is greater than the voltage at the electrical input interface 636. The secondary winding 635 charges a capacitor 633 via the diodes 631 and 632. The capacitor 633 may be designed to store charge when current equal to $I_L$ (see FIG. 6C) flows into a positive load terminal 637. When current is flowing into the capacitor 633, the diodes 631 and 632 are back-biased so charge will not leak from capacitor 633 by flowing through the secondary winding 635. An advantage of the step-up circuitry 602 is that as the transducer 600 is cycled (see FIG. 6C), only a small amount of battery power is needed for charging capacitor 633.

Figure 6E:
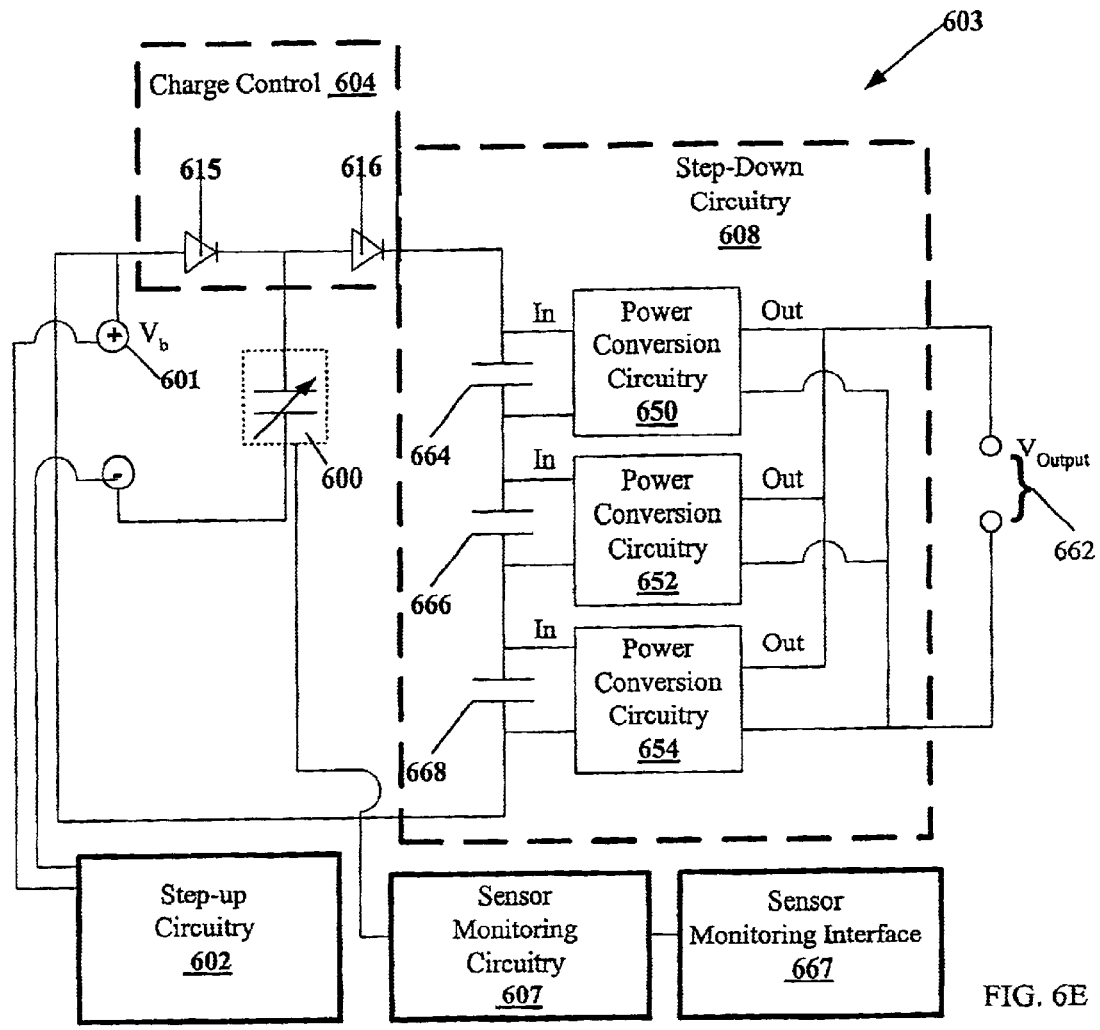
FIG. 6E is a circuit schematic of an electrical generator employing a transducer for yet another embodiment of the present invention.

FIG. 6E is a circuit schematic of an electrical generator 603 employing a transducer 600 for yet another embodiment of the present invention. Particular embodiments of the charge control circuitry 604 and the step-up circuitry 602 have been described with respect to FIGS. 6B, 6C and 6D. In FIGS. 6B and 6C, the voltage on the storage capacitor 619 may be as high as 2000–8000 Volts. Typically, it is relatively difficult to build electronic circuitry that operates at voltages above about 500 to 2500 Volts. For instance, at high voltages vacuum tube components (which are expensive, fragile and inefficient) may be required. To reduce the operational voltage of the storage capacitor 619 as well as to provide an output voltage 662 that is compatible with many common types of electronic devices, the step-down circuitry 608 may be used to replace the storage capacitor 619.

In the step-down circuitry 608, storage capacitor 619 has been replaced with a series of three capacitors 664, 666 and 668. Each of these capacitors is connected to one of the power conversion circuits, 650, 652 and 654. The number of capacitors is not limited to three. As the number of capacitors in series is increased, the input voltage to the power conversion circuits such as 650, 652 and 654 is reduced. Any number of capacitors may be used to provide an input voltage to each power conversion circuit which is consistent the voltage requirements of the power conversion circuitry and the voltage output of the one or more transducers 600. The power conversion circuits (e.g. 650, 652 and 654) may be designed to produce an appropriate output voltage. For instance, the output voltage 662 of the power conversion circuits may be 3, 5, 12 or 120 Volts but is not limited to these values. Further, in some embodiments, voltage step-up may be used to raise the output voltage 662. For instance, high voltages are typically used for power transmission. The power conversion circuits may be connected to the output interface 612 (See FIG. 6A).

The power conversion circuits may be designed to work properly with their outputs connected in parallel as in 608. The power conversion circuits may be conventional in design employing circuit topologies and components familiar to those skilled in the art. For some embodiments of the present invention, the power conversion circuits may provide galvanic isolation between their input and output terminals. Various types of circuits with varying levels of complexity that provide galvanic isolation are known in the art. One example of a power conversion circuit providing galvanic isolation is the Model APC-55 manufactured by Astrodyne, Taunton, Mass.

Various other types of step-up, step-down, and charge control circuitry are known in the prior art and may be adapted for use with the present invention. The known types include boost- and buck-type circuits which employ inductors, transistor switches, and diodes; various step-up and step-down transformer circuits; and capacitive voltage multipliers for step-up using capacitors and diodes.

The generator 603 may also include sensors and sensor monitoring circuitry 607 designed to monitor various generator parameters. These measurements may be used to monitor and/or enhance the operational performance of the generator. For instance, a sensor connected to sensor monitoring circuitry may be used to determine a power output of the generator 603. As another example, a sensor may be connected to a battery in the step-up circuitry 602 to indicate when the battery is running low and needs to be replaced. As yet another example, a number of cycles that a transducer such as 600 has been operated may be measured by a sensor and sensor monitoring circuitry. The number of cycles may be used to indicate that a device is nearing the end of its operational lifetime. As a further example, a deflection rate or a deflection distance of the transducer 600 may be measured by a sensor and sensor monitoring circuitry and used as input to control circuitry used to enhance the performance of a generator such as 603. In particular, the control circuitry may synchronize and control the operation of the circuits, 650, 652 and 654. In yet another example, a sensor such as a thermocouple and sensor monitoring circuitry may be used to measure a temperature at one or more locations within the generator 603. In a further example, the generator 603 may contain one or more sensors designed to detect characteristics of biological or environment forces input into the generator 603 such as an energy input frequency. The detected characteristics of input forces may be used to adjust the performance of the generator to more efficiently harvest energy from the input forces. Many types of sensors may be used with devices of the present invention and are not limited to the sensors described above.

The sensor monitoring circuitry may output a signal to a sensor monitoring interface 667. The sensor monitoring interface 667 may include a number of displays that may be monitored by a user of a generator such as 603. For example, a sensor monitoring interface display may be a stack of colored LED's that are activated according to the power output of the generator. A maximum power output may be represented as an entire stack of LED's being lighted. As another example, a red light on a sensor monitoring interface 667 may be activated to indicate that a battery in the step-up circuitry 602 needs to be replaced. The red light may blink in some manner or may be steady. As yet another example, a green light on the sensor monitoring interface may indicate that a chargeable battery connected to the generator 603 is fully charged. Many other types of displays such as digital displays may be used with the sensor monitoring interface 667 and are not limited to the examples described above.

As described above, the step-up circuitry 602 may be powered by a battery. For many applications, it may be inconvenient to use a battery for this purpose. For instance, in some embodiments, it may be undesirable to have to replace a battery. In yet another embodiment, the generator 603 may be used to charge a low-voltage battery not shown, connected to output interface 612. The battery may simultaneously be used to provide input power to a step-up circuit such as 602. The output of this step-up circuit would be the voltage 601, $V_B$. Thus, the frequency of battery replacement may be significantly reduced.

In some situations, the voltages on capacitors 664, 666 and 669 may become unequal which may cause a circuit failure or other problems. In another embodiment, each of the power conversion circuits, 650, 652 and 654 may include control circuitry that stops the operation of the circuit when its input voltage drops below a certain, predetermined level. This feature may help to maintain equality of the voltages on the series capacitors 664, 666 and 668.

Figure 6F:
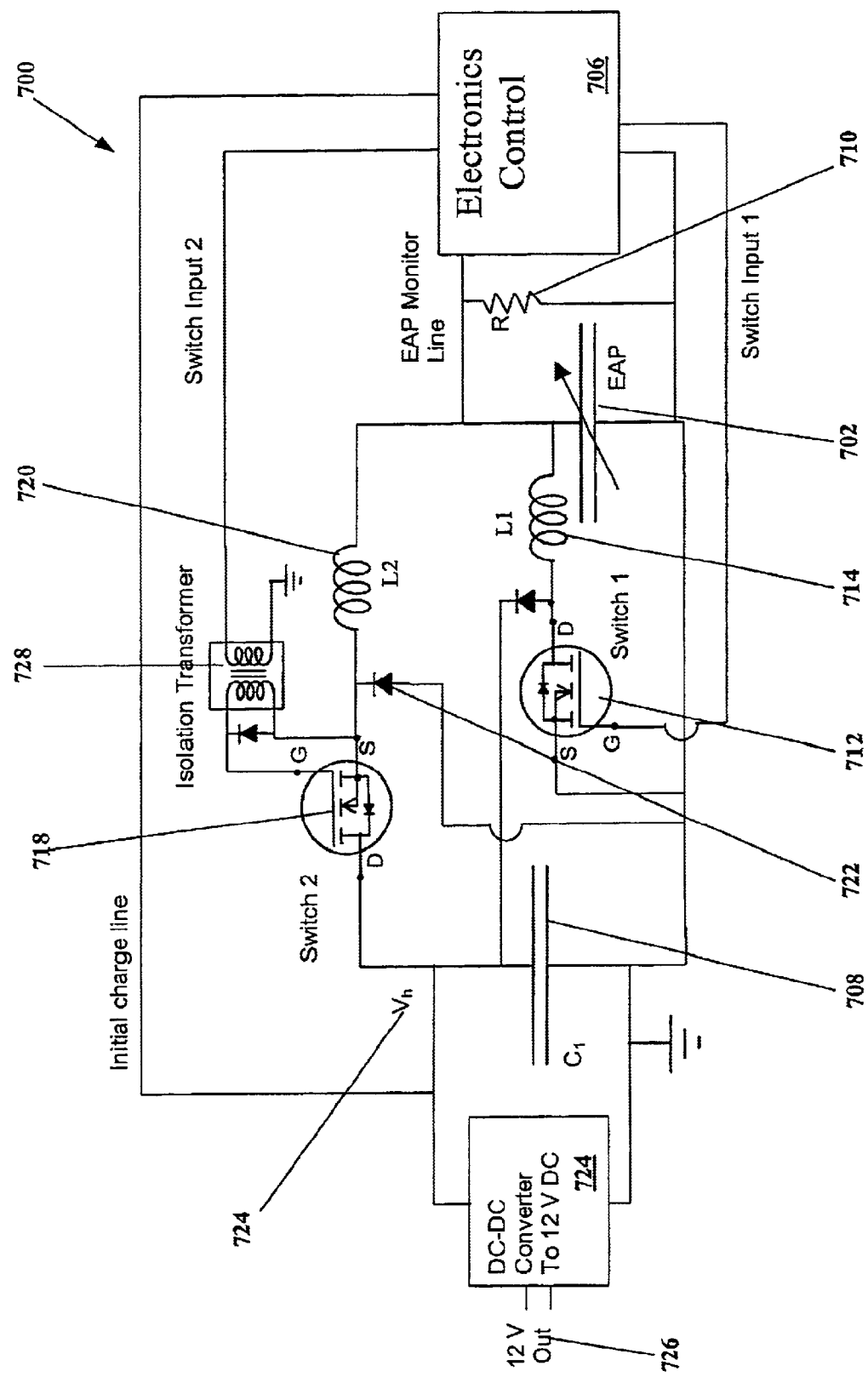
FIG. 6F shows a circuit for both adding and removing charge on EAP films of the present invention.

FIG. 6F shows a circuit 700 for both adding and removing charge on EAP films of the present invention. The circuit 700 may be used to implement a charge profile on a EAP film i.e. an amount of charge on the EAP film as a function of time. The operation of the circuit 700 in FIG. 6F may be described as follows. The EAP film, represented in FIG. 6F, as a variable capacitor 702, operates from roughly "ground" (0 V, by definition) to a high voltage, $V_h$, 704, with some allowance for offsetting from the rails 0 V and $V_h$ to improve efficiency. Initial charge is placed on the film 702 using the electronics control sub-circuit 706 which can include a small step up converter (see FIG. 6D, for instance). The electronics control sub-circuit 706 may typically include a logic device such as single chip computer or microcontroller to perform charge and voltage control functions on the EAP film 702. Alternately, at start-up, a relatively low voltage may initially placed on the capacitor $C_1$, 708, and the circuit 700 may use the mechanical-to-electrical conversion properties of the EAP film 702 (being driven by an expanding gas, for example) to raise the voltage as described below. For example, the EAP film voltage can be monitored by the electronics control sub-circuit 706 using a resistor R, 710. The resistor R, 710, may be chosen to have a sufficiently high resistance so that only a negligible amount of power is used for EAP voltage monitoring.

Assuming some initial charge on the film to put its voltage between 0 V and $V_h$, 708, charge is drained into ground by briefly switching SWITCH 712, (typically a fast transistor switch such as an FET shown or an IGBT) to its "on" or conducting state. Current flows from the EAP film 702 into ground. When SWITCH 712, is switched off, the inductor $L_1$, 714, forces charge through the diode, 716, to the high side of the capacitor $C_1$, 708. Thus, some charge may be pumped to $C_1$, 708, by draining the EAP film 702, and the amount of energy lost in lowering the voltage of the charge that goes to ground is equal to the energy added to $C_1$, 708, with an ideal circuit. When charge is added to the EAP film, 702, by switching SWITCH 718, on, charge flows from $C_1$, 708, onto the EAP film 702. When SWITCH 718 is switched off, the inductor-diode combination, 720 and 722, pulls additional charge onto the EAP film 702 from ground. Again, the amount of energy lost by the charge going from $C_1$, 708, to the EAP film 702 is equal to the energy gained by the charge pulled up from ground. In both cases of draining and charging the EAP film 702, charge is pumped from a lower to a higher voltage by the inductors, 714 and

720, i.e., from the EAP film 702 to $C_1$, 708, in draining, and from ground to the EAP film 702 in charging. Thus, charge is always being pumped to a higher voltage in the manner of a boost circuit.

The DC–DC converter 724 connected across $C_1$, 708, returns the charge to ground, in the process converting the high voltage energy to 12 V DC output, 726. The DC–DC converter 724 may be designed to operate only when the voltage on $C_1$, 708, reaches some desired value, or the DC–DC converter, 724, can be controlled by the electronics control sub-circuit 706 to begin converting high voltage to low voltage only when desired. For example, at start-up, one might initially charge $C_1$, 708, at only a relatively low voltage, but by suitably mechanically cycling the polymer and using switches 712 and 718, the voltage on $C_1$, 708, may be made to reach a high level. During the initial charge-up process the DC–DC converter 724 may not be converting to allow the energy to build up in $C_1$, 708, to the optimal level from an initial low voltage level.

If the EAP film, 702, was a purely passive device like a fixed capacitor, at best the circuit 700 would just move electrical energy around. However, the EAP film 702 is not a passive device, but a variable capacitor. Thus, by timing the charge transfers, there may be a net transfer of energy from the EAP film 702 to the capacitor, $C_1$, 708, during each cycle. Charge is removed, on average, from the EAP film 702 at a higher voltage than it is added, and the difference in energy ends up in $C_1$, 708. Thus, the DC–DC converter 724 needs to remove energy at an appropriate rate to keep $V_h$, 704, from increasing to an arbitrarily high voltage until there is an electrical breakdown. Feedback to the circuit (either internal to the DC–DC converter 724, or controlled by the electronics control sub-circuit 706 with an added control line to the DC–DC converter 726) may provide the appropriate energy removal rate so that electrical breakdown is prevented.

The switches, 712 and 718, shown in FIG. 6F may be designed or configured as follows. SWITCH 716 may use a straightforward design because its source is at ground. Thus, the electronic control circuitry 706 can easily switch SWITCH 712 directly. SWITCH 718, on the other hand, is floating at high voltage and generally needs to be isolated from the control circuitry. In FIG. 6F, a small isolation transformer 728 is used for this function, but other techniques known in the prior art, such as capacitive coupling and optoisolators, can be used with appropriate circuitry.

In circuit 700, a negative bias voltage may be incorporated, if needed, with the addition of a capacitor. Note that with the circuit in FIG. 6F, the step-up in voltage is already integrated into the charge control. Once the circuit is initially charged, charge is continuously pumped to $V_h$, 704, and a small leakage current through the EAP film 702 reduces the amount of charge pumped to $V_h$ 704 to a value that is slightly less per cycle than for zero leakage.

7. Biologically Powered Generators

Figure 7A:
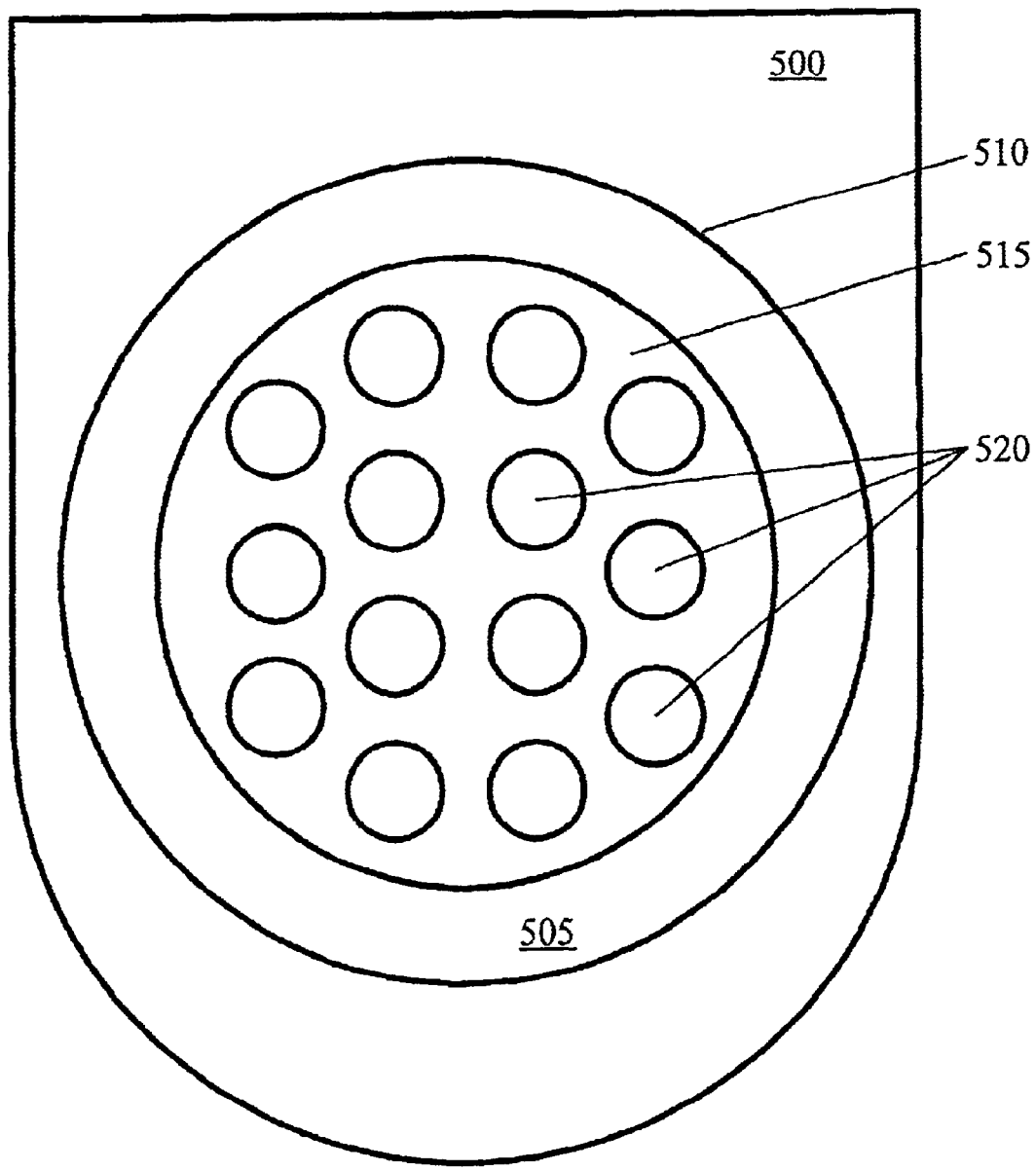
FIG. 7A is a top view of a generator device integrated into the heel of footwear for one embodiment of the present invention.
Figure 7B:
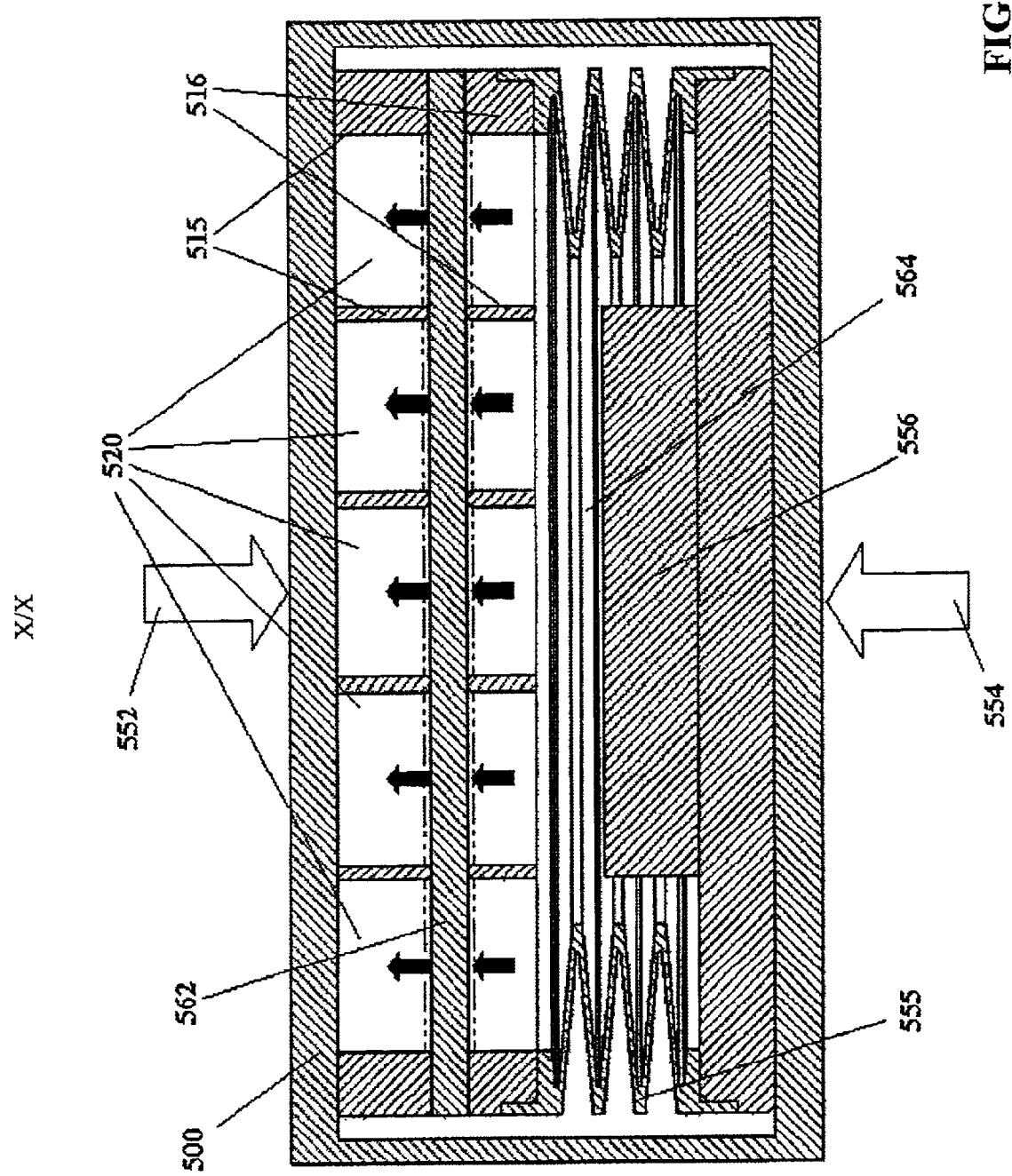
FIG. 7B is a side view of a generator device integrated into the heel of footwear for one embodiment of the present invention.

FIGS. 7A and 7B are a top and side view of one embodiment of a heel-strike generator 505 of the present invention. FIG. 7A is a top view of a generator device 505 integrated into the heel 500 of footwear. The footwear may be a shoe, boot, sandal, sock or any other type of foot covering with an attached heel 500. The heel 500 may attached to the footwear such that the heel 500 is detachable. Thus, a first heel attached to the footwear may be detached and replaced with a second heel. The heel 500 may include attachment means for securing the heel 500 to the footwear that allow it to be easily attached and detached from the footwear.

The heel 500 may be constructed from a waterproof material and sealed to prevent moisture from entering the heel strike generator 505. In addition, the heel strike generator 505 may be waterproofed as well. The heel-strike generator may include a housing 510 enclosing one or more EAP transducers 520, a transmission mechanism 555 (see FIG. 7B) and power conditioning electronics (not shown). Power conditioning electronics, as described with reference to FIGS. 6A–6E, may be used with the present invention and integrated into the housing 510 in some manner. The power conditioning electronics may include charge control circuitry, step-up circuitry and step-down circuitry.

The generator 505 includes a grid plate 515 with a plurality of cylindrical apertures 520. The number, size and shape of the apertures 520 may vary. For instance, a portion of the apertures may by oval-shape and a portion of the apertures may be circularly shaped. The size, shape and number of apertures may be designed or configured to optimize the performance of the generator according to a number of parameters such as a size of the person wearing the footwear.

FIG. 7B is a side view of a generator device integrated into the heel of footwear for one embodiment of the present invention. The grid plate 515 is secured to the heel of the shoe 500 and an EAP film 562 is stretched across the lower surface of the grid plate 515. The EAP film 562 may be secured to the grid plate 515 by a second plate 516. Attachment means between the EAP film 562, the grid plate 515 and the second plate 516 may include but are not limited to glue, epoxy, screws, bolts and combinations thereof. A fluid-filled container may be secured to a lower portion of the grid plate 516. In one embodiment, the fluid-filled container 555 is a flexible bellows 555. The bellows 555 may be constructed from materials such as stainless steel, acetal (aka Delrin), nylon, polycarbonate, and ABS. In other embodiments, the fluid-filled container may be a bladder or a membrane. The fluid 564 in the container may be a liquid, gel or gas. Examples of fluids 564 that may be employed in the present invention include hydraulic (pump) oil, air, and water.

The bellows 555 is designed to contract when forces 552 and 554 are applied to the heel 500 during human bipedal motion and uncontract when the forces are removed. The sidewalls of the heel 500 are designed to buckle, flex, or otherwise compress to allow the bellows to contract. A stroke distance may correspond to a distance that the bellows moves between when a force is applied and when a force is removed which includes a contract distance and an uncontract distance of the bellows 555. The stroke distance, which may vary from one step to another, may be between about 1 to 10 mm. The bellows 555 may include a support member 556, which limits the maximum contract distance of the bellows 555.

When the bellows 555 contracts, the fluid 564 forces the EAP film 562 to deflect into the plurality of apertures 520 as a plurality of diaphragms (see FIG. 5A). During a contraction of the bellows 555, the amount of deflection of each diaphragm in the plurality of apertures may vary 520. When the bellows 555 uncontracts as the forces 552 and 554 are decreased or removed, the EAP film 562 may relax. The deflection of the EAP film 562 and the subsequent relaxation may be used to generate electricity (e.g., see FIG. 2B). The amount of electricity harvested per step may be between about 0.1 J and 5.0 J depending on the user's weight, footstep, comfort level, and device design. The electrical energy harvested per gram of polymer may be greater than about 0.2 J per gram.

The forces 552 and 554 are shown perpendicular to the upper and lower surfaces of the heel 560. The present invention is not limited to forces, 552 and 554, perpendicular to the surface of the heel. During a step, the angle of the force 554 relative to the surface of the heel may vary and the forces may be unevenly distributed over the upper and lower surfaces of the heel 560.

The footwear generators of the present invention are not limited to transducers located in the heel of footwear. Transducers may be located on any surface of the footwear that receives a direct force when the foot contacts the ground during bipedal motion such as the front of the foot. Further, transducers that generate electricity from inertial forces may be used. These transducers may be secured to different locations on the footwear and may harvest energy from the motions of the foot during bipedal motion. The footwear generators may also be incorporated into devices used with footwear such as an insole.

FIG. 8 is a side view of a self-charging battery 450 for one embodiment of the present invention. The self-charging battery 450 includes an inertial mass 456 enclosed in housing 452. The inertial mass 456 may be a rechargeable battery of some type. The inertial mass 456 may move in back and forth in direction 464 in response to an inertial force of some type received by the inertial mass 456. When the inertial mass 456 moves toward an EAP film 459, a fluid 462 may force one or more portions of the EAP film 459 to deflect in direction 460 and an one or more portions EAP film 453 may relax. When the inertial mass 456 moves toward an EAP film 453, a fluid 466 may force one or more portions of the EAP film 459 to deflect in direction 451 and the one or more portions of the EAP film 459 may relax. Repeated deflections of the EAP films 453 and 459 may be used by the conditioning electronics 458 to harvest electricity. The electricity may be stored in the battery 456. The inserts 454 may allow the battery 464 to slide up and down in direction 464, prevent fluid 466 from mixing with fluid 462 and may include electrical contacts that allow power to be stored in the batter 464 or drawn from the battery 464.

The inertial force may be generated from a biological source or from an environmental source. For instance, as a biological source of energy, a dog or a cat may wear a collar containing a self-charging battery 450 of the present invention. As the dog or the cat moves around, the battery 456 is charged. The battery may be used to provide power to an electronic device located in the collar such as locator beacon. As an example of an environment source, the inertial force may be generated from the action of waves. For instance, generators of the present invention, such as 450, may be included in a life raft, life vest or a survival suit. The action of waves may generate inertial forces that are converted to electricity by the generator 450, which may be stored in the battery 464. Power from the battery may be used to power one or more portable electronic devices such as a locator beacon, a communication device, a light or a heater.

8. Conclusion

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. In addition, although the present invention has been described in terms of several preferred polymer materials and geometry's having particular performance ranges, the present invention is not limited to these materials and geometry's and may have performances outside the ranges listed. It is therefore intended that the scope of the invention should be determined with reference to the appended claims.

What is claimed is:

1. A generator for converting biologically-generated mechanical energy to electrical energy, the generator comprising:

i) one or more transducers, each transducer comprising:
   at least two electrodes; and
   a polymer arranged in a manner which causes a change in electric field in response to a deflection applied to a portion of the polymer wherein the electrodes are in electrical communication with the polymer;

ii) conditioning electronics connected to the at least two electrodes and designed or configured to provide charge to the at least two electrodes when the portion of the polymer is deflected to a first position and to withdraw charge from the at least two electrodes when the polymer is deflected to a second position; and iii) one or more transmission mechanisms that are designed or configured to receive the biologically-generated mechanical energy and to transfer a portion of said biologically-generated mechanical energy to the polymer wherein said transferred portion of the biologically generated mechanical energy results in a deflection in the portion of the polymer.

2. A generator for converting biologically-generated mechanical energy to electrical energy, the generator comprising:

i) one or more transducers, each transducer comprising:
   at least two electrodes; and
   a polymer arranged in a manner which causes a change in electric field in response to a deflection applied to a portion of the polymer;

ii) conditioning electronics connected to the at least two electrodes and designed or configured to add or remove electrical energy from the one or more transducers; and iii) one or more transmission mechanisms that are designed or configured to receive the biologically-generated mechanical energy and to transfer a portion of said biologically-generated mechanical energy to the polymer wherein said transferred portion of the biologically generated mechanical energy results in a deflection in the portion of the polymer wherein during operation at the generator the portion of the polymer is deflected, said deflection resulting in a change in surface area of the portion of the portion of the polymer, such that at a first time the portion of the polymer has a first surface area and at a second time the portion of the polymer has a second surface area and wherein the second surface area is at least about 10% greater than or is at least about 10% less than the first surface area.

3. A generator for converting mechanical energy generated during human bipedal motion to electrical energy, the generator comprising:

i) one or more transducers mounted in footwear, each transducer comprising;
   at least two electrodes; and
   a polymer arranged in a mariner which causes a change in electric field in response to a deflection applied to a portion of the polymer wherein the electrodes are in electrical communication with the polymer;

ii) one or more transmission mechanisms that are designed or configured to receive mechanical energy generated during human bipedal motion and to transfer a portion of said mechanical energy to the polymer wherein said transferred portion of the mechanical energy results in a deflection in the portion of the polymer; and iii) conditioning electronics connected to the at least two electrodes and designed or configured to provide charge to the at least two electrodes when the portion of the polymer is deflected to a first position and to withdraw charge fern the at least two electrodes when the polymer is deflected to the second position.

4. The generator of claim 3, wherein the conditioning electronics are designed or configured to perform one or more of the following functions: voltage step-up, voltage step-down and charge control.

5. The generator of claim 3, further comprising:
a housing enclosing at least one of said one or more transducers, at least one of said one or more transmission mechanisms and said conditioning electronics.

6. The generator of claim 5, wherein said housing is water-proof.

7. The generator of claim 3, further comprising:
one or more support structures designed or configured to attach to the one or more transducers.

8. The generator of claim 3, wherein the polymer comprises a first portion and a second portion arranged in a manner which causes a change in electric field in response to a deflection applied to at least one of the first portion and the second portion.

9. The generator of claim 3, wherein the polymer comprises a material selected from the group consisting of a silicone elastomer, an acrylic elastomer, a polyurethane, a copolymer comprising PVDF and combinations thereof.

10. The generator of claim 3, wherein said one or snore transmission mechanisms receives mechanical energy when a portion of said footwear contacts a surface during the human bipedal motion.

11. The generator of claim 3, wherein said footwear includes at least one heel.

12. The generator of claim 11, wherein said one or more transducers, at least one of said one or more transmission mechanisms and said conditioning electronics housing is integrated into the heel of the footwear.

13. The generator of claim 12, wherein said heel is designed or configured to be detachable from said footwear.

14. The generator of claim 12, wherein a first heel is detached from said footwear and wherein a second heel is attached to said footwear.

15. The generator of claim 11, wherein said transmission mechanism receives mechanical energy when a portion of said heel contacts a surface during to human bipedal motion.

16. The generator of claim 3, wherein said transmission mechanism includes a container filled with a fluid or a gel and wherein said container is designed or configured to transfer the portion of said mechanical energy.

17. The generator of claim 16, wherein the fluid comprises a hydraulic oil, water, or air.

18. The generator of claim 16, wherein said container is a bellows or a bladder.

19. The generator of claim 16, wherein said container is designed or configured to contract when said mechanical energy is applied and to uncontract when said mechanical energy is removed.

20. The generator of claim 19, wherein a stoke distance between when said mechanical energy is applied and when said mechanical energy is removed is between about 1 mm and about 10 mm.

21. The generator of claim 20, further comprising:
a support member wherein said support member is designed or configured to limit the stroke distance when said mechanical energy is applied.

22. The generator of claim 3, further comprising:
one or more support members mounted in said transmission mechanism wherein said one or more support members transfer the portion of mechanical energy.

23. The generator of claim 3, further comprising:
one or more support structures attached to at least one of the transducers.

24. The generator of claim 23, wherein the one or more support structures are attached to the polymer to form one or more diaphragms.

25. The generator of claim 24, wherein the one or more diaphragms is a circular diaphragm or a slot diaphragm.

26. The generator of claim 3, wherein the polymer comprises a first portion and a second portion arranged in a manner which causes a change in electric field in response to a deflection applied to at least one of the first portion and the second portion.

27. The generator of claim 3, wherein the bipedal motion is comprised of one or more steps and a net electrical energy output from said generator is between about 0.1 J and about 5 J per step.

28. The generator of claim 3, further comprising:
a logic device.

29. The generator of claim 28, wherein the logic device is a microprocessor or a microcontroller.

30. A generator for converting mechanical energy generated during human bipedal motion to electrical energy, the generator comprising:

i) one or more transducers mounted in footwear, each transducer comprising;
at least two electrodes; and
a polymer arranged in a manner which causes a change in electric field in response to a deflection applied to a portion of the polymer;

ii) one or more transmission mechanisms that are designed or configured to receive mechanical energy generated during human bipedal motion and to transfer a portion of said mechanical energy to the polymer wherein said transferred portion of the mechanical energy results in a deflection in the portion of the polymer; and iii) conditioning electronics connected to the at least two electrodes and designed or configured to add or remove electrical energy from the one or more transducers wherein during operation of the generator the portion of the polymer is deflected said deflection resulting in a change in surface area of the portion of the portion of the polymer, such that at a first time the portion of the polymer has a first surface area and at a second time the portion of the polymer has a second surface area and wherein the second surface area is at least about 10% greater than or is at least about 10% less than the first surface area.

31. A generator for converting environmentally-generated mechanical energy to electrical energy, the generator comprising:
one or more transducers, each transducer comprising;
at least two electrodes; and
a polymer arranged in a manner which causes a change in electric field in response to a deflection applied to a portion of the polymer wherein the electrodes are in electrical communication with the polymer;
conditioning electronics connected to the at least two electrodes and designed or configured to provide charge to the at least two electrodes when the portion of the polymer is deflected to a first position and to withdraw charge from the at least two electrodes when the polymer is deflected to a second position; and one or more transmission mechanisms that are designed or configured to receive environmentally-generated mechanical energy and to transfer a portion of said environmentally-generated mechanical energy to the polymer wherein said transferred portion of the environmentally generated mechanical energy results in a deflection in the portion of the polymer the environmentally generated mechanical energy results in a deflection in the portion of the polymer.

32. The generator of claim 31, wherein the environmentally-generated mechanical energy is generated from an environmental energy source selected from the group consisting of wind, waves, water flow, and vibrational forces.

33. A device for converting between electrical energy and mechanical energy, the device comprising:
   i) at least one transducer, each transducer comprising:
      at least two electrodes, and
      a polymer in electrical communication with said at least two electrodes in a manner that supports one of electrical generation and mechanical actuation;
   ii) a first member having a proximate end coupled to a first regional said transducer and a distal end; and
   iii) a second member having a proximate end coupled to a second region of said transducer and a distal end coupled to the distal end of the first member,
   wherein deflection of the polymer along a piano causes the proximate ends of said first and second members to translate along said plane and causes said distal ends of said first and second members to translate together in a direction that is not coplanar with said plane.

34. The device of claim 33 further including a flexible material attached to the first member and attached to the second member.

35. The device of claim 34 wherein said flexible material and said transducer are attached to form a chamber and said chamber contains a fluid.

36. The device of claim 33 further including a first base pivotally coupled to the distal end of die first member and pivotally coupled to the distal end of the second member.

37. The device of claim 36 wherein the first and second members are arranged frustroconically about die first base.

38. The device of claim 36 wherein the first and second members are arranged such that expansion of the polymer in said plane decreases the distance between the first base and the polymer.

39. The device of claim 36 further including:
   a first opposing member having a proximate end coupled to a third region of said transducer and a distal end; and
   a second opposing member having a proximate end coupled to a fourth region of said transducer and a distal end coupled to the distal end of the first opposing member,
   wherein deflection of the polymer along said plane causes the proximate ends of said first and second opposing members to translate along said plane and causes said distal ends of said first and second opposing members to translate together in said direction that is not coplanar with said plane.

40. The device of claim 39 further including a second base pivotally coupled to the distal end of the first opposing member and pivotally coupled to the distal end of the second opposing member.

41. The device of claim 40 wherein deflection of the polymer in response to a change in electric field provided by the at least two electrodes decreases the distance between the first base and the second base.

42. The device of claim 40 wherein an increase in the distance between the first base and the second base increases electrical energy of the transducer.

43. The device of claim 33 further including a third member having a proximate end coupled to a third region of said transducer and a distal end coupled to the distal ends of the first and second members.

44. The device of claim 33 wherein the transducer is used in one of a motor and a generator.

45. The device of claim 33 wherein the polymer includes pre-strain.

46. The device of claim 45 wherein the first and second members pre-load the polymer to provide the pre-strain.

47. A generator for convening between electrical energy and mechanical energy, the generator comprising:
   i) at least one transducer, each transducer comprising:
      at least two electrodes, and
      a polymer in electrical communication with said at least two electrodes in a manner that supports one of electrical generation and mechanical actuation;
   ii) a first member having a proximate end coupled to a first region of said transducer and a distal end; and
   iii) a second member having a proximate end coupled to a second region of said transducer and a distal end coupled to the distal end of the first member,
   wherein deflection of the polymer along a plane causes the proximate ends of said first and second members to translate along said plane and causes said distal ends of said first and second members to translate together in a direction that is not coplanar with said plane
      iv) conditioning electronics connected to the at least two electronics and designed or configured to add or remove electrical energy and the one or more transducers; and
      v) one or more transmission mechanisms that are desired or configured to receive biologically-generated or environmentally-generated mechanical energy and to transfer a portion of said mechanical energy to the polymer wherein said transferred portion of the mechanical energy results in a deflection in the portion of the polymer.

48. A generator that converts mechanical energy to electrical energy, the generator comprising:
   i) one or more transducers, each transducer comprising:
      at least two electrodes; and
      a polymer arranged in a manner which causes a change in electric field in response to a deflection applied to a portion of the polymer wherein the electrodes are in electrical communication with the polymer;
   ii) charge control circuitry connected to said at least two electrodes and designed or configured to provide charge to the at least two electrodes when the portion of the polymer is deflected to a first position and to withdraw charge from the at least two electrodes when the polymer is deflected to a second position; and
   iii) one or more transmission mechanisms that are designed or configured to receive mechanical energy and to transfer a portion of said mechanical energy to the polymer wherein said transferred portion of the mechanical energy results in a deflection in the portion of the polymer.

49. The generator of claim 48, further comprising:
   step-down circuitry designed or configured to receive an input signal with an input voltage level and output an output signal with an output voltage level wherein the output voltage level is lower than the input voltage level.

50. The generator of claim 49, wherein said input signal is received from the charge control circuitry.

51. The generator of claim 49, further comprising:
an electrical output interface designed or configured to output the output signal.

52. The generator of claim 51, wherein the electrical output interface is connected to a battery.

53. The generator of claim 51, wherein the electrical output interface is connected to a portable electronic device.

54. The generator of claim 49, wherein the output voltage level is between about 1.5 V and about 48 Volts.

55. The generator of claim 49, further comprising:
one or more power conversion circuitry units.

56. The condition electronics of claim 55, further comprising:
one or more capacitors designed or configured to reduce a voltage level of a signal received by said one or more power conversion circuitry units.

57. The generator of claim 48, further comprising:
step up circuitry designed or configured to receive an input signal with an input voltage level and output an output signal with an output voltage level wherein the input voltage level is lower than the output voltage level.

58. The generator of claim 57, wherein the output signal is received by the charge control circuitry.

59. The generator of claim 57, further comprising:
an electrical input interface designed or configured to receive the input signal.

60. The generator of claim 59, wherein the electrical input interface is connected to a battery.

61. The generator of claim 60, wherein a voltage of said battery is between about 1.5 and about 12 Volts.

62. The generator of claim 57, further comprising: a transformer.

63. The generator of claim 62, further comprising:
a transformer primary driver circuit for controlling said transformer.

64. The generator of claim 57, further comprising:
one or more sensor monitoring circuits.

65. The generator of claim 64, further comprising:
a sensor output interface.

66. A method for using an electroactive polymer transducer which comprises an electroactive polymer and at least two electrodes in electrical communication with the electroactive polymer, the method comprising:
mechanically deflecting a portion of the polymer to a first position;
providing charge to the at least two electrodes in electrical communication with the polymer;
mechanically deflecting the portion from the first position to a second position; and
withdrawing charge from the at least two electrodes after deflection of the portion from the from the first position.

67. The method of claim 66 wherein the charge is provided using a voltage applied between the at least two electrodes that is less than the voltage required to actuate the portion to the first position.

68. The method of claim 66 wherein the portion is deflected to the first position with substantially zero electric field applied to the portion using the at least two electrodes.

69. The method of claim 66 wherein the electroactive polymer is a dielectric elastomer.

70. The method of claim 66 wherein withdrawing the electrical change comprises transmitting the charge to conditioning electronics in electrical communication with the at least two electrodes.

71. The method of claim 66 wherein the mechanical deflection from the first position to the second position of the portion increases the electrical field between the at least two electrodes.

72. The method of claim 66 wherein charge is withdrawn from the at least two electrodes during deflection of the portion from the first position to the second position.

73. The method of claim 66 wherein the charge is withdrawn from the at least two electrodes when the portion reaches the second position.

74. The method of claim 66 wherein the portion is mechanically deflected to the first position using mechanical energy generated by a living biological system.

75. The method of claim 74 wherein the mechanical energy is generated during human locomotion.

76. The method of claim 66 wherein the charge withdrawn from the at least two electrodes is provided to a capacitor in electrical communication with the at least two electrodes.

77. The method of claim 66 further including pre-straining the polymer before mechanically deflecting the portion to the first position.

78. The generator of claim 1, wherein the biologically-generated mechanical energy is generated from a biological system comprising a human or an animal.

79. The generator of claim 1, wherein the biologically-generated mechanical energy produces an inertial force or a direct force wherein a portion of the inertial force or a portion of the direct force is received by the transmission mechanism.

80. The generator of claim 79, wherein the direct force comprises one of a foot strike, a hand contraction, a hand strike, a finger strike, a chest expansion, and a chest contraction.

81. The generator of claim 79, wherein the inertial force is from a biologically-generated motion.

82. The generator of claim 1, wherein the one or more transmission mechanisms comprises an inertial mass that is designed or configured to move in response to an inertial force wherein mechanical energy generated by the movement of said inertial mass is used to generate electrical energy.

83. The generator of claim 1, wherein the one or more transmission mechanisms comprises a fluid designed or configured to transfer the portion of the biologically-generated mechanical energy to the polymer.

84. The generator of claim 1, further comprising:
one or more support members designed or configured to transfer the portion of the biologically generated mechanical energy.

85. The generator of claim 1, further comprising:
a housing enclosing the one or more transducers and the one or more transmission mechanisms.

86. The generator of claim 85, wherein the housing is integrated into footwear.

87. The generator of claim 1, wherein the conditioning electronics are designed or configured to perform one or more of the following functions: voltage step-up, voltage step-down and charge control.

88. The generator of claim 1, further comprising:
an electrical interface designed or configured to output the electrical energy.

89. The generator of claim 88, wherein the electrical energy is used to power a portable electronic device.

90. The generator of claim 1, further comprising:
one or more batteries for storing electrical energy removed from one or more transducer or for increasing the charge of the polymer.

91. The generator of claim 1, wherein the transmission mechanism is a support member for coupling the polymer and the mechanical input.

92. The generator of claim 1, wherein the total electrical energy removed from the one or more transducers is greater than the total electrical energy added to the one or more transducers in a cycle and wherein a net amount of electrical energy is output from the generator.

93. The generator of claim 1, wherein the transmission mechanism includes a container filled with a fluid or a gel wherein said container is designed or configured to transfer the portion of the biologically-generated mechanical energy.

94. The generator of claim 93, wherein the container is a bellows or a bladder.

95. The generator of claim 1, further comprising:
one or more support structures designed or configured to attach to the one or more transducers.

96. The generator of claim 95, wherein the one or more support structures includes a container filled with a fluid or a gel wherein said container is designed or configured to deflect one or more portions of a polymer.

97. The generator of claim 1, wherein the polymer comprises a first portion and a second portion arranged in a manner which causes a change in electric field in response to a deflection applied to at least one of the first portion and the second portion.

98. The generator of claim 1, further comprising:
one or more sensors connected to said generator.

99. The generator of claim 1, further comprising:
a logic device.

100. The generator of claim 99, wherein the logic device is a microprocessor or a microcontroller.

101. The generator of claim 1, wherein the polymer is elastically pre-strained.

102. The generator of claim 101, wherein the polymer includes an anisotropic pre-strain.

103. The generator of claim 1, wherein the polymer comprises a material selected from the group consisting of a silicone elastomer, an acrylic elastomer, a polyurethane, a copolymer comprising PVDF, and combinations thereof.

104. The generator of claim 1, wherein the polymer has a maximum elastic linear strain of at least about 10 percent.

105. The generator of claim wherein the polymer has a maximum elastic linear strain of at least about 5 percent.

106. The generator of claim 1, wherein the electrical energy generated by the deflection of the polymer is at least about 0.2 J per gram of the polymer.

107. The generator of claim 1, wherein the electrical energy removed per cycle from the one or more transducers is at least about 0.1 J.

108. The generator of claim 1, wherein the polymer comprises a multilayer structure.

109. The generator of claim 108, wherein the multilayer structure comprises two or more polymer layers.

110. The generator of claim 109, wherein the multilayer structure comprises interleaved support structures.

111. The generator of claim 110, wherein the interleaved support structures are stiffer than the polymer.

112. The generator of claim 108 wherein the multilayer structure comprises electrically conductive members for electrically coupling the one or more transducers to the conditioning electronics.

113. The generator of claim 108 wherein the multilayer structure is shaped into a roll.

114. A generator for converting mechanical energy generated during human bipedal motion to electrical energy, the generator comprising:
i) one or more transducers mounted in footwear, each transducer comprising;
at least two electrodes; and
a polymer arranged in a manner which causes a change in electric field in response to a deflection applied to a portion of the polymer, wherein the polymer has an elastic modulus below about 100 MPa;
ii) one or more transmission mechanisms that are designed or configured to receive mechanical energy generated during human bipedal motion and to transfer a portion of said mechanical energy to the polymer wherein said transferred portion of the mechanical energy results in a deflection in the portion of die polymer wherein said transmission mechanism includes a container filled with a fluid or a gel and wherein said container is designed or configured to transfer the portion of said mechanical energy; and
iii) conditioning electronics connected to the at least two electrodes and designed or configured to add or remove electrical energy from the one or more transducers.

115. A generator for converting mechanical energy generated during human bipedal motion to electrical energy, the generator comprising:
i) one or more transducers mounted in footwear, each transducer comprising;
at least two electrodes; and
a polymer arranged in a manner which causes a change in electric field in response to a deflection applied to a portion of the polymer, wherein the polymer has an elastic modulus below about 100 MPa
one or mote support structures attached to the polymer to form one or more diaphragms;
ii) one or more transmission mechanisms that are designed or configured to receive mechanical energy generated during human bipedal motion and to transfer a portion of said mechanical energy to the polymer wherein said transferred portion of the mechanical energy results in a deflection in the portion of the polymer; and
iii) conditioning electronics connected to the at least two electrodes and designed or configured to add or remove electrical energy from the one or more transducers.

116. A generator for converting biologically-generated mechanical energy to electrical energy, the generator comprising:
i) one or more transducers, each transducer comprising:
at least two electrodes; and
a polymer arranged in a manner which causes a change in electric field in response to a deflection applied to a portion of the polymer wherein the electrodes are in electrical communication with the polymer;
ii) conditioning electronics connected to the at least two electrodes and designed or configured to add or remove electrical energy from the one or more transducers; and
iii) one or more transmission mechanisms that are designed or configured to receive the biologically-generated mechanical energy and to transfer a portion of said biologically-generated mechanical energy to the polymer wherein said transferred portion of the biologically generated mechanical energy results in a deflection in the portion of the polymer wherein the one or more transmission mechanisms comprises a fluid designed or configured to transfer the portion of the biologically-generated mechanical energy to the polymer.

117. The generator of claim 48, wherein the one or more transmission mechanisms comprises a fluid designed or configured to transfer the portion of the mechanical energy to the polymer.

118. The generator of claim 1, wherein the wherein the polymer has an elastic modulus below about 100 MPa.

119. The generator of claim 30, wherein the wherein the polymer has an elastic modulus below about 100 MPa.

120. The generator of claim 48, wherein the wherein the polymer has an elastic modulus below about 100 MPa.

* * * * *